United States Patent
Kwag et al.

(10) Patent No.: US 12,402,462 B2
(45) Date of Patent: Aug. 26, 2025

(54) PIXEL INCLUDING A CONDUCTIVE PATTERN CONNECTED TO A LIGHT EMITTING ELEMENT AND A CONTACT ELECTRODE, DISPLAY DEVICE COMPRISING SAME, AND MANUFACTURING METHOD THEREOF

(71) Applicant: Samsung Display Co., Ltd., Yongin-si (KR)

(72) Inventors: Jin Oh Kwag, Yongin-si (KR); Sung Hoon Kim, Yongin-si (KR); Eun Ju Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 612 days.

(21) Appl. No.: 17/294,634

(22) PCT Filed: Mar. 14, 2019

(86) PCT No.: PCT/KR2019/002978
§ 371 (c)(1),
(2) Date: May 17, 2021

(87) PCT Pub. No.: WO2020/105809
PCT Pub. Date: May 28, 2020

(65) Prior Publication Data
US 2021/0408108 A1 Dec. 30, 2021

(30) Foreign Application Priority Data
Nov. 20, 2018 (KR) .......... 10-2018-0143889

(51) Int. Cl.
H10H 29/14 (2025.01)
H10H 20/01 (2025.01)
(Continued)

(52) U.S. Cl.
CPC ........ *H10H 29/142* (2025.01); *H10H 20/821* (2025.01); *H10H 20/831* (2025.01); *H10H 20/84* (2025.01); *H10H 20/032* (2025.01)

(58) Field of Classification Search
CPC ....... H01L 27/156; H01L 33/24; H01L 33/38; H01L 33/44; H01L 2933/0016;
(Continued)

(56) References Cited

U.S. PATENT DOCUMENTS 9,035,420 B2 5/2015 Lee et al.
9,287,242 B2 3/2016 Shibata et al.
(Continued)

FOREIGN PATENT DOCUMENTS

JP 2013-004792 A 1/2013
KR 10-2012-0120377 A 11/2012
(Continued)

OTHER PUBLICATIONS

International Search Report for corresponding Application No. PCT/KR2019/002978 dated Aug. 19, 2019, 4pp.

*Primary Examiner* — Eric W Jones
(74) *Attorney, Agent, or Firm* — Womble Bond Dickinson (US) LLP

(57) ABSTRACT

A pixel in accordance with an embodiment may include: a first electrode; a second electrode spaced from the first electrode; a plurality of light emitting elements arranged between the first electrode and the second electrode and including at least one first light emitting element; a first contact electrode on the first electrode and electrically connected to the first electrode and first ends of at least some of the plurality of light emitting elements; a second contact electrode on the second electrode and electrically connected to the second electrode and second ends of at least some of the plurality of light emitting elements; and at least one first (Continued)

conductive pattern between the at least one first light emitting element and the first contact electrode, and configured to electrically connect a first end of a corresponding first light emitting element to the first contact electrode.

22 Claims, 28 Drawing Sheets

(51) Int. Cl.
*H10H 20/821* (2025.01)
*H10H 20/831* (2025.01)
*H10H 20/84* (2025.01)

(58) Field of Classification Search
CPC .. H10H 29/142; H10H 20/821; H10H 20/831; H10H 20/84; H10H 20/032
USPC ............................................. 257/89
See application file for complete search history.

(56) References Cited

U.S. PATENT DOCUMENTS

| | | | |
|---|---|---|---|
| 9,773,761 | B2 | 9/2017 | Do |
| 10,062,804 | B2 | 8/2018 | Do et al. |
| 10,461,123 | B2 | 10/2019 | Kim et al. |
| 10,672,946 | B2 | 6/2020 | Cho et al. |
| 10,818,647 | B2 | 10/2020 | Kim et al. |
| 2008/0251381 | A1* | 10/2008 | Shibata ................ C25D 13/02 204/483 |
| 2011/0089850 | A1* | 4/2011 | Shibata ................ H05B 45/00 257/E33.001 |
| 2014/0159043 | A1 | 6/2014 | Sakariya et al. |
| 2017/0170373 | A1* | 6/2017 | Peng .................. H01L 27/1248 |
| 2017/0250168 | A1* | 8/2017 | Do ........................ H01L 33/38 |
| 2017/0256521 | A1 | 9/2017 | Cok et al. |
| 2017/0270852 | A1 | 9/2017 | Meitl et al. |
| 2017/0317228 | A1 | 11/2017 | Sung |
| 2017/0338372 | A1* | 11/2017 | Teraguchi ............... H01L 33/06 |
| 2018/0033853 | A1 | 2/2018 | Bower et al. |
| 2018/0175268 | A1* | 6/2018 | Moon .................... H01L 27/15 |
| 2018/0287010 | A1* | 10/2018 | Sung ..................... B82B 3/0066 |
| 2019/0157340 | A1* | 5/2019 | Liao ...................... H01L 27/156 |

FOREIGN PATENT DOCUMENTS

| | | |
|---|---|---|
| KR | 10-2013-0135183 A | 12/2013 |
| KR | 10-1490758 B1 | 2/2015 |
| KR | 10-1628345 B1 | 6/2016 |
| KR | 10-1672781 B1 | 11/2016 |
| KR | 10-1713818 B1 | 3/2017 |
| KR | 10-1730929 B1 | 4/2017 |
| KR | 10-2018-0007025 A | 1/2018 |
| KR | 10-2018-0007376 A | 1/2018 |
| KR | 10-2018-0072909 A | 7/2018 |
| KR | 10-2020-0079379 A | 7/2020 |
| KR | 10-2020-0085977 A | 7/2020 |

* cited by examiner

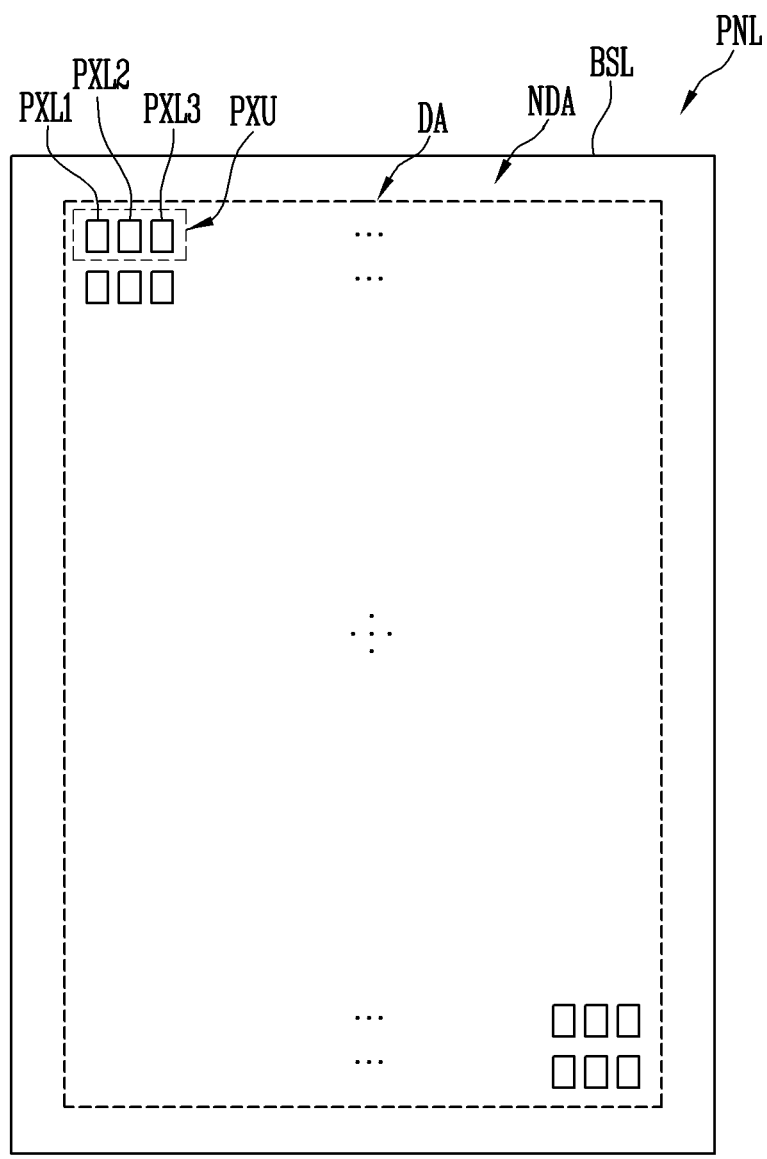

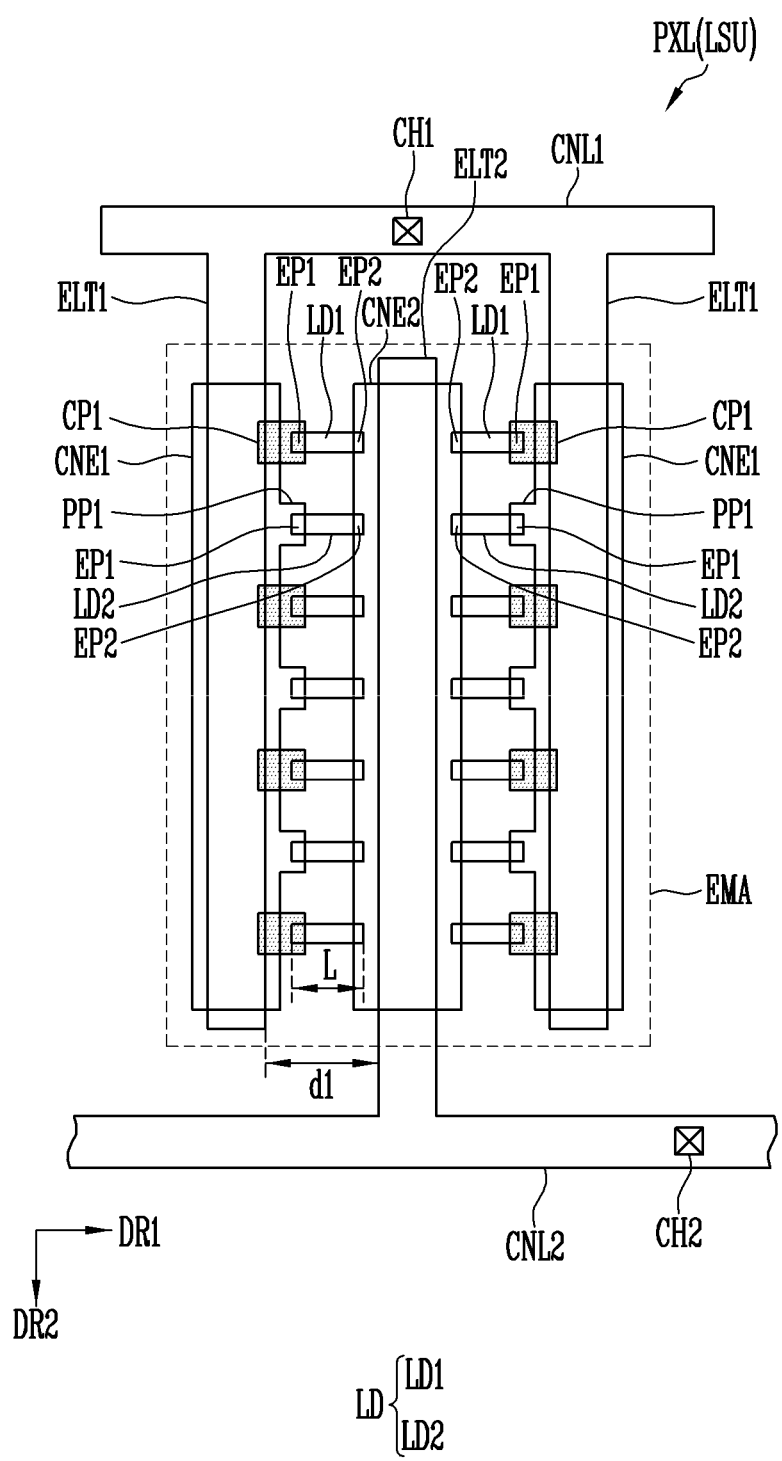

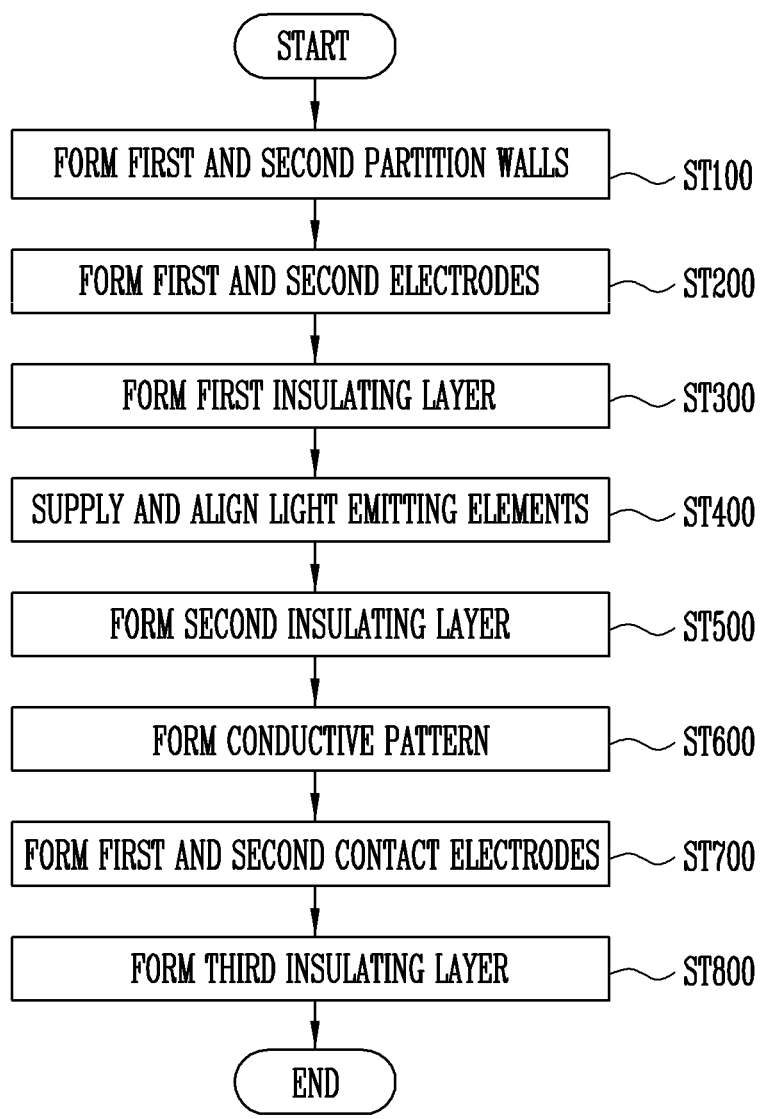

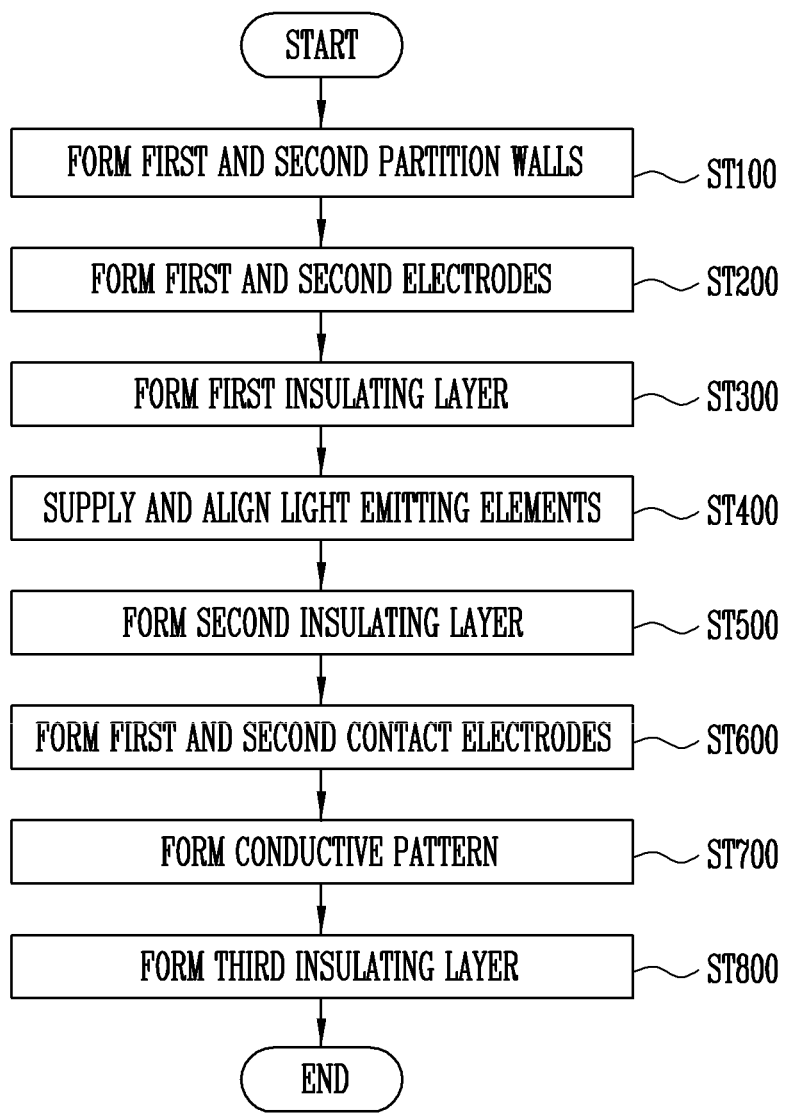

PIXEL INCLUDING A CONDUCTIVE PATTERN CONNECTED TO A LIGHT EMITTING ELEMENT AND A CONTACT ELECTRODE, DISPLAY DEVICE COMPRISING SAME, AND MANUFACTURING METHOD THEREOF

CROSS-REFERENCE TO RELATED APPLICATIONS

This application is a U.S. National Phase Patent Applications of International Patent Application Number PCT/KR2019/002978, filed on Mar. 14, 2019, which claims priority to Korean Patent Application No. 10-2018-0143889, filed Nov. 20, 2018, the entire contents of both of which are incorporated herein by reference.

BACKGROUND

1. Field

Various embodiments of the present disclosure relate to a pixel, a display device including the pixel, and a method of fabricating the display device.

2. Description of Related Arts

Recently, a technique of manufacturing a subminiature light emitting element using a material having a reliable inorganic crystal structure and manufacturing a light emitting device using the light emitting element has been developed. For example, a technique of fabricating a plurality of subminiature light emitting elements having a small size corresponding to a range from the nanometer scale to the micrometer scale, and fabricating various light emitting devices as well as a pixel using the subminiature light emitting elements has been developed.

SUMMARY

Various embodiments of the present disclosure are directed to a pixel including a plurality of light emitting elements, a display device including the pixel, and a method of fabricating the display device.

A pixel in accordance with an embodiment of the present disclosure may include: a first electrode; a second electrode spaced from the first electrode; a plurality of light emitting elements arranged between the first electrode and the second electrode and including at least one first light emitting element; a first contact electrode on the first electrode and electrically connected to the first electrode and first ends of at least some of the plurality of light emitting elements; a second contact electrode on the second electrode and electrically connected to the second electrode and second ends of at least some of the plurality of light emitting elements; and at least one first conductive pattern between the at least one first light emitting element and the first contact electrode, and configured to electrically connect a first end of a corresponding first light emitting element to the first contact electrode.

In an embodiment, the first end of the corresponding first light emitting element may be spaced from the first contact electrode, and electrically connected to the first contact electrode via the first conductive pattern.

In an embodiment, a second end of the first light emitting element may overlap with the second contact electrode and may be directly connected to the second contact electrode.

In an embodiment, the pixel may further include at least one second conductive pattern located between the at least one first light emitting element and the second contact electrode.

an embodiment, a second end of the at least one first light emitting element may be spaced from the second contact electrode, and electrically connected to the second contact electrode via the at least one second conductive pattern.

In an embodiment, the first conductive pattern may include a conductive material different from a constituent material of the first contact electrode.

In an embodiment, the first contact electrode may include at least one first protrusion protruding toward at least one second light emitting element of the plurality of light emitting elements and overlapping with a first end of the second light emitting element.

In an embodiment, a second end of the second light emitting element may overlap with the second contact electrode and be directly connected to the second contact electrode.

In an embodiment, the second contact electrode may include at least one second protrusion protruding toward the second light emitting element and overlapping with the second end of the second light emitting element.

In an embodiment, the plurality of light emitting elements may include a plurality of second light emitting elements successively arranged between the first electrode and the second electrode in a direction in which the first electrode extends. The first contact electrode may include at least one first protrusion having a width greater than a distance between the plurality of second light emitting elements and overlapping with first ends of the plurality of second light emitting elements.

In an embodiment, the pixel may include: a plurality of first light emitting elements and a plurality of second light emitting elements arranged between the first electrode and the second electrode; a plurality of first conductive patterns located between each of the plurality of first light emitting elements and the first contact electrode to electrically connect respective first ends of the plurality of first light emitting elements to the first contact electrode; and a plurality of first protrusions protruding from the first contact electrode toward the plurality of respective second light emitting elements and overlapping respective first ends of the plurality of second light emitting elements. The plurality of first conductive patterns and the plurality of first protrusions may be regularly or irregularly arranged on one side of the first contact electrode.

In an embodiment, the pixel may include a plurality of first conductive patterns spaced from each other and located on respective first ends of the plurality of light emitting elements.

In an embodiment, the first conductive pattern may have any one of polygonal shapes including a rectangular shape.

In an embodiment, the first conductive pattern may include: a first area having a first width; and a second area and a third area located on opposite sides of the first area, and each having a width greater than the first width.

In an embodiment, the pixel may include a plurality of first conductive patterns spaced from each other and located on respective first ends of a plurality of first light emitting elements of the plurality of light emitting elements. At least one of the plurality of first conductive patterns may be disconnected between a first end of a corresponding first light emitting element and the first contact electrode.

In an embodiment, the first electrode and the second electrode may be spaced from each other by a distance equal to or greater than an average length of the light emitting elements.

A display device in accordance with an embodiment may include: a display area; and a pixel in the display area. The pixel may include: a first electrode; a second electrode spaced from the first electrode; a plurality of light emitting elements arranged between the first electrode and the second electrode and including at least one first light emitting element; a first contact electrode on the first electrode and electrically connected to the first electrode and first ends of at least some of the plurality of light emitting elements; a second contact electrode on the second electrode and electrically connected to the second electrode and second ends of at least some of the plurality of light emitting elements; and at least one first conductive pattern between the at least one first light emitting element and the first contact electrode to electrically connect a first end of a corresponding first light emitting element to the first contact electrode.

In an embodiment, the first end of the first corresponding light emitting element may be spaced from the first contact electrode, and electrically connected to the first contact electrode via the first conductive pattern.

A method of manufacturing a display device in accordance with an embodiment may include: forming, on a base layer, a first electrode and a second electrode to be spaced from each other; supplying light emitting elements onto the base layer, and aligning the light emitting elements between the first electrode and the second electrode; and electrically connecting first and second ends of the light emitting elements to the first electrode and the second electrode, respectively. In some embodiments, between a first end of at least one light emitting element and the first electrode, a first conductive pattern electrically connected to the first end and a first contact electrode electrically connected to the first end through the first conductive pattern may be formed.

In an embodiment, the electrically connecting the first and second ends of the light emitting elements to the first electrode and the second electrode may include further forming a second contact electrode electrically connected between a second end of the at least one light emitting element and the second electrode.

In a pixel, a display device including the pixel, and a method of fabricating the display device in accordance with various embodiments of the present disclosure, a pixel defect resulting from a short-circuit defect of a light emitting element may be efficiently repaired. Consequently, the yield of the display device may be enhanced.

BRIEF DESCRIPTION OF THE DRAWINGS

FIG. 5 is a plan view illustrating a display device in accordance with an embodiment of the present disclosure.

FIGS. 7-20 are plan views each illustrating a pixel in accordance with an embodiment of the present disclosure.

FIGS. 29 and 30 are flowcharts each illustrating a method of fabricating a display device including a pixel in accordance with an embodiment of the present disclosure.

DETAILED DESCRIPTION

Figure 1A:
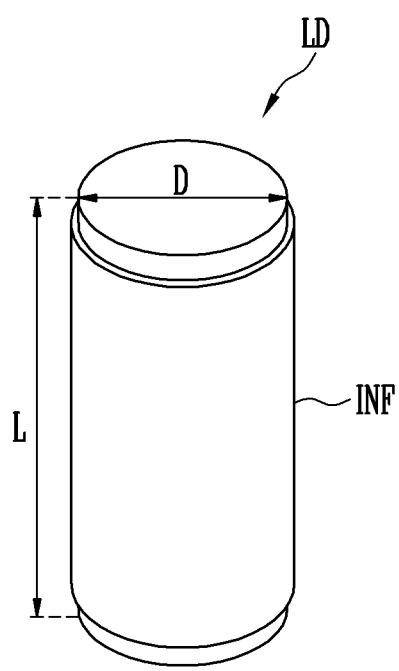
FIGS. 1A and 1B are respectively a perspective diagram and a sectional diagram illustrating a light emitting element in accordance with an embodiment of the present disclosure.

Reference will now be made in detail to various embodiments of the present disclosure, specific examples of which are illustrated in the accompanying drawings and described below, because the embodiments of the present disclosure can be variously modified in many different forms. However, the present disclosure is not limited to the following embodiments and may be modified into various forms.

Some elements that are not directly related to the features of the present disclosure in the drawings may be omitted to clearly explain the present disclosure. Furthermore, the sizes, ratios, etc. of some elements in the drawings may be slightly exaggerated. It should be noted that the same reference numerals are used to designate the same or similar elements throughout the drawings, and repetitive explanation will be omitted.

It will be understood that, although the terms "first", "second", etc. may be used herein to describe various elements, these elements should not be limited by these terms. It will be further understood that the terms "comprise", "include", "have", etc. when used in this disclosure, specify the presence of stated features, integers, steps, operations, elements, components, and/or combinations of them but do not preclude the presence or addition of one or more other features, integers, steps, operations, elements, components, and/or combinations thereof. Furthermore, when a first component or part is disposed on a second component or part, the first component or part may be not only directly on the second component or part but a third component or part may intervene between them. Furthermore, the term "position", "direction", etc. used in the following description are defined in relative terms, and it should be noted that they may be changed into a reverse position or direction depending on a view angle or direction.

Embodiments and required details of the present disclosure are described with reference to the accompanying drawings in order to describe the present disclosure in detail so that those having ordinary knowledge in the technical field to which the present disclosure pertains can easily practice the present disclosure. Furthermore, a singular form may include a plural form as long as it is not specifically mentioned in a sentence.

FIGS. 1A, 1B, 2A, 2B, 3A, and 3B are perspective diagrams and sectional diagrams illustrating light emitting elements LD in accordance with embodiments of the present disclosure. Although FIGS. 1A-3B illustrate cylindrical rod-type light emitting elements LD, the type and/or shape of the light emitting elements LD in accordance with the present disclosure is not limited thereto.

Figure 1B:
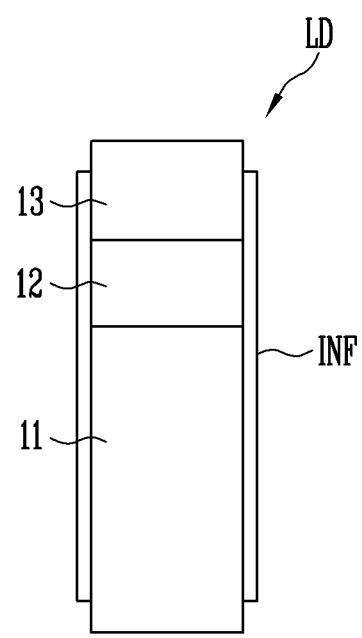

Referring to FIGS. 1A and 1B, a light emitting element LD in accordance with an embodiment of the present disclosure may include a first conductivity type semiconductor layer 11 (or referred to as "first semiconductor layer"), a second conductivity type semiconductor layer 13 (or referred to as "second semiconductor layer"), and an active layer 12 interposed between the first and second conductivity type semiconductor layers 11 and 13. For example, the light emitting element LD may be configured of a stacked body formed by successively stacking the first conductivity type semiconductor layer 11, the active layer 12, and the second conductivity type semiconductor layer 13.

In an embodiment, the light emitting element LD may be provided in the form of a rod extending in one direction. If the direction in which the light emitting element LD extends is defined as a longitudinal direction (L), the light emitting element LD may have a first end and a second end with respect to the longitudinal direction (L).

In an embodiment, one of the first and second conductivity type semiconductor layers 11 and 13 may be disposed on the first end of the light emitting element LD, and the other one of the first and second conductivity type semiconductor layers 11 and 13 may be disposed on the second end of the light emitting element LD.

In an embodiment, the light emitting element LD may be a rod-type light emitting diode manufactured in the form of a rod. In the present disclosure, the term "rod-type" embraces a rod-like shape and a bar-like shape such as a cylindrical shape and a prismatic shape extending in a longitudinal direction (i.e., to have an aspect ratio greater than 1), and the cross-sectional shape thereof is not limited to a particular shape. For example, the length L of the light emitting element LD may be greater than a diameter D thereof (or a width of the cross-section thereof).

In an embodiment, the light emitting element LD may have a small size ranging from the nanometer scale to the micrometer scale. For example, each light emitting element LD may have a diameter D and/or a length L ranging from the nanometer scale to the micrometer scale. However, in the present disclosure, the size of the light emitting element LD is not limited thereto. For example, the size of the light emitting element LD may be changed in various ways depending on design conditions of various devices, e.g., a display device, which employs, as a light source, a light emitting device using a light emitting element LD.

The first conductivity type semiconductor layer 11 may include, for example, at least one n-type semiconductor layer. For instance, the first conductivity type semiconductor layer 11 may include an n-type semiconductor layer that includes any one semiconductor material of InAlGaN, GaN, AlGaN, InGaN, AlN, and InN, and is doped with a first conductive dopant such as Si, Ge, or Sn. However, the material for forming the first conductivity type semiconductor layer 11 is not limited to this, and the first conductivity type semiconductor layer 11 may be formed of various other materials.

The active layer 12 may be disposed on the first conductivity type semiconductor layer 11 and have a single or multiple quantum well structure. In an embodiment, a cladding layer doped with a conductive dopant may be formed over and/or under the active layer 12. For example, the cladding layer may be formed of an AlGaN layer or an InAlGaN layer. In an embodiment, a material such as AlGaN or AlInGaN may be used to form the active layer 12, and various other materials may be used to form the active layer 12.

If a voltage equal to or greater than a threshold voltage is applied to each of the opposite ends of the light emitting element LD, the light emitting element LD may emit light by combination of electron-hole pairs in the active layer 12. Because light emission of the light emitting element LD can be controlled based on the foregoing principle, the light emitting element LD may be used as a light source of various light emitting devices as well as a pixel of the display device.

The second conductivity type semiconductor layer 13 may be disposed on the active layer 12 and include a semiconductor layer of a type different from that of the first conductivity type semiconductor layer 11. For example, the second conductivity type semiconductor layer 13 may include at least one p-type semiconductor layer. For instance, the second conductivity type semiconductor layer 13 may include a p-type semiconductor layer that includes any one semiconductor material of InAlGaN, GaN, AlGaN, InGaN, AlN, and InN, and is doped with a second conductive dopant such as Mg. However, the material for forming the second conductivity type semiconductor layer 13 is not limited to this, and the second conductivity type semiconductor layer 13 may be formed of various other materials.

In an embodiment, the light emitting element LD may further include an insulating film INF provided on the surface of the light emitting element LD. The insulating film INF may be formed on the surface of the light emitting element LD to enclose an outer surface (e.g., an outer peripheral surface) of at least the active layer 12, and may further enclose one area of each of the first and second conductivity type semiconductor layers 11 and 13. Here, the insulating film INF may allow the opposite ends of the light emitting element LD that have different polarities to be exposed to the outside. For example, the insulating film INF may expose one end of each of the first and second conductivity type semiconductor layers 11 and 13 that are disposed on the respective opposite ends of the light emitting element LD with respect to the longitudinal direction (L), e.g., the insulating film INF may expose two base sides of the cylinder (in FIGS. 1A and 1B, the top and bottom surfaces of the light emitting element LD) rather than covering the two base sides.

In an embodiment, the insulating film INF may include at least one insulating material of silicon dioxide ($SiO_2$), silicon nitride ($Si_3N_4$), aluminum oxide ($Al_2O_3$), and titanium dioxide ($TiO_2$), but it is not limited thereto. In other words, the material that forms the insulating film INF is not limited to a particular material, and the insulating film INF may be formed of well-known various insulating materials.

In an embodiment, the light emitting element LD may further include additional other components as well as the first conductivity type semiconductor layer 11, the active layer 12, the second conductivity type semiconductor layer 13, and/or the insulating film INF. For example, the light emitting element LD may further include one or more fluorescent layers, one or more active layers, one or more semiconductor layers, and/or one or more electrode layers disposed on one end of the first conductivity type semiconductor layer 11, the active layer 12, and/or the second conductivity type semiconductor layer 13.

Figure 2A:
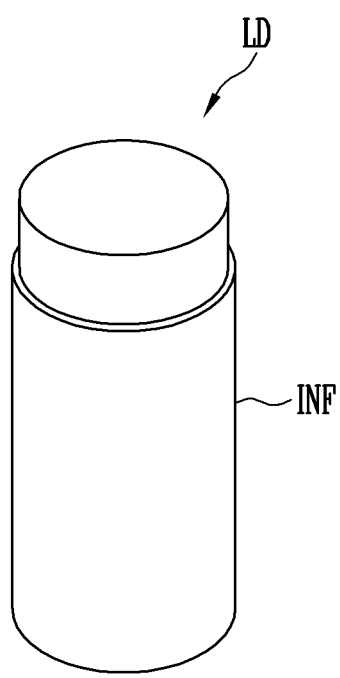
FIGS. 2A and 2B are respectively a perspective diagram and a sectional diagram illustrating a light emitting element in accordance with an embodiment of the present disclosure.
Figure 2B:
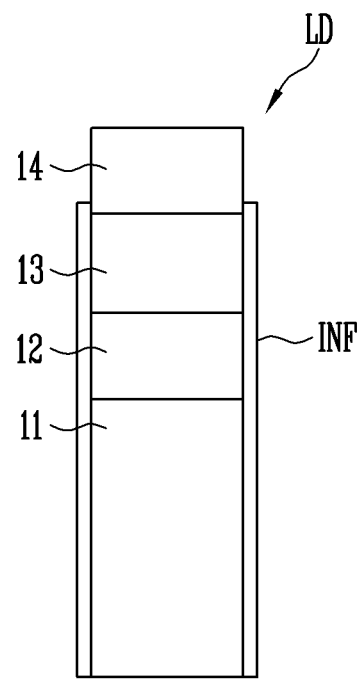
Figure 3A:
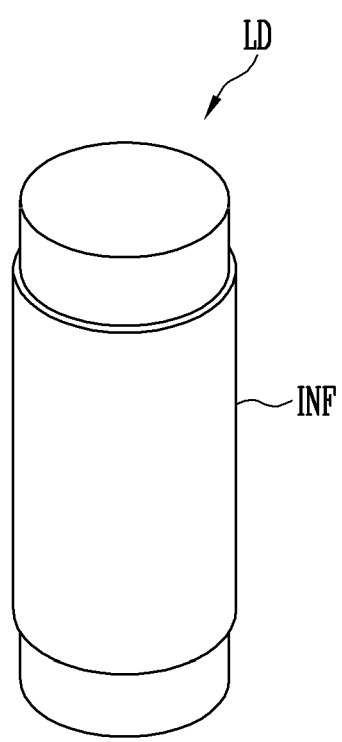
FIGS. 3A and 3B are respectively a perspective diagram and a sectional diagram illustrating a light emitting element in accordance with an embodiment of the present disclosure.
Figure 3B:
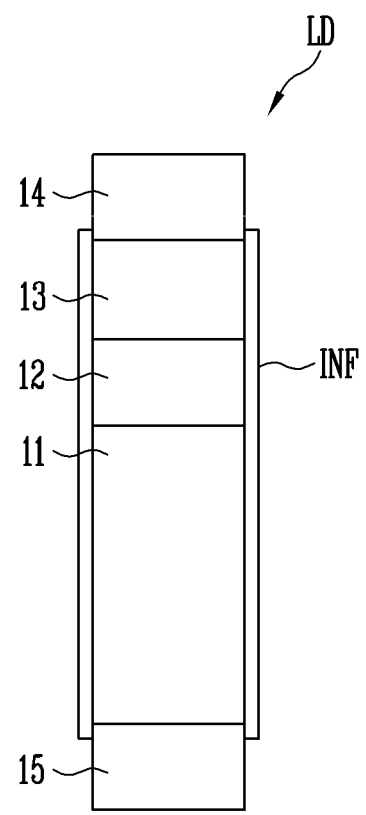

For example, as illustrated in FIGS. 2A and 2B, the light emitting element LD may further include at least one electrode layer 14 disposed on one end of the second conductivity type semiconductor layer 13. In an embodiment, as illustrated in FIGS. 3A and 3B, the light emitting element LD may further include at least one electrode layer 15 disposed on one end of the first conductivity type semiconductor layer 11.

Each of the electrode layers 14 and 15 may be an ohmic contact electrode, but it is not limited thereto. Each of the electrode layers 14 and 15 may include metal or metal oxide. For example, each of the electrode layers 14 and 15 may be formed of transparent electrode materials such as chromium (Cr), titanium (Ti), aluminum (Al), gold (Au), nickel (Ni), oxides or alloys thereof, indium tin oxide (ITO), indium zinc oxide (IZO), zinc oxide (ZnO), or indium tin zinc oxide (ITZO) alone or in combination. In an embodiment, the electrode layers 14 and 15 may be substantially transparent or translucent. Thereby, light generated from the light emitting element LD may be emitted to the outside after passing through the electrode layers 14 and 15.

In an embodiment, the insulating film INF may at least partially enclose the outer surfaces of the electrode layers 14 and 15, or may not enclose them. In other words, the insulating film INF may be selectively formed on the surfaces of the electrode layers 14 and 15. Furthermore, the insulating film INF may be formed to expose the opposite ends of the light emitting element LD that have different polarities, for example, the insulating film INF may expose at least an area of each of the electrode layers 14 and 15. Alternatively, in an embodiment, the insulating film INF may not be provided.

If the insulating film INF is provided on the surface of the light emitting element LD, particularly, on the surface of the active layer 12, the active layer 12 may be prevented from short-circuiting with at least one electrode (e.g., at least one contact electrode of contact electrodes connected to the opposite ends of the light emitting element LD), etc. Consequently, the electrical stability of the light emitting element LD may be secured.

Furthermore, because, the insulating film INF is formed on the surface of the light emitting element LD, occurrence of a defect on the surface of the light emitting element LD may be reduced or minimized, whereby the lifetime and efficiency of the light emitting element LD may be improved. Further, if the insulating film INF is formed on each light emitting element LD, even when a plurality of light emitting elements LD are disposed adjacent to each other, the light emitting elements LD may be prevented or protected from undesirably short-circuiting with each other.

In an embodiment of the present disclosure, a surface treatment process may be performed to fabricate the light emitting element LD. For example, each light emitting element LD may be surface-treated so that, when a plurality of light emitting elements LD are mixed with a fluidic solution and then supplied to each emission area (e.g., an emission area of each pixel), the light emitting elements LD can be evenly dispersed or located rather than unevenly aggregating in the solution.

In an embodiment pertaining to this, the insulating film INF itself may be formed of a hydrophobic film using hydrophobic material, or an additional hydrophobic film formed of the hydrophobic material may be formed on the insulating film INF. In an embodiment, the hydrophobic material may be a material containing fluorine to exhibit hydrophobicity. In an embodiment, the hydrophobic material may be applied to the light emitting elements LD in the form of a self-assembled monolayer (SAM). In this case, the hydrophobic material may include octadecyl trichlorosilane, fluoroalkyl trichlorosilane, perfluoroalkyl triethoxysilane, etc. Furthermore, the hydrophobic material may be a commercially available fluorine containing material such as Teflon™ or Cytop™, or a corresponding material.

A light emitting device including the light emitting element LD described above may be used not only in a display device but also in various devices that require a light source. For instance, at least one subminiature light emitting element LD, e.g., a plurality of subminiature light emitting elements LD each having a size ranging from the nanometer scale to the micrometer scale, may be disposed in each pixel area of the display panel to form a light source (or, a light source unit) of the corresponding pixel using the subminiature light emitting elements LD. Furthermore, the field of application of the light emitting element LD according to the present disclosure is not limited to a display device. For example, the light emitting element LD may also be used in other types of devices such as a lighting device that requires a light source.

Figure 4A:
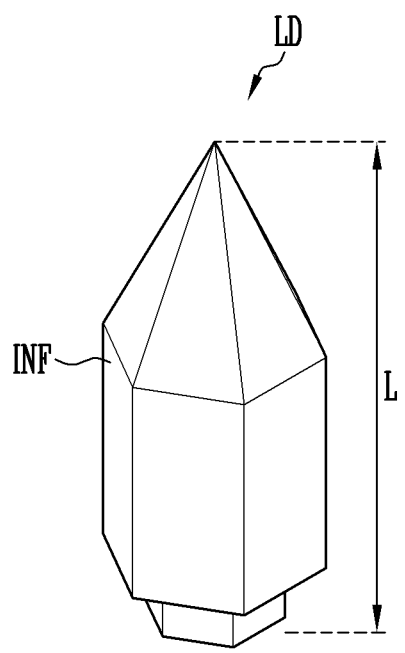
FIGS. 4A and 4B are respectively a perspective diagram and a sectional diagram illustrating a light emitting element in accordance with an embodiment of the present disclosure.
Figure 4B:
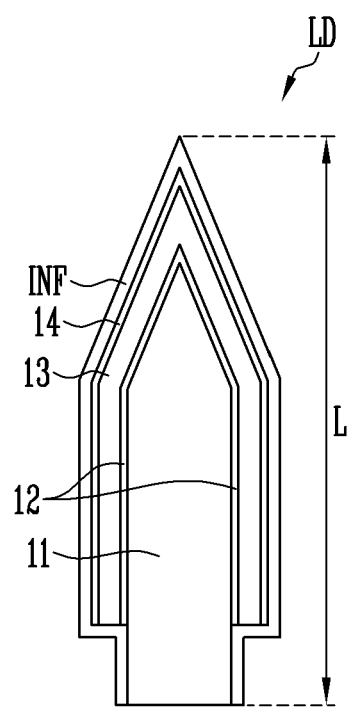

FIGS. 4A and 4B are respectively a perspective diagram and a sectional diagram illustrating a light emitting element LD in accordance with an embodiment of the present disclosure. In an embodiment, FIGS. 4A and 4B illustrate a light emitting element LD having a structure different from that of the light emitting elements LD illustrated in FIGS. 1A-3B, and for example illustrate a light emitting element having a core-shell structure. In other words, the type, the structure, and/or the shape of the light emitting element LD in accordance with an embodiment of the present disclosure may be changed in various ways. In descriptions of an embodiment of FIGS. 4A and 4B, like reference numerals are used to designate components similar or equal (or corresponding) to those of the embodiments of FIGS. 1A-3B, and detailed descriptions thereof will be omitted.

Referring to FIGS. 4A and 4B, a light emitting element LD in accordance with an embodiment of the present disclosure may include a first conductivity type semiconductor layer 11, a second conductivity type semiconductor layer 13, and an active layer 12 interposed between the first and second conductivity type semiconductor layers 11 and 13. In an embodiment, the first conductivity type semiconductor layer 11 may be disposed in a central area of the light emitting element LD, and the active layer 12 may be disposed on a surface (e.g., an outer peripheral surface) of the first conductivity type semiconductor layer 11 to enclose at least one area of the first conductivity type semiconductor layer 11. The second conductivity type semiconductor layer 13 may be disposed on a surface (e.g., an outer peripheral surface) of the active layer 12 to enclose at least one area of the active layer 12.

The light emitting element LD may further include an electrode layer 14 and/or an insulating film INF configured to enclose at least one area of the second conductivity type semiconductor layer 13. For example, the light emitting element LD may further include the electrode layer 14 disposed on a surface (e.g., an outer peripheral surface) of the second conductivity type semiconductor layer 13 to enclose one area of the second conductivity type semiconductor layer 13, and the insulating film INF disposed on a surface (e.g., an outer peripheral surface) of the electrode layer 14 to enclose at least one area of the electrode layer 14. In other words, the light emitting element LD in accordance with the above-mentioned embodiment may be implemented as a core-shell structure including the first conductivity type semiconductor layer 11, the active layer 12, the second conductivity type semiconductor layer 13, the electrode layer 14, and the insulating film INF that are successively disposed in a direction from the center to the periphery of the light emitting element LD. The electrode layer 14 and/or the insulating film INF may be omitted depending on embodiments.

In an embodiment, the light emitting element LD may be provided in the form of a polypyramid extending in one direction. For example, at least one area of the light emitting element LD may have a hexagonal pyramid shape. However, the shape of the light emitting element LD is not limited to the foregoing shape, and may be changed in various ways.

If the direction in which the light emitting element LD extends is defined as a longitudinal direction (L), the light emitting element LD may have a first end and a second end with respect to the longitudinal direction (L). In an embodiment, one of the first and second conductivity type semiconductor layers 11 and 13 may be disposed on the first end of the light emitting element LD, and the other of the first and second conductivity type semiconductor layers 11 and 13 may be disposed on the second end of the light emitting element LD.

In an embodiment of the present disclosure, the light emitting element LD may be a light emitting diode manufactured in a polyprism shape and, for example, may be a subminiature light emitting diode having a core-shell structure, the opposite ends of which are manufactured in a hexagonal polypyramid shape. In an embodiment, the light emitting element LD may have a small size ranging from the nanometer scale to the micrometer scale, e.g., a width and/or a length L corresponding to the nanometer scale or the micrometer scale. Here, for example, the size and/or shape of the light emitting element LD may be changed in various ways depending on design conditions of various devices, e.g., a display device, which employs the light emitting element LD as a light source.

In an embodiment, the opposite ends of the first conductivity type semiconductor layer 11 may have shapes protruding in the longitudinal direction (L) of the light emitting element LD. The shapes in which the opposite ends of the first conductivity type semiconductor layer 11 protrude outward may differ from each other. For example, disposed at an upper position, a first end of the opposite ends of the first conductivity type semiconductor layer 11 may have a conical shape, the width of which is reduced upward to form one apex. Furthermore, disposed at a lower position, a second end of the opposite ends of the first conductivity type semiconductor layer 11 may have a square pillar shape having a constant width, but the present disclosure is not limited thereto. For example, in an embodiment of the present disclosure, the first conductivity type semiconductor layer 11 may have a polygonal or stepped cross-section, the width of which is gradually reduced downward. The shapes of the opposite ends of the first conductivity type semiconductor layer 11 may be changed in various ways depending on embodiments, and are not limited to those of the foregoing embodiments.

In an embodiment, the first conductivity type semiconductor layer 11 may be disposed in a core of the light emitting element LD, i.e., a central (or middle) portion of the light emitting element LD. Furthermore, the light emitting element LD may have a shape corresponding to the shape of the first conductivity type semiconductor layer 11. For instance, if the first conductivity type semiconductor layer 11 has a hexagonal pyramid shape, the light emitting element LD may have a hexagonal pyramid shape.

The active layer 12 may be provided and/or formed in a shape enclosing the outer surface (e.g., the outer peripheral surface) of the first conductivity type semiconductor layer 11 in the longitudinal direction (L) of the light emitting element LD. In detail, the active layer 12 may be provided and/or formed in a shape enclosing an area of the first conductivity type semiconductor layer 11, other than the second end of the opposite ends of the first conductivity type semiconductor layer 11 that is disposed at the lower position with respect to the longitudinal direction (L) of the light emitting element LD.

The second conductivity type semiconductor layer 13 may be provided and/or formed in a shape enclosing the active layer 12 in the longitudinal direction (L) of the light emitting element LD, and may include a semiconductor layer having a type different from that of the first conductivity type semiconductor layer 11. For example, in the case where the first conductivity type semiconductor layer 11 includes at least one n-type semiconductor layer, the second conductivity type semiconductor layer 13 may have at least one p-type semiconductor layer.

In an embodiment, the light emitting element LD may include an electrode layer 14 that encloses at least one side of the second conductivity type semiconductor layer 13. The electrode layer 14 may be an ohmic contact electrode electrically connected to the second conductivity type semiconductor layer 13, but the present disclosure is not limited thereto.

As described above, the light emitting element LD may have a hexagonal pyramid shape with the opposite ends protruding outward, and may be implemented as a core-shell structure including the first conductivity type semiconductor layer 11 provided in the central portion thereof, the active layer 12 that encloses the first conductivity type semiconductor layer 11, the second conductivity type semiconductor layer 13 that encloses the active layer 12, and the electrode layer 14 that encloses the second conductivity type semiconductor layer 13. The first conductivity type semiconductor layer 11 may be disposed on the first end of the light emitting element LD having a hexagonal pyramid shape, and the electrode layer 14 may be disposed on the second end of the light emitting element LD.

In an embodiment, the light emitting element LD may further include an insulating film INF provided on the surface of the light emitting element LD. The insulating film INF may include transparent insulating material.

In an embodiment, the insulating film INF may be provided to cover a portion of the outer surface (e.g., an outer peripheral surface) of the first conductivity type semiconductor layer 11 and an outer surface (e.g., an outer peripheral surface) of the electrode layer 14. In an embodiment, after the insulating film INF is formed to cover the entirety of the outer surface (e.g., an outer peripheral surface) of the electrode layer 14 included in the light emitting element LD, the insulating film INF may be partially removed to expose one area of the electrode layer 14 for electrical connection with an electrode, which is not shown, (e.g., a first electrode of a pixel).

In an embodiment, the insulating film INF may allow at least one end of the opposite ends of the light emitting element LD that have different polarities to be exposed. For example, the insulating film INF may expose a lower surface of the first conductivity type semiconductor layer 11 of the first and second conductivity type semiconductor layers 11 and 13 that are disposed on the opposite ends of the light emitting element LD with respect to the longitudinal direction (L) of the light emitting element LD, rather than covering the lower surface. The light emitting element LD may be fabricated through a surface treatment process.

A light emitting device including the light emitting element LD described above may be used in various devices that require a light source. For example, the light emitting device may also be used in various electronic devices such as a display device or a lighting device that requires a light source.

FIG. 5 is a plan view illustrating a display device in accordance with an embodiment of the present disclosure. In an embodiment, FIG. 5 illustrates a display device, e.g., a display panel PNL provided in the display device, as an example of a device that may use, as a light source, the light emitting element LD described in the embodiments of FIGS. 1A-4B. For example, each pixel unit PXU of the display panel PNL and each pixel for forming the pixel unit PXU may include a plurality of light emitting elements LD.

For the sake of explanation, FIG. 5 simply illustrates the structure of the display panel PNL in accordance with an embodiment, focusing on a display area DA. In some embodiments, although not illustrated, at least one driving circuit (e.g., at least one of a scan driver and a data driver) and/or a plurality of lines may be further provided in the display panel PNL.

Referring to FIG. 5, the display panel PNL in accordance with an embodiment of the present disclosure may include a base layer BSL, and a plurality of pixels PXL disposed on the base layer BSL. The pixels may include first color pixels PXL1, second color pixels PXL2, and/or third color pixels PXL3. In the following embodiments, the term "pixel PXL" or "pixels PXL" will be used to collectively designate at least one pixel or two or more kinds of pixels from among the first color pixel PXL1, the second color pixel PXL2, and the third color pixel PXL3.

In detail, the display panel PNL and the base layer BSL for forming the display panel PNL may include a display area DA for displaying an image, and a non-display area NDA formed in an area (e.g., a set or predetermined area) other than the display area DA (e.g. an area along the edge or periphery of the display area DA to surround the display area DA). The pixels PXL may be disposed in the display area DA on the base layer BSL.

In an embodiment, the display area DA may be disposed in a central area of the display panel PNL, and the non-display area NDA may be disposed in a perimeter area of the display panel PNL in such a way as to enclose the display area DA. The locations of the display area DA and the non-display area NDA are not limited to this, and the locations thereof may be changed. The display area DA may form a screen on which an image is displayed.

The base layer BSL may form a base of the display panel PNL. In an embodiment, the base layer BSL may be a rigid or flexible substrate or film, and the material or properties thereof are not particularly limited. For example, the base layer BSL may be a rigid substrate made of glass or reinforced glass, a flexible substrate (or a thin film) formed of plastic or metal, or at least one insulating layer, and the material and/or properties thereof are not particularly limited.

Furthermore, the base layer BSL may be transparent, but the present disclosure is not limited thereto. For instance, the base layer BSL may be a transparent, translucent, opaque, or reflective base.

One area on the base layer BSL may be defined as the display area DA in which the pixels PXL are disposed, and the other area thereof may be defined as the non-display area NDA. For example, the base layer BSL may include the display area DA including a plurality of pixel areas in which the respective pixels PXL are formed, and the non-display area NDA disposed around the display area DA along the edge or periphery of the display area DA. Various lines and/or internal circuits that are connected to the pixels PXL of the display area DA may be disposed in the non-display area NDA.

A plurality of pixels PXL are dispersed and disposed in the display area DA. For example, the plurality of pixels PXL may be regularly arranged in the display area DA in a stripe structure or a PENTILE® arrangement structure, but the present disclosure is not limited thereto. This PENTILE® arrangement structure may be referred to as an RGBG matrix structure (e.g., a PENTILE® matrix structure or an RGBG structure (e.g., a PENTILE® structure)). PENTILE® is a registered trademark of Samsung Display Co., Ltd., Republic of Korea. The arrangement structure of the pixels PXL is not limited thereto, and the pixels PXL may be arranged in the display area DA in various structures and/or schemes.

In an embodiment, two or more kinds of pixels PXL that emit different colors of light may be disposed in the display area DA. For example, first color pixels PXL1 configured to emit a first color of light, second color pixels PXL2 configured to emit a second color of light, and a third color pixels PXL3 configured to emit a third color of light may be disposed in the display area DA. At least one first color pixel PXL1, at least one second color pixel PXL2, and at least one third color pixel PXL3 that are disposed adjacent to each other may form one pixel unit PXU that may emit different colors of light.

In an embodiment, each first color pixel PXL1 may be a red pixel configured to emit red light, each second color pixel PXL2 may be a green pixel configured to emit green light, and each third color pixel PXL3 may be a blue pixel configured to emit blue light. In an embodiment, the first color pixels PXL1, the second color pixels PXL2, and the third color pixels PXL3 may respectively include, as light sources, a light emitting element related to the first color, a light emitting element related to the second color, and a light emitting element related to the third color, so that the pixels may respectively emit the first color of light, the second color of light, and the third color of light. In an embodiment, the first color pixels PXL1, the second color pixels PXL2, and the third color pixels PXL3 may respectively include light emitting elements having the same color, and color filters and/or light conversion layers having different colors may be disposed on the respective light emitting elements so that the pixels may respectively emit the first color of light, the second color of light, and the third color of light.

The color, the type, and/or the number of pixels PXL that form each pixel unit PXU is not particularly limited. For example, the color of light emitted from each pixel PXL may be changed in various ways.

Each pixel PXL may include at least one light source that is driven by a control signal (e.g., a set or predetermined control signal) (e.g., a scan signal and a data signal) and/or power voltage (e.g., first and second power voltages), for example, a light emitting element LD according to any one of the embodiments of FIGS. 1A-4B. For example, each pixel PXL may include at least one subminiature light emitting element LD having a small size ranging from the nanometer scale to the micrometer scale. For example, each pixel PXL may include a plurality of subminiature light emitting elements that are connected in series and/or parallel to each other between the first and second pixel electrodes and/or the first and second power lines and form a light source or a light source unit of the corresponding pixel PXL.

In an embodiment, each pixel PXL may be formed of an active pixel. However, the types, structures, and/or driving schemes of the pixels PXL capable of being applied to the display device according to the present disclosure are not particularly limited. For example, each pixel PXL may be configured as a pixel of a light emitting display device that has different types of active or passive structures.

Figure 6A:
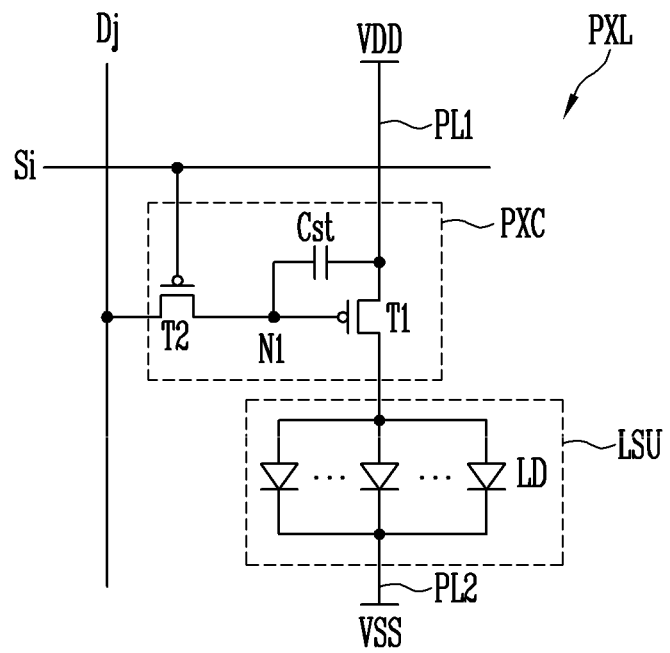
FIGS. 6A-6C are circuit diagrams each illustrating a pixel in accordance with an embodiment of the present disclosure.
Figure 6B:
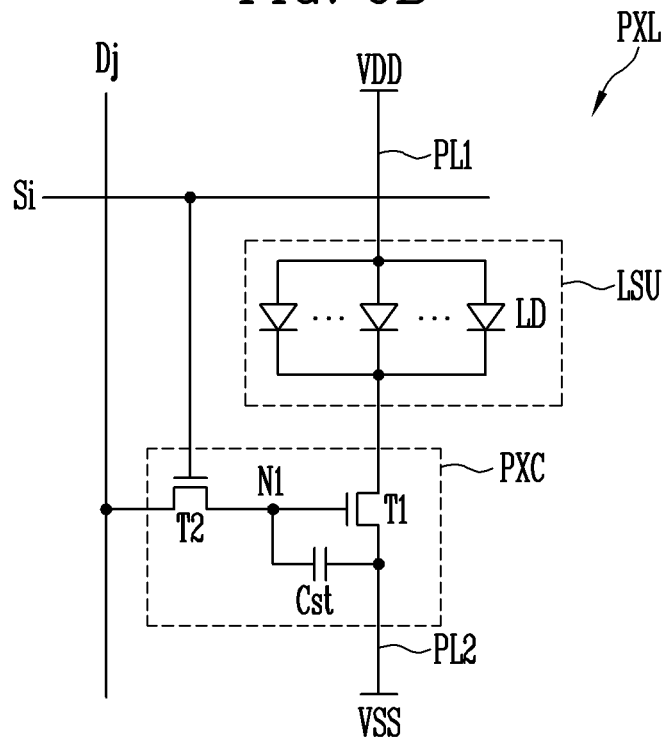
Figure 6C:
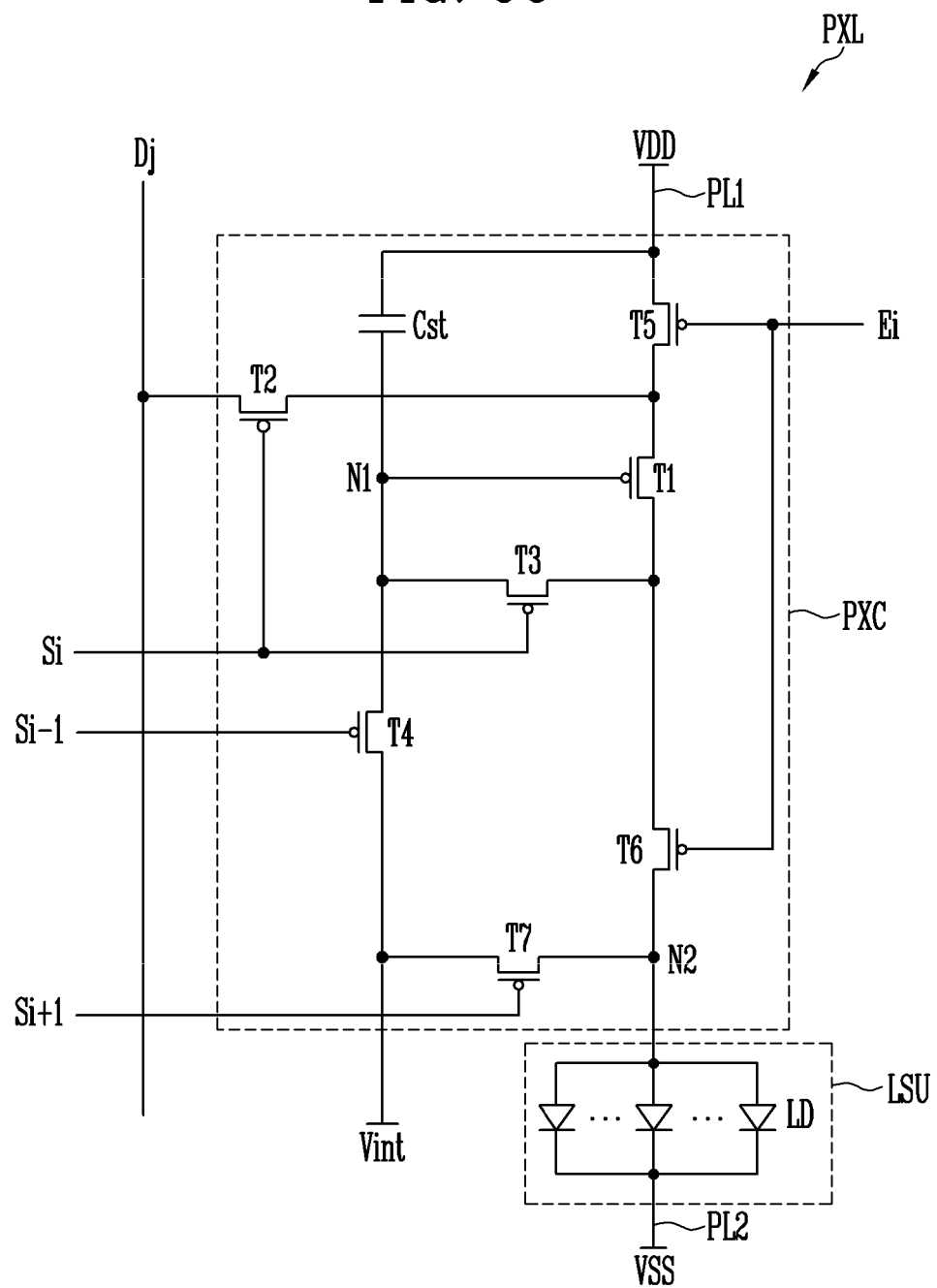

FIGS. 6A-6C are circuit diagrams each illustrating a pixel PXL in accordance with an embodiment of the present disclosure. In an embodiment, the pixel PXL illustrated in FIGS. 6A-6C may be any one of the first color pixel PXL1, the second color pixel PXL2, and the third color pixel PXL3 that are provided in the display panel PNL of FIG. 5. Furthermore, the first color pixel PXL1, the second color pixel PXL2, and the third color pixel PXL3 may have substantially the same or similar structure.

Referring to FIG. 6A, the pixel PXL in accordance with an embodiment of the present disclosure may include a light source unit LSU configured to generate light having a luminance corresponding to a data signal. The pixel PXL may selectively further include a pixel circuit PXC configured to drive the light source unit LSU.

In an embodiment, the light source unit LSU may include a plurality of light emitting elements LD that are electrically connected to each other between the first power supply VDD and the second power supply VSS. In an embodiment, the light emitting elements LD may be connected in parallel to each other, but the present disclosure is not limited thereto. For example, in an embodiment, a plurality of light emitting elements LD may be connected in a serial/parallel combination structure between the first power supply VDD and the second power supply VSS.

In an embodiment, the first and second power supplies VDD and VSS may have different potentials to make it possible for the light emitting elements LD to emit light. For example, the first power supply VDD may be set as a high-potential power supply, and the second power supply VSS may be set as a low-potential power supply. Here, a difference in potential between the first and second power supplies VDD and VSS may be set to a threshold voltage of the light emitting elements LD or more during at least an emission period of the pixel PXL.

Although FIG. 6A illustrates an embodiment in which the light emitting elements LD forming the light source unit LSU of each pixel PXL are connected in parallel to each other in the same direction (e.g., in a forward direction) between the first power supply VDD and the second power supply VSS, the present disclosure is not limited to this. For example, in an embodiment, some of the light emitting elements LD may be connected to each other in a first direction (e.g., the forward direction) between the first and second power supplies VDD and VSS to form each valid light source, and the other light emitting elements LD may be connected to each other in a second direction (e.g., a reverse direction). Alternatively, in an embodiment, at least one pixel PXL may include only a single light emitting element LD (e.g., a single valid light source connected in the forward direction between the first and second power supplies VDD and VSS).

In an embodiment, first ends of the light emitting elements LD forming each light source unit LSU may be connected in common to the pixel circuit PXC through one electrode of the light source unit LSU (e.g., a first electrode and/or a first contact electrode of each pixel PXL), and may be connected to the first power supply VDD through the pixel circuit PXC and a first power line PL1. Second ends of the light emitting elements LD may be connected in common to the second power supply VSS through another electrode of the light source unit LSU (e.g., a second electrode and/or a second contact electrode of each pixel PXL) and the second power line PL2.

Each light source unit LSU may emit light having a luminance corresponding to driving current supplied thereto through the corresponding pixel circuit PXC. Thereby, an image (e.g., a set or predetermined image) may be displayed in the display area DA.

The pixel circuit PXC may be connected to a scan line Si and a data line Dj of the corresponding pixel PXL. For example, if the pixel PXL is disposed on an i-th row (i is a natural number) and a j-th column (j is a natural number) of the display area DA, the pixel circuit PXC of the pixel PXL may be connected to an i-th scan line Si and a j-th data line Dj of the display area DA. In an embodiment, the pixel circuit PXC may include first and second transistors T1 and T2, and a storage capacitor Cst.

The first transistor (referred also to as "driving transistor") T1 is connected between the first power supply VDD and the light source unit LSU. A gate electrode of the first transistor T1 is connected to a first node N1. The first transistor T1 may control driving current to be supplied to the light source unit LSU in response to the voltage of the first node N1.

The second transistor (referred also to as "switching transistor") T2 may be connected between the data line Dj and the first node N1. A gate electrode of the second transistor T2 is connected to the scan line Si. When a scan signal having a gate-on voltage (e.g., a low level voltage) is supplied from the scan line Si, the second transistor T2 is turned on to electrically connect the first node N1 to the data line Dj.

During each frame period, a data signal of a corresponding frame is supplied to the data line Dj. The data signal is transmitted to the first node N1 via the second transistor T2. Thereby, a voltage (or charge) corresponding to the data signal is charged to the storage capacitor Cst connected between the first node N1 and the first power supply VDD.

One electrode of the storage capacitor Cst is connected to the first power supply VDD, and the other electrode thereof is connected to the first node N1. The storage capacitor Cst may charge to a voltage corresponding to a data signal to be supplied to the first node N1 during each frame period.

Although in FIG. 6A the transistors, e.g., the first and second transistors T1 and T2, included in the pixel circuit PXC have been illustrated as being formed of P-type transistors, the present disclosure is not limited to this. In other words, at least one of the first and second transistors T1 and T2 may be changed to an N-type transistor.

For example, as shown in FIG. 6B, both the first and second transistors T1 and T2 may be formed of N-type transistors. In this case, the gate-on voltage of the scan signal for writing the data signal supplied to the data line Dj to the pixel PXL in each frame period may be a high level voltage. Likewise, the voltage of the data signal for turning on the first transistor T1 may be a voltage having a waveform opposite to that of the embodiment of FIG. 6A. For example, in the embodiment of FIG. 6B, as a gray scale value that is to be expressed increases, a data signal having a higher voltage level may be supplied.

The pixel PXL shown in FIG. 6B is substantially similar in configuration and operation to the pixel PXL of FIG. 6A, except that the connection positions of some circuit elements and the voltage levels of control signals (e.g., a scan signal and a data signal) are changed depending on a change in type of the transistor. Therefore, detailed description of the pixel PXL of FIG. 6B will be omitted.

For example, in the pixel circuit PXC of FIG. 6B, the capacitor Cst is connected between the first node N1 and the second power supply VSS. Also, in the pixel circuit PXC of FIG. 6B, the light source unit LSU is connected between the first power supply VDD and a first electrode of the first transistor T1 or the pixel circuit PXC, and the first transistor T1 is connected between the second electrode of the light source unit LSU and the second power supply VSS.

The structure of the pixel circuit PXC is not limited to the embodiments shown in FIGS. 6A and 6B. In other words, the pixel circuit PXC may be formed of a well-known pixel circuit that may have various structures and/or be operated by various driving schemes. For example, the pixel circuit PXC may be configured in the same manner as that of an embodiment illustrated in FIG. 6C.

Referring to FIG. 6C, the pixel circuit PXC may be connected not only to a scan line Si of a corresponding horizontal line but also to at least one another scan line (or a control line). For example, the pixel circuit PXC of the pixel PXL disposed on the i-th row of the display area DA may be further connected to an i−1-th scan line Si−1 (e.g., a preceding scan line) and/or an i+1-th scan line Si+1 (e.g., a scan line of a subsequent stage). In an embodiment, the pixel circuit PXC may be connected not only to the first and second power supplies VDD and VSS but also to a third power supply. For instance, the pixel circuit PXC may also be connected to an initialization power supply Vint. In an embodiment, the pixel circuit PXC may include first to seventh transistors T1 to T7 and a storage capacitor Cst.

The first transistor T1 may be connected between the first power supply VDD and the light source unit LSU. For example, a first electrode (e.g., a source electrode) of the first transistor T1 may be connected to the first power supply VDD through the fifth transistor T5 and the first power line PL1, and a second electrode (e.g., a drain electrode) of the first transistor T1 may be connected via the sixth transistor T6 to the first electrode (e.g., the first electrode of the corresponding pixel PXL) of the light source unit LSU. A gate electrode of the first transistor T1 is connected to a first node N1. The first transistor T1 may control driving current to be supplied to the light source unit LSU in response to the voltage of the first node N1.

The second transistor T2 is connected between the data line Dj and the first electrode (e.g., a source electrode) of the first transistor T1. A gate electrode of the second transistor T2 is connected to the corresponding scan line Si. When a scan signal having a gate-on voltage (e.g., a low level voltage) is supplied from the scan line Si, the second transistor T2 may be turned on to electrically connect the data line Dj to the first electrode (e.g., a source electrode) of the first transistor T1. Hence, if the second transistor T2 is turned on, a data signal supplied from the data line Dj may be transmitted to the first transistor T1.

The third transistor T3 may be connected between the second electrode (e.g., the drain electrode) of the first transistor T1 and the first node N1. A gate electrode of the third transistor T3 is connected to the corresponding scan line Si. When a scan signal having a gate-on voltage (e.g., a low level voltage) is supplied from the scan line Si, the third transistor T3 may be turned on to electrically connect the first transistor T1 in the form of a diode (e.g., the first transistor T1 may be diode-connected).

The fourth transistor T4 may be connected between the first node N1 and an initialization power supply Vint. A gate electrode of the fourth transistor T4 is connected to a preceding scan line, e.g., an i−1-th scan line Si−1. When a scan signal of a gate-on voltage (e.g., a low level voltage) is supplied to the i−1-th scan line Si−1, the fourth transistor T4 may be turned on so that the voltage of the initialization power supply Vint may be transmitted to the first node N1. In an embodiment, the voltage of the initialization power supply Vint for initializing the gate voltage of the first transistor T1 may be equal to the lowest voltage of the data signal or less.

The fifth transistor T5 is connected between the first power supply VDD and the first transistor T1 (e.g., the first electrode of the first transistor T1). A gate electrode of the fifth transistor T5 is connected to a corresponding emission control line, e.g., an i-th emission control line Ei. The fifth transistor T5 may be turned off when an emission control signal having a gate-off voltage (e.g., a high level voltage) is supplied to the emission control line Ei, and may be turned on when an emission control signal of a gate-on voltage (e.g., a low voltage) is supplied to the emission control line Ei.

The sixth transistor T6 is connected between the first transistor T1 (e.g., the second electrode of the first transistor T1) and a second node N2, which is electrically connected to the light source unit LSU. A gate electrode of the sixth transistor T6 is connected to a corresponding emission control line, e.g., the i-th emission control line Ei. The sixth transistor T6 may be turned off when an emission control signal having a gate-off voltage is supplied to the emission control line Ei, and may be turned on when an emission control signal of a gate-on voltage (e.g., a low voltage) is supplied to the emission control line Ei.

The seventh transistor T7 is connected between the first electrode of the light source unit LSU (e.g., the first electrode of the corresponding pixel PXL or the second node N2) and the initialization power supply Vint. A gate electrode of the seventh transistor T7 is connected to any one of scan lines of a subsequent stage, e.g., to the i+1-th scan line Si+1. When a scan signal of a gate-on voltage (e.g., a low level voltage) is supplied to the i+1-th scan line Si+1, the seventh transistor T7 may be turned on so that the voltage of the initialization power supply Vint may be supplied to the first electrode of the light source unit LSU. In this case, during each initialization period in which the voltage of the initialization power supply Vint is transmitted to the light source unit LSU, the voltage of the first electrode of the light source unit LSU may be initialized. The control signal for controlling the operation of the seventh transistor T7 may be changed in various ways. For example, in an embodiment, the gate electrode of the seventh transistor T7 may be connected to a scan line of a corresponding horizontal line, i.e., an i-th scan line Si. In this case, when a scan signal having a gate-on voltage is supplied to the i-th scan line Si, the seventh transistor T7 may be turned on so that the voltage of the initialization power supply Vint may be supplied to the first electrode of the light source unit LSU.

The storage capacitor Cst may be connected between the first power supply VDD and the first node N1. The storage capacitor Cst may store a voltage or charge corresponding both to the data signal applied to the first node N1 and to the threshold voltage of the first transistor T1 during each frame period.

Although in FIG. 6C the transistors, e.g., the first to seventh transistors T1 to T7, included in the pixel circuit PXC have been illustrated as being formed of P-type transistors, the present disclosure is not limited to this. For example, at least one of the first to seventh transistors T1 to T7 may be changed to an N-type transistor.

The structure of the pixel PXL that may be applied to the present disclosure is not limited to the embodiments illustrated in FIGS. 6A-6C, and each pixel PXL may have various well-known structures. For example, the pixel circuit PXC included in each pixel PXL may be formed of a well-known pixel circuit that may have various structures and/or be operated by various driving schemes. In an embodiment of the present disclosure, each pixel PXL may be configured in a passive light emitting display device, or the like. In this case, the pixel circuit PXC may be omitted, and each of the opposite ends of the light emitting elements LD that form the light source unit LSU may be directly connected to the scan line Si, the data line Dj, the first or second power line PL1 or PL2, and/or a control line (e.g., a set or predetermined control line).

FIGS. 7-20 are plan views each illustrating a pixel PXL in accordance with an embodiment of the present disclosure. In an embodiment, each pixel PXL may be any one of the pixels PXL illustrated in FIGS. 5-6C, but the present disclosure is not limited thereto.

FIGS. 7-20 illustrates the structure of each pixel PXL, focusing on the light source unit LSU. Here, the pixel PXL may further include a circuit element (e.g., at least one circuit element that forms the pixel circuit PXC of FIGS. 6A-6C) for controlling each light source unit LSU. In an embodiment, the circuit element may be disposed on a layer different from that of the light source unit LSU. For example, the circuit element may be disposed in a pixel circuit layer located on one surface of the base layer BSL, and the light source unit LSU may be disposed in a display element layer disposed on the pixel circuit layer.

Furthermore, in an embodiment, FIGS. 7-20 illustrate an embodiment in which each light source unit LSU is connected, through first and second contact holes CH1 and CH2, to a power line (e.g., a set or predetermined power line) (e.g., first and/or second power lines PL1 and/or PL2), a circuit element (e. g., at least one circuit element that forms the pixel circuit PXC), and/or a signal line (e.g., a scan line Si and/or a data line Dj), but the present disclosure is not limited thereto. For example, in an embodiment of the present disclosure, at least one of the first and second electrodes ELT1 and ELT2 of each pixel PXL may be directly connected to a power line (e.g., a set or predetermined power line) and/or signal line without a contact hole and/or an intermediate line.

Referring to FIG. 7, the pixel PXL in accordance with an embodiment of the present disclosure may include a plurality of light emitting elements LD and electrodes to form each light source unit LSU. For example, the pixel PXL may include a first electrode ELT1 and a second electrode ELT2 that are disposed in each pixel area at positions spaced from each other, a plurality of light emitting elements LD arranged between the first and second electrodes ELT1 and ELT2, and a first contact electrode CNE1 and a second contact electrode CNE2 that are respectively disposed on the first electrode ELT1 and the second electrode ELT2. The first and second contact electrodes CNE1 and CNE2 may be disposed in each pixel area at positions spaced from each other, in the same manner as that of the first and second electrodes ELT1 and ELT2, and electrically connect the first ends EP1 and the second ends EP2 of the light emitting elements LD to the first electrode ELT1 and the second electrode ELT2, respectively. Furthermore, the pixel PXL in accordance with an embodiment of the present disclosure may include at least one first conductive pattern CP1 (e.g., a plurality of first conductive patterns CP1) disposed between the first contact electrode CNE1 and at least one of the light emitting elements LD (e.g., a plurality of light emitting elements LD).

The first electrode ELT1 and the second electrode ELT2 may be disposed, at positions spaced from each other, in each pixel area in which the corresponding pixel PXL is provided and/or formed, and for example, may be disposed in the emission area EMA of the corresponding pixel PXL. In an embodiment, each pixel area may embrace an area in which the light source unit LSU and/or circuit elements for forming the corresponding pixel PXL are disposed. The emission area EMA may be an area in which light emitting elements LD (e.g., valid light sources validly connected between the first and second electrodes ELT1 and ELT2) that form the light source unit LSU of each pixel PXL are disposed. Furthermore, electrodes (e.g., set or predetermined electrodes) connected to the light emitting elements LD (e.g., the first and second electrodes ELT1 and ELT2 and the first and second contact electrodes CNE1 and CNE2) or areas of the electrodes may be disposed in the emission area EMA. The emission area EMA may be enclosed by a light shielding and/or reflective bank structure (referred also to as "pixel defining layer") that is formed between the pixels PXL to define each pixel area and the emission area EMA formed in the pixel area. For example, a bank structure that encloses the emission area EMA may be disposed around the emission area EMA.

In an embodiment, the first and second electrodes ELT1 and ELT2 may be spaced from each other. For example, the first and second electrodes ELT1 and ELT2 may be disposed in parallel in each emission area EMA at positions spaced from each other by a distance (e.g., a set or predetermined distance) in a first direction DR1.

In an embodiment, each of the first and second electrodes ELT1 and ELT2 may have a bar shape extending in any one direction. For example, each of the first and second electrodes ELT1 and ELT2 may have a bar shape extending in the second direction DR2 intersecting with (e.g., perpendicular to) the first direction DR1. However, the present disclosure is not limited to this. For example, the shapes, the orientations, and/or the relative disposition relationship of the first and second electrodes ELT1 and ELT2 may be changed in various ways.

Furthermore, one or more first and second electrodes ELT1 and ELT2 may be disposed in each pixel area, and the numbers of first and second electrodes ELT1 and ELT2 disposed in the pixel area are not particularly limited. For example, a plurality of first electrodes ELT1 that extend in the second direction DR2 and are arranged in parallel to each other may be disposed in each pixel area. Facing (or opposite to) each first electrode ELT1, at least one second electrode ELT2 may be disposed in each pixel area. For example, in each pixel area, one second electrode ELT2 may be disposed between two first electrodes ELT1, and a plurality of second electrodes ELT2 may be respectively disposed to correspond to the plurality of first electrodes ELT1.

In an embodiment, the first electrode ELT1 may be electrically connected to a circuit element (e.g., a set or predetermined circuit element) (e.g., at least one transistor that forms the pixel circuit PXC), a power line (e.g., the first power line PL1), and/or a signal line (e.g., a scan line Si, a data line Dj, or a control line (e.g., a set or predetermined control line)) through a first connection electrode CNL1 and/or a first contact hole CH1. In an embodiment, the first electrode ELT1 may be electrically connected to a circuit element (e.g., a set or predetermined circuit element) disposed therebelow through the first connection electrode CNL1 and the first contact hole CH1, and may be electrically connected to a first line through the circuit element. The first line may be the first power line PL1 for supply of the first power supply voltage VDD, but the present disclosure is not limited thereto. For example, in an embodiment, the first line may be a signal line through which a first driving signal (e.g., a set or predetermined first driving signal) (e.g., a scan signal, a data signal, or a control signal (e.g., a set or predetermined control signal)) may be supplied.

Alternatively, in an embodiment, the first electrode ELT1 may be directly connected to a power line (e.g., a set or predetermined power line) or a signal line without the first connection electrode CNL1, the first contact hole CH1, and/or the circuit element. In this case, the first electrode ELT1 may be integrally or non-integrally connected to the power line (e.g., the set or predetermined power line) or the signal line.

In an embodiment, the first electrode ELT1 and the first connection electrode CNL1 may extend in different directions in the corresponding pixel area. For example, when the first connection electrode CNL1 extends in the first direction DR1, the first electrode ELT1 may extend in the second direction DR2 intersecting with the first direction DR1.

In an embodiment, the first electrode ELT1 and the first connection electrode CNL1 may be integrally connected with each other. For instance, the first electrode ELT1 may diverge in at least one way from the first connection electrode CNL1. In the case where the first electrode ELT1 and the first connection electrode CNL1 are integrally connected with each other, the first connection electrode CNL1 may be regarded as an area of the first electrode ELT1. However, the present disclosure is not limited thereto. For example, in an embodiment, the first electrode ELT1 and the first connection electrode CNL1 may be individually formed and electrically connected to each other through at least one contact hole, via hole, or the like.

In an embodiment, the second electrode ELT2 may be electrically connected to a circuit element (e.g., a set or predetermined circuit element) (e.g., at least one transistor that forms the pixel circuit PXC), a power line (e.g., the second power line PL2), and/or a signal line (e.g., a scan line Si, a data line Dj, or a control line (e.g., a set or predetermined control line)) through a second connection electrode CNL2 and/or a second contact hole CH2. For example, the second electrode ELT2 may be electrically connected to the second power line PL2 disposed therebelow, through the second connection electrode CNL2 and the second contact hole CH2. Alternatively, in an embodiment, the second electrode ELT2 may be directly connected to a power line (e.g., a set or predetermined power line) or a signal line without the second connection electrode CNL2 and/or the second contact hole CH2. In this case, the second electrode ELT2 may be integrally or non-integrally connected to the power line (e.g., set or predetermined power line) or the signal line.

In an embodiment, the second electrode ELT2 and the second connection electrode CNL2 may extend in different directions. For example, when the second connection electrode CNL2 extends in the first direction DR1, the second electrode ELT2 may extend in the second direction DR2 intersecting with the first direction DR1.

In an embodiment, the second electrode ELT2 may be integrally connected with the second connection electrode CNL2. For instance, the second electrode ELT2 may diverge in at least one way from the second connection electrode CNL2. In the case where the second electrode ELT2 and the second connection electrode CNL2 are integrally connected with each other, the second connection electrode CNL2 may be regarded as an area of the second electrode ELT2. However, the present disclosure is not limited thereto. For example, in an embodiment, the second electrode ELT2 and the second connection electrode CNL2 may be individually formed and electrically connected to each other through at least one contact hole, via hole, or the like.

Here, during a process of forming the pixel PXL, for example, before the alignment of the light emitting elements LD is completed, the respective first electrodes ELT1 of the pixels PXL (or the adjacent pixels PXL in the second direction DR2) disposed in the display area DA may be electrically connected to each other, and the respective second electrodes ELT2 of the pixels PXL (or the adjacent pixels PXL in the second direction DR2) may be electrically connected to each other. The first and second electrodes ELT1 and ELT2 may be respectively supplied with a first alignment signal (or a first alignment voltage) and a second alignment signal (or a second alignment voltage) at the step of aligning the light emitting elements LD. For example, any one of the first and second electrodes ELT1 and ELT2 may be supplied with an alternating current alignment signal, and the other one of the first and second electrodes ELT1 and ELT2 may be supplied with an alignment voltage having a constant voltage level.

In other words, at the step of aligning the light emitting elements LD, an alignment signal (e.g., a set or predetermined alignment signal) may be applied between the first and second electrodes ELT1 and ELT2, so that an electric field can be formed between the first and second electrodes ELT1 and ELT2. The light emitting elements LD supplied to each pixel area, e.g., the emission area EMA of each pixel PXL, may be aligned between the first and second electrodes ELT1 and ELT2 by the electric field. After the alignment of the light emitting elements LD has been completed, connection between the first electrodes ELT1 and/or connection of the second electrodes ELT2 may be disconnected between the pixel PXL so that the pixels PXL can be individually driven.

Each of the first and second electrodes ELT1 and ELT2 may have a single-layer or multi-layer structure. For example, each first electrode ELT1 may include at least one reflective electrode layer, and selectively further include at least one transparent electrode layer and/or a conductive capping layer. Likewise, each second electrode ELT2 may include at least one reflective electrode layer, and selectively further include at least one transparent electrode layer and/or a conductive capping layer.

A plurality of light emitting elements LD may be arranged between the first and second electrodes ELT1 and ELT2. Each light emitting element LD may be electrically connected between the first and second electrodes ELT1 and ELT2 corresponding to each other.

In an embodiment, at least one light emitting element (hereinafter, referred to as "invalid light source") that is not completely connected between the first and second electrodes ELT1 and ELT2 may be further disposed in each emission area EMA. Hereinafter, embodiments of the present disclosure will be described, focused on light emitting elements LD (i.e., valid light sources) the opposite ends of each of which are connected to the first and second electrodes ELT1 and ELT2.

In an embodiment, each light emitting element LD may be a rod-type light emitting diode having a longitudinal direction, but the present disclosure is not limited thereto. For example, in an embodiment, at least some of the light emitting elements LD may each be a light emitting diode having a core-shell structure.

In an embodiment, each of the light emitting elements LD may be a light emitting element that is made of material having an inorganic crystal structure and has a subminiature size, e.g., a size ranging from the nanometer scale to the micrometer scale. For example, each light emitting element LD may be a subminiature light emitting element having a size ranging from the nanometer scale to the micrometer scale, as illustrated in FIGS. 1A-4B. However, the size of the light emitting element LD may be changed in various ways depending on design conditions, etc. of each light emitting device, e.g., the pixel PXL, using the light emitting element LD as a light source.

In an embodiment, each light emitting element LD may include a first end EP1 that is disposed on one end thereof with respect to the longitudinal direction (L) of the light emitting element LD and electrically connected to the first electrode ELT1, and a second end EP2 that is disposed on the other end thereof with respect to the longitudinal direction (L) of the light emitting element LD and electrically connected to the second electrode ELT2. For example, each light emitting element LD may be horizontally oriented in the first direction DR1 between the first and second electrodes ELT1 and ELT2, in an area in which the first and second electrodes ELT1 and ELT2 corresponding to each other are disposed to face each other.

Although FIG. 7 illustrates that the light emitting elements LD are uniformly oriented in any one direction, e.g., in the first direction DR1, the present disclosure is not limited thereto. For example, at least one of the light emitting elements LD may be oriented in a diagonal direction between the first and second electrodes ELT1 and ELT2. Alternatively, although not illustrated in FIG. 7, at least one light emitting element (i.e., an invalid light source) that is not completely connected between the first and second electrodes ELT1 and ELT2 may be further disposed in each pixel area and/or an area provided around the pixel area.

In an embodiment, the light emitting elements LD may be prepared in a diffused form in a solution (e.g., a set or predetermined solution), and then supplied to each pixel area (e.g., the emission area EMA of each pixel PXL) by an inkjet printing scheme or the like. For example, the light emitting elements LD may be mixed with a volatile solvent and supplied to each emission area EMA. Here, if alignment voltages (e.g., set or predetermined alignment voltages) (or alignment signals) are applied to the first and second electrodes ELT1 and ELT2, an electric field is formed between the first and second electrodes ELT1 and ELT2, whereby the light emitting elements LD may be aligned between the first and second electrodes ELT1 and ELT2. After the light emitting elements LD have been aligned, the solvent may be removed by a volatilization scheme or other schemes. In this way, the light emitting elements LD may be reliably disposed between the first and second electrodes ELT1 and ELT2. Furthermore, the first contact electrode CNE1 and the second contact electrode CNE2 may be respectively formed on the opposite ends of the light emitting elements LD, i.e., the first and second ends EP1 and EP2. Consequently, the light emitting elements LD may be more reliably connected between the first and second electrodes ELT1 and ELT2.

The first ends EP1 of the light emitting elements LD may be electrically connected to the first power supply VDD via the first contact electrode CNE1, the first electrode ELT1, the pixel circuit PXC, and/or the first power line PL1. The second ends EP2 of the light emitting elements LD may be electrically connected to the second power supply VSS via the second contact electrode CNE2, the second electrode ELT2, and/or the second power line PL2. Hence, at least one light emitting element LD that is connected in a forward direction between the first and second electrodes ELT1 and ELT2 may emit light at a luminance corresponding to driving current supplied from the pixel circuit PXC or the like. Thereby, the pixel PXL may emit light corresponding to the driving current.

In an embodiment of the present disclosure, in at least one light emitting element LD of the light emitting elements LD arranged between the first and second electrodes ELT1 and ELT2 of each pixel PXL, each first end EP1 may be electrically connected to the first electrode ELT1 through the first conductive pattern CP1 and the first contact electrode CNE1, and each second end EP2 may be electrically connected to the second electrode ELT2 through at least the second contact electrode CNE2. Hereinafter, from among the light emitting elements LD disposed in each pixel PXL, a light emitting element LD of which at least one end (e.g., the first end EP1) is electrically connected to the first or second electrode ELT1 or ELT2 (e.g., the first electrode ELT1) via at least one conductive pattern (e.g., the first conductive pattern CP1) will be referred to as "first light emitting element LD1".

Furthermore, in an embodiment, the first and second ends EP1 and EP2 of at least another light emitting element LD from among the light emitting elements LD arranged between the first and second electrodes ELT1 and ELT2 of each pixel PXL may be respectively and directly connected to the first and second contact electrodes CNE1 and CNE2 and respectively and electrically connected to the first and second electrodes ELT1 and ELT2 through the first and second contact electrodes CNE1 and CNE2. Hereinafter, from among the light emitting elements LD disposed in each pixel PXL, a light emitting element LD of which both the opposite ends (i.e., the first and second ends EP1 and EP2) are electrically connected to the first and second electrodes ELT1 and ELT2 and/or the first and second contact electrodes CNE1 and CNE2 without a conductive pattern will be referred to as "second light emitting element LD2. The term "light emitting element LD" or "light emitting elements LD" will be used to arbitrarily designate one or more light emitting elements of the first and second light emitting elements LD1 and LD2 or collectively designate the first and second light emitting elements LD1 and LD2.

As such, each of a plurality of light emitting elements LD that are electrically connected between the first and second electrodes ELT1 and ELT2 and between the first and second contact electrodes CNE1 and CNE2 (e.g., connected in the forward direction to emit light in response to a control signal (e.g., a set or predetermined control signal) and/or power supplied to the first and/or second electrodes ELT1 and/or ELT2) may form a valid light source of the corresponding pixel PXL. Such valid light sources may be collected to form the light source unit LSU of the corresponding pixel PXL.

The first contact electrode CNE1 may be disposed over each first electrode ELT1 to overlap with the first electrode ELT1. The first contact electrode CNE1 may be electrically connected to each first electrode ELT1.

In an embodiment, the first contact electrode CNE1 may be spaced from at least one first light emitting element LD1, and electrically connected to the first light emitting element LD1 through at least one first conductive pattern CP1. For example, in at least a plan view, the first contact electrode CNE1 may be disposed at a position spaced from the respective first ends EP1 of a plurality of first light emitting elements LD1, and electrically connected to the first ends EP1 of the first light emitting elements LD1 through a plurality of first conductive patterns CP1 that overlap and/or connect with the respective first ends EP1 of the first light emitting elements LD1. The first ends EP1 of the first light emitting elements LD1 may be electrically connected to the first electrode ELT1 by the first contact electrode CNE1 and the respective first conductive patterns CP1.

The first contact electrode CNE1 may be formed to overlap with at least one second light emitting element LD2. For example, the first contact electrode CNE1 may include at least one first protrusion PP1 that protrudes toward at least one second light emitting element LD2 to overlap with the first end EP1 the second light emitting element LD2. For example, the first contact electrode CNE1 may include a plurality of first protrusions PP1 that protrude toward a plurality of second light emitting elements LD2 to overlap with the respective first end EP1 of the second light emitting elements LD2. Each first protrusion PP1 may protrude from one edge of the first contact electrode CNE1 (e.g., one edge facing the second electrode ELT2 and the second contact electrode CNE2) and may be integrally formed with the first contact electrode CNE1. In other words, in an embodiment, each first protrusion PP1 may be one area of the first contact electrode CNE1. The first ends EP1 of the second light emitting elements LD2 may be electrically connected to the first electrode ELT1 by the first contact electrode CNE1. Furthermore, the first ends EP1 of the second light emitting elements LD2 may be stably fixed by the first contact electrode CNE1, so that the second light emitting elements LD2 may be prevented or protected from being removed from the aligned positions.

The second end EP2 of each of the second light emitting elements LD2 may be electrically connected to the second contact electrode CNE2. For example, the second end EP2 of each of the second light emitting elements LD2 may overlap with the second contact electrode CNE2 and thus may be directly connected to the second contact electrode CNE2.

The second contact electrode CNE2 may be disposed over the second electrode ELT2 to overlap with the second electrode ELT2. The second contact electrode CNE2 may be electrically connected to the second electrode ELT2.

In an embodiment, the second contact electrode CNE2 may be electrically connected to the respective second ends EP2 of the light emitting elements LD (e.g., LD1, LD2). For example, the second contact electrode CNE2 may overlap with the second ends EP2 of the light emitting elements LD (e.g., LD1, LD2) and may be electrically connected to the second ends EP2 of the light emitting elements LD (e.g., LD1, LD2).

The second ends EP2 of the light emitting elements LD (e.g., LD1, LD2) may be electrically connected to the second electrode ELT2 by the second contact electrode CNE2. Furthermore, the second ends EP2 of the light emitting elements LD (e.g., LD1, LD2) may be stably fixed by the second contact electrode CNE2, so that the light emitting elements LD (e.g., LD1, LD2) may be prevented or protected from being removed from the aligned positions.

However, the present disclosure is not limited to an embodiment where the second ends EP2 of the light emitting elements LD (e.g., LD1, LD2) are indirectly connected to the second electrode ELT2 through the second contact electrode CNE2. For example, in an embodiment of the present disclosure, the second ends EP2 of the light emitting elements LD (e.g., LD1, LD2) may be directly connected to the second electrode ELT2. In this case, the second contact electrode CNE2 may not be provided.

Each first conductive pattern CP1 may be disposed between the corresponding first light emitting element LD1 and the first contact electrode CNE1. For example, each first conductive pattern CP1 may be disposed on the first end EP1 of the corresponding first light emitting element LD1 and one area of the first contact electrode CNE1 that is adjacent thereto.

In an embodiment, the first end EP1 of each first light emitting element LD1 may be spaced from the adjacent first electrode ELT1 and the adjacent first contact electrode CNE1 and electrically connected to the first electrode ELT1 via the corresponding first conductive pattern CP1 and the first contact electrode CNE1. To this end, the first electrode ELT1 and the second electrode ELT2 may be spaced from each other by a distance d1 equal to or greater than an average length L of the light emitting elements LD. At least one electrode of the first and second electrodes ELT1 and ELT2 (e.g., the first electrode ELT1) may be electrically connected to any one end (e.g., the first end EP1) of at least one first light emitting element LD1 through the corresponding conductive pattern (e.g., the first conductive pattern CP1) and the corresponding contact electrode (e.g., the first contact electrode CNE1).

In this case, if a short-circuit defect occurs on at least one first light emitting element LD1, at least one conductive pattern connected to at least one end of the first light emitting element LD1 on which the short-circuit defect has occurred (e.g., the first conductive pattern CP1 that is connected to the first end EP1 of the first light emitting element LD1) may be selectively disconnected. Hence, leakage current may be prevented from flowing through the first light emitting element LD1 that has short-circuited, and the defected pixel is allowed to be efficiently repaired.

In an embodiment, each first conductive pattern CP1 may include at least one of various metal materials including silver (Ag), magnesium (Mg), aluminum (Al), platinum (Pt), palladium (Pd), gold (Au), nickel (Ni), neodymium (Nd), iridium (Ir), chrome (Cr), titanium (Ti), molybdenum (Mo), copper (Cu), etc., or an alloy thereof, or at least one of various transparent conductive materials including a silver nanowire (AgNW), indium tin oxide (ITO), indium zinc oxide (IZO), antimony zinc oxide (AZO), indium tin zinc oxide (ITZO), zinc oxide (ZnO), tin oxide ($SnO_2$), a carbon nanotube, graphene, etc. In addition, each first conductive pattern CP1 may include, to have conductivity, at least one of various conductive materials that may be used to form an electrode or a line.

In an embodiment, each first conductive pattern CP1 may include the same conductive material as the constituent material of at least one electrode of the first and second electrodes ELT1 and ELT2 and the first and second contact electrodes CNE1 and CNE2, or may include at least one conductive material that is not included in the foregoing electrodes. For example, the first conductive pattern CP1 may include at least one conductive material different from the constituent material of the first contact electrode CNE1.

In an embodiment, each first conductive pattern CP1 may include a low melting conductive material having a melting point lower than that of the first contact electrode CNE1. In this case, when heat is applied to a target first conductive pattern CP1 to be disconnected by a relatively simple scheme such as a scheme of applying a laser beam or a voltage (e.g., a set or predetermined voltage) to the first conductive pattern CP1, the first conductive pattern CP1 may be easily disconnected. Therefore, even if a short-circuit defect occurs on light emitting elements LD, e.g., at least one first light emitting element LD1 of which at least one end is connected to the first conductive pattern CP1, the first conductive pattern CP1 that is connected to the short-circuited first light emitting element LD1 may be selectively disconnected. Hence, the short-circuited first light emitting element LD1 may be selectively isolated from the first and/or second electrodes ELT1 and/or ELT2. Therefore, the other light emitting elements LD that have not been short-circuited may be fully used to form the light source unit LSU, so that the defected pixel may be efficiently repaired.

In an embodiment, the first conductive pattern CP1 may include a low melting metal or a low melting alloy having a melting point of 400° C. or less. For example, the first conductive pattern CP1 may be formed of at least one metal of alkali metals having a relatively low melting point (e.g., at least one of lithium (Li), natrium (Na), kalium (K), rubidium (Rb), cesium (Cs), francium (Fr)), alkali earth metal (e.g., at least one of calsium (Ca), strontium (Sr), barium (Ba), and radium (Ra)), at least one metal of bismuth (Bi), lead (Pb), Tin (Sn), cadmium (Cd), zinc (Zn), and stibium (Sb), or an alloy (or plate) including the foregoing metals. For example, the first conductive pattern CP1 may be formed of an SAC (Sn—Ag—Cu) alloy. However, conductive material capable of being used to form the first conductive pattern CP1 is not limited the foregoing examples, the first conductive pattern CP1 may include at least one of various conductive materials.

Furthermore, in an embodiment, the first conductive pattern CP1 may be formed of a transparent or translucent conductive layer that satisfies a transmittance range (e.g., a set or predetermined transmittance range) to allow light emitted from the first light emitting elements LD1 to pass therethrough. For example, the first conductive pattern CP1 may include transparent electrode material (e.g., conductive oxide such as ITO, IZO, ZnO, and ITZO) or a metal compound that has transparent or translucent characteristics.

In an embodiment, the first conductive pattern CP1 may be formed to be thin with a limited thickness or have a mesh shape with a plurality of openings to secure a transmittance within a range (e.g., a set or predetermined range). Furthermore, the first conductive pattern CP1 may have a single layer structure or a multi-layer structure, and the shape or the cross-sectional structure of the first conductive pattern CP1 is not particularly limited.

In an embodiment, in the case where each pixel PXL includes a plurality of first light emitting elements LD1 arranged between the first and second electrodes ELT1 and ELT2, the pixel PXL may include a plurality of first conductive patterns CP1 disposed on the respective first ends EP1 of the first light emitting elements LD1. For example, each pixel PXL may include a plurality of conductive patterns CP1 disposed at positions spaced apart from each other on the respective first ends EP1 of a plurality of first light emitting elements LD1.

In an embodiment, the plurality of first conductive patterns CP1 may be regularly disposed in each emission area EMA. For example, the first conductive patterns CP1 and the first protrusions PP1 may be regularly arranged on one edge of the first contact electrode CNE1 in an extension direction of the first contact electrode CNE1 (e.g., in the second direction DR2). For example, the first conductive patterns CP1 and the first protrusions PP1 may be alternately arranged on the one edge of the first contact electrode CNE1 that is adjacent to the first end EP1 of the first light emitting element LD1.

The number and/or the arrange structure of first conductive patterns CP1 disposed in the emission area EMA of each pixel PXL may be changed in various ways. Furthermore, the numbers and/or arrangement structures of first conductive patterns CP1 dispersed in the pixels PXL disposed in the display area DA may be the same as each other. Alternatively, the numbers and/or arrangement structures of first conductive patterns CP1 included in the pixels PXL may differ from each other.

Figure 8:
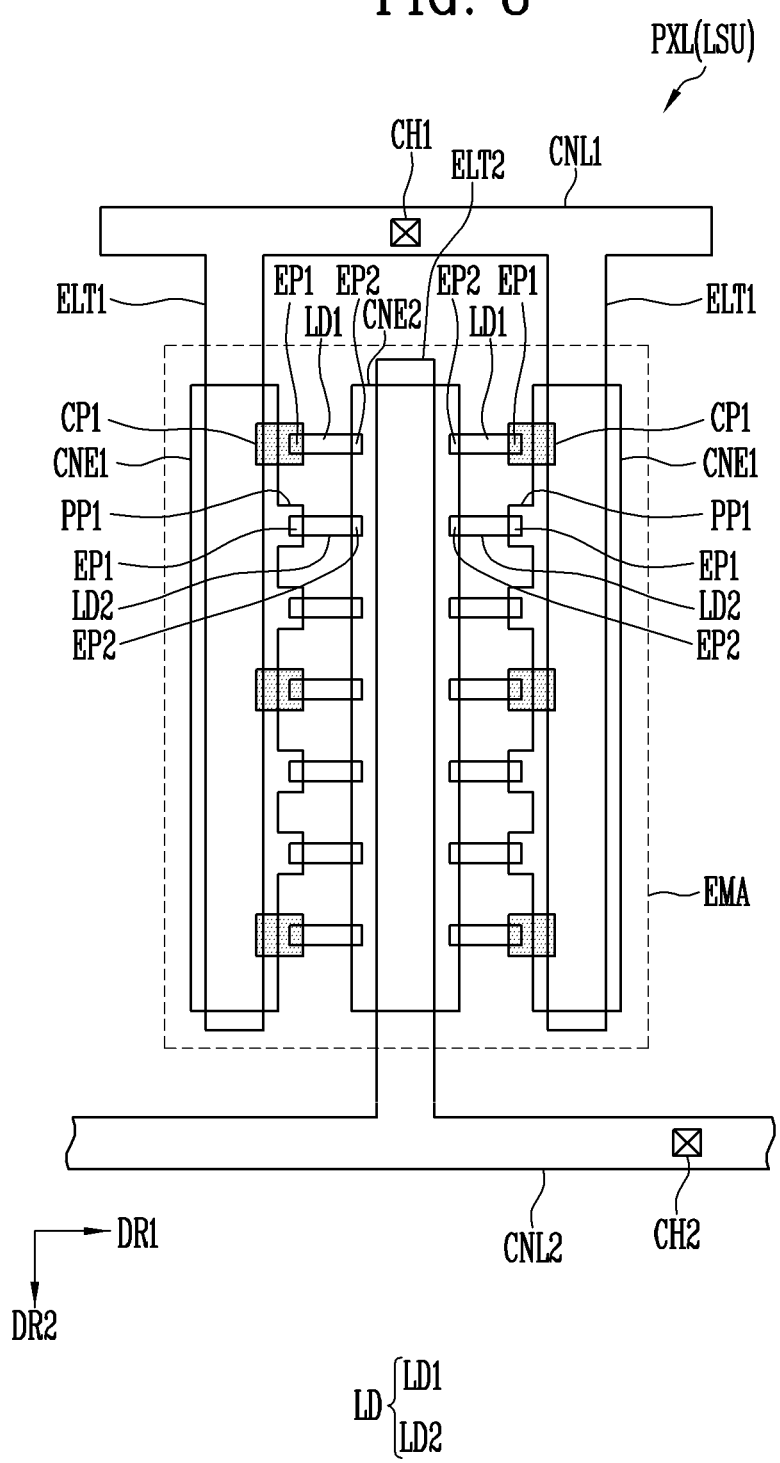

Referring to FIG. 8, the cycle and/or interval at which the first conductive patterns CP1 are disposed in an area between the first and second electrodes ELT1 and ELT2 may be changed. For example, the first conductive patterns CP1 and the first protrusions PP1 may be regularly arranged at a ratio of 1:2 in an area in which the respective first and second electrodes ELT1 and ELT2 face each other.

Figure 9:
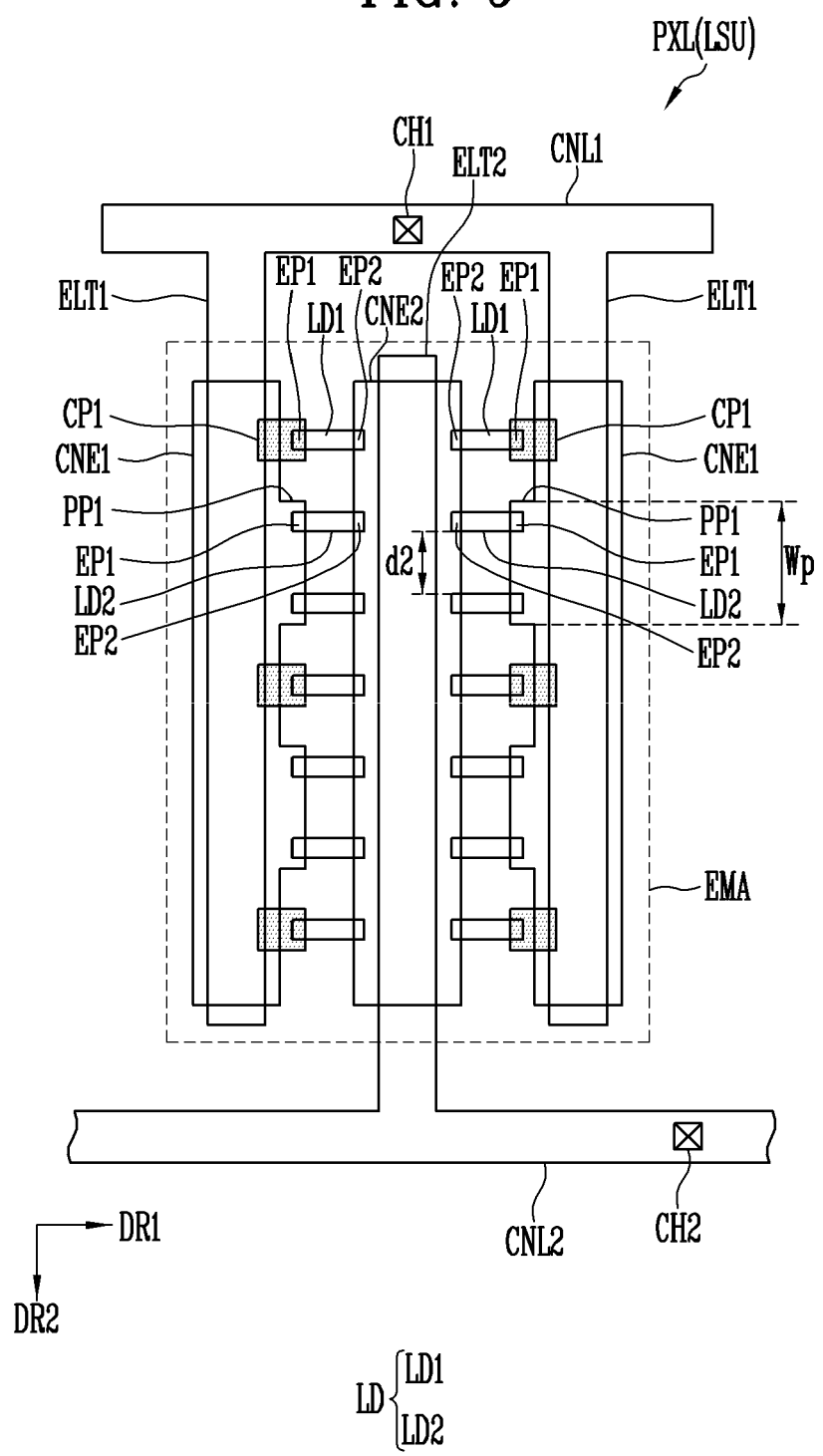

Referring to FIG. 9, each first protrusion PP1 may overlap with a plurality of second light emitting elements LD2. For example, the pixel PXL may include a plurality of second light emitting elements LD2 that are successively arranged between the first electrode ELT1 and the second electrode ELT2 along a direction (e.g., a second direction DR2) in which the first and second electrodes ELT1 and ELT2 extend. Each first protrusion PP1 may have a width Wp greater than a distance d2 between corresponding second light emitting elements LD2 that are successively arranged, and may overlap with the respective first ends EP1 of the second light emitting elements LD2 that are successively arranged. In other words, in an embodiment, the size of each first protrusion PP1 and the disposition relationship between the first protrusion PP1 and the second light emitting elements LD2 may be changed in various ways.

Figure 10:
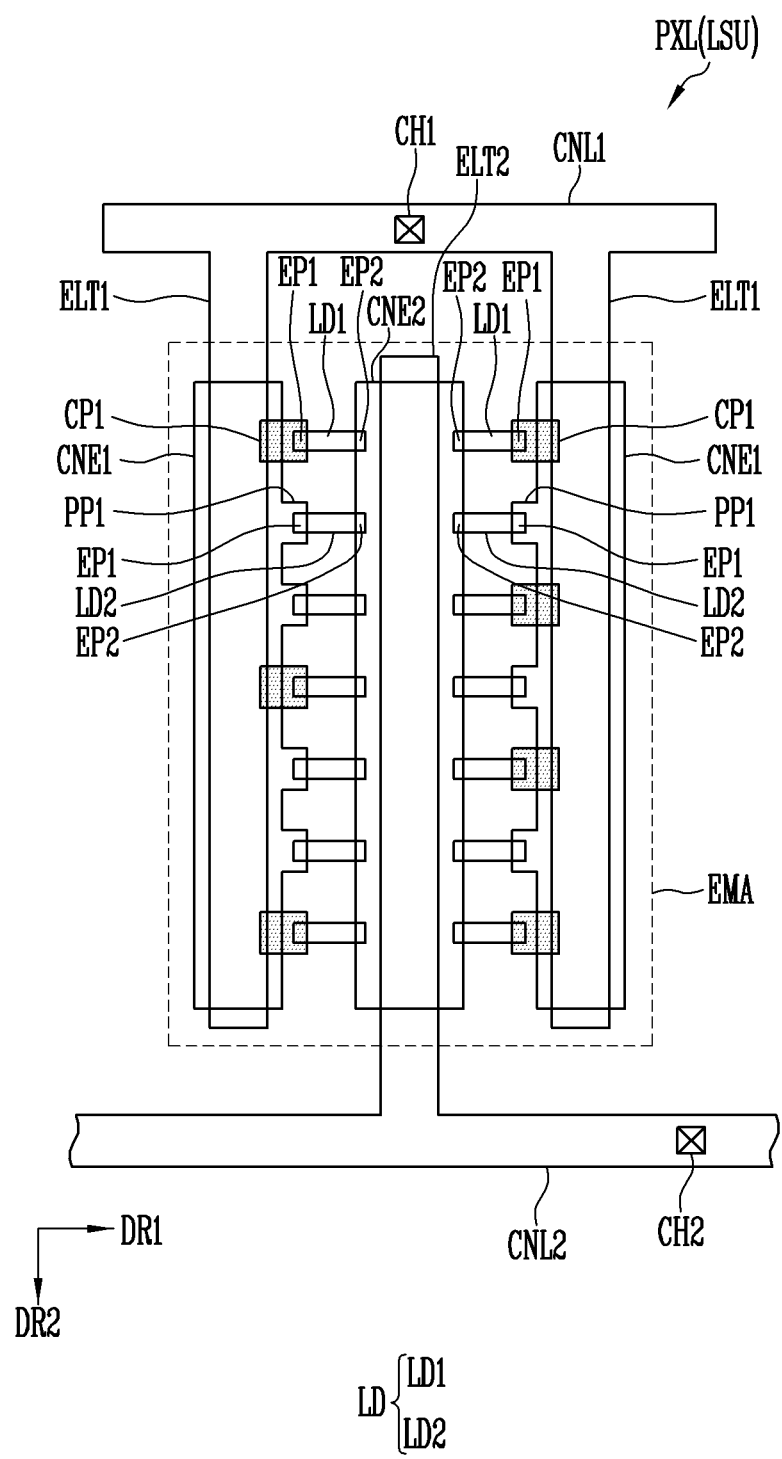
Figure 11:
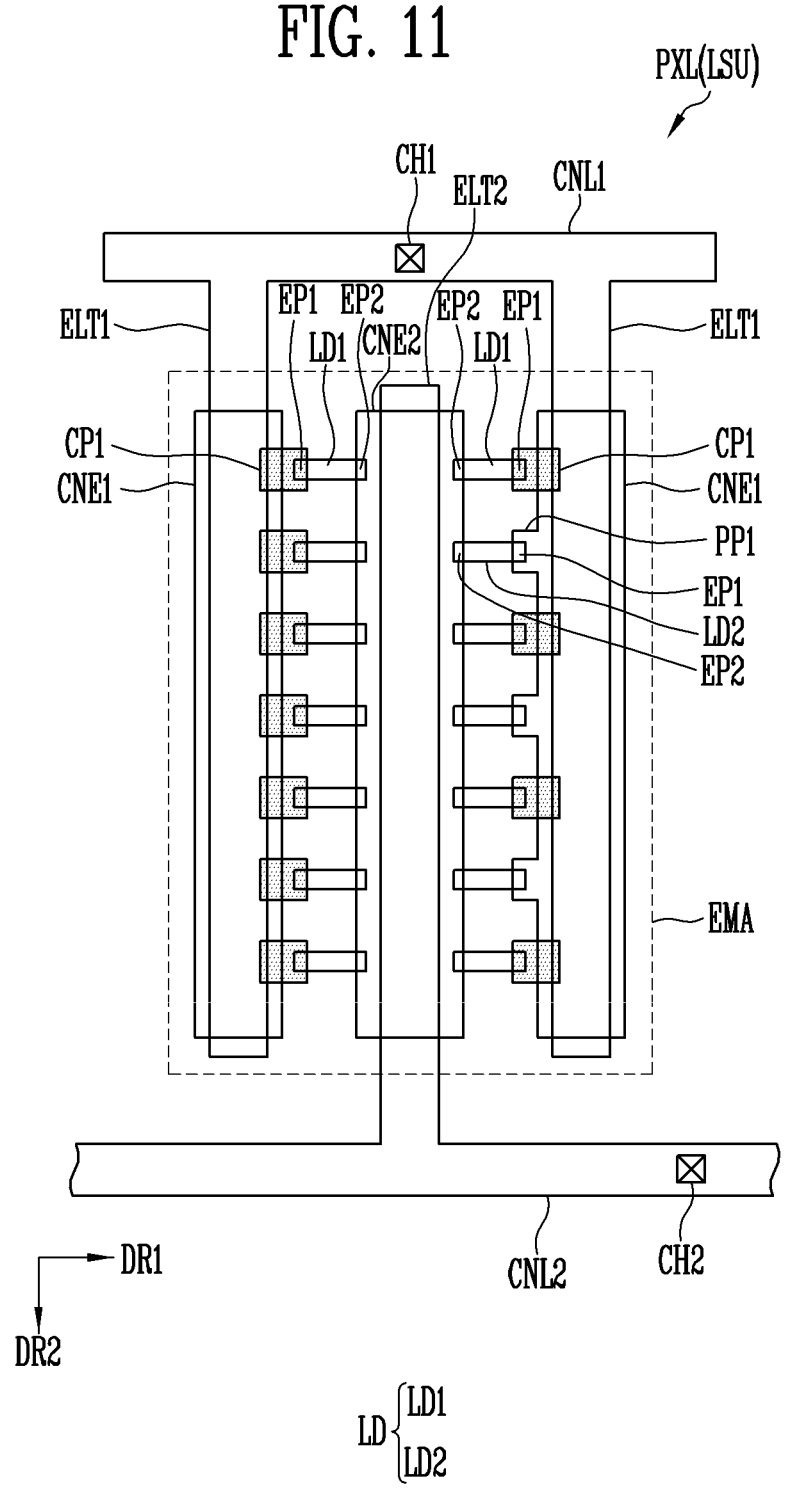

Referring to FIGS. 10 and 11, when a plurality of first electrodes ELT1 and/or a plurality of second electrodes ELT2 are disposed in the pixel PXL, a plurality of areas in each of which any one first electrode ELT1 and a second electrode ELT2 corresponding thereto face each other may differ from each other in disposition relationship of the first conductive patterns CP1 and/or the first protrusions PP1. For example, in an embodiment, as illustrated in FIG. 10, the first conductive patterns CP1 and the first protrusions PP1 may be repeatedly disposed at a ratio of 1:2 between the first electrode ELT1 disposed on one side (e.g., a left side) of the emission area EMA and the second electrode ELT2 adjacent to the first electrode ELT1. The first conductive patterns CP1 and the first protrusions PP1 may be alternately disposed at a ratio of 1:1 between the first electrode ELT1 disposed on the other side (e.g., a right side) of the emission area EMA and the second electrode ELT2 adjacent to the first electrode ELT1.

In an embodiment, as illustrated in FIG. 11, the first conductive patterns CP1 may be respectively disposed on the first ends EP1 of all of the valid light emitting elements LD (e.g., the first light emitting element LD1) arranged between the first electrode ELT1 disposed on one side (e.g., the left side) of the emission area EMA and the second electrode ELT2 adjacent to the first electrode ELT1. In this case, all of the light emitting elements LD disposed in the corresponding area (e.g., the left side area of the emission area EMA) may be the first light emitting elements LD1. The first electrode ELT1 and the first contact electrode CNE1 that are connected to the first light emitting elements LD1 may be electrically connected to the first ends EP1 of the first light emitting elements LD1 via the respective first conductive patterns CP1. The first conductive patterns CP1 and the first protrusions PP1 may be alternately disposed at a ratio (e.g., a set or predetermined ratio), e.g., a ratio of 1:1, between the first electrode ELT1 disposed on the other side (e.g., a right side) of the emission area EMA and the second electrode ELT2 adjacent to the first electrode ELT1. In this case, the first and second light emitting elements LD1 and LD2 may be alternately disposed in the corresponding area (e.g., the right side area of the emission area EMA).

Figure 12:
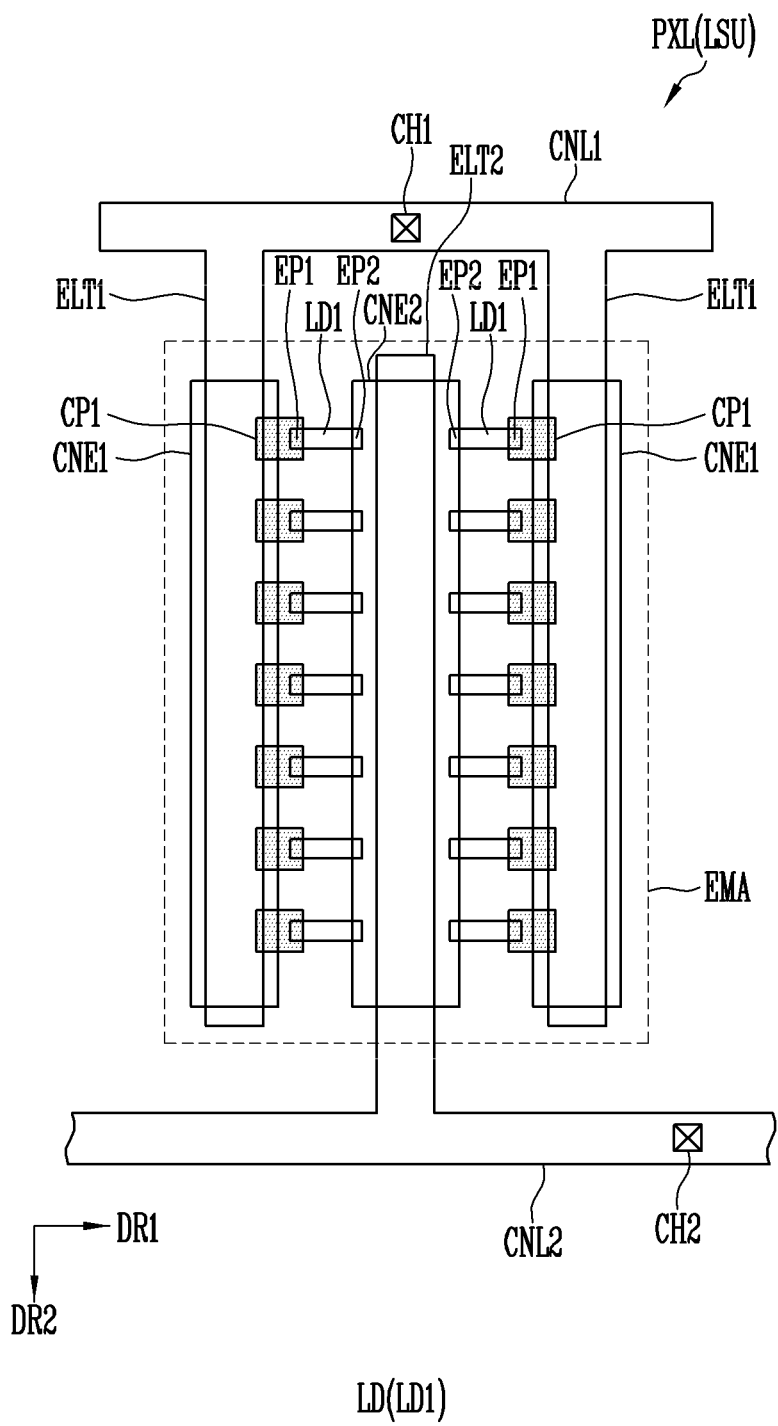

Referring to FIG. 12, the first conductive patterns CP1 may be respectively formed on the first ends EP1 of the light emitting elements LD (e.g., the first light emitting element LD1) disposed in each emission area EMA, e.g., all of the light emitting elements LD that are connected between the first and second electrodes ELT1 and ELT2 and form respective valid light sources. For example, the light source unit LSU of each pixel PXL may be formed of a plurality of first light emitting elements LD1 each having at least one end (e.g., the first end EP1) on which each corresponding conductive pattern (e.g., each corresponding first conductive pattern CP1) is disposed. In an embodiment, the first conductive patterns CP1 may be spaced from each other and individually formed. Hence, even if a short defect occurs on at least one of the first light emitting elements LD1, only the short-circuited first light emitting element LD1 may be selectively isolated from the first and/or second electrodes ELT1 and/or ELT2 (e.g., the first electrode ELT1).

Figure 13:
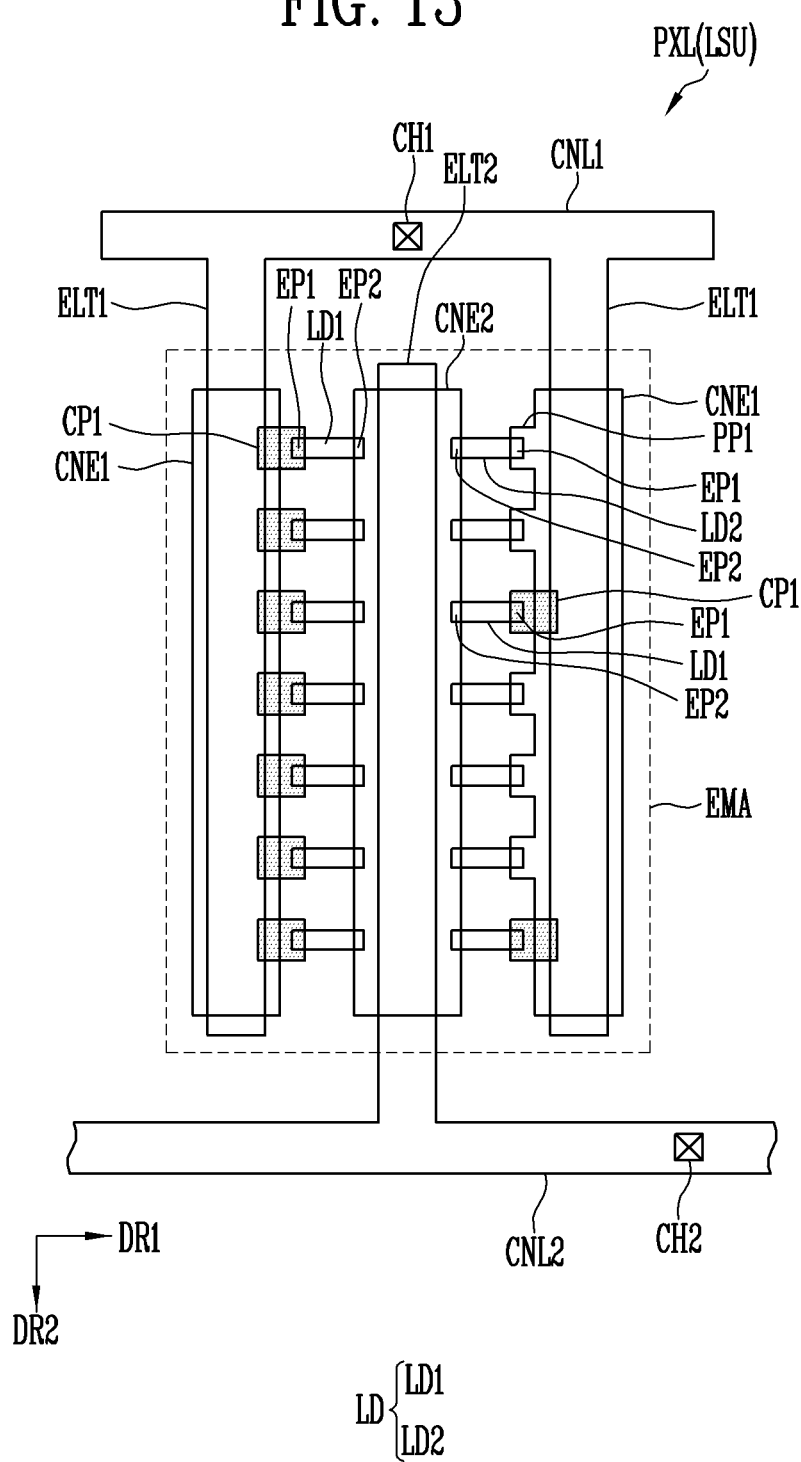
Figure 14:
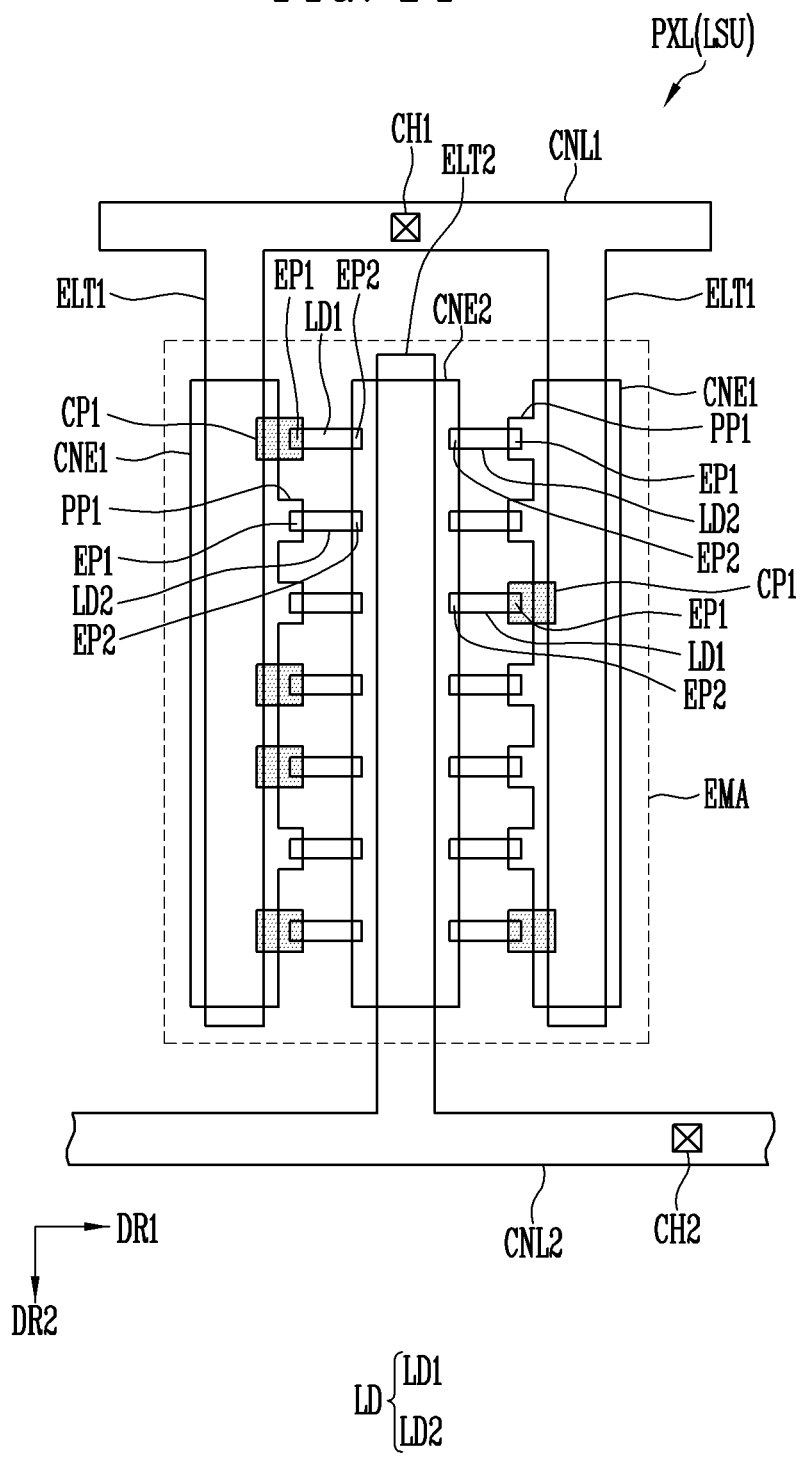

Referring to FIGS. 13 and 14, in at least one area of the emission area EMA, the first conductive patterns CP1 and/or the first protrusions PP1 may be irregularly dispersed (or arranged or located). For example, in an embodiment, as illustrated in FIG. 13, the first ends EP1 of the light emitting elements LD (e.g., the first light emitting element LD1) arranged between the first electrode ELT1 disposed on one side (e.g., the left side) of the emission area EMA and the second electrode ELT2 adjacent to the first electrode ELT1 may be connected to the first contact electrode CNE1 and the first electrode ELT1 through respective first conductive patterns CP1. Also, between the first electrode ELT1 disposed on the other side (e.g., a right side) of the emission area EMA and the second electrode ELT2 adjacent to the first electrode ELT1, a plurality of first conductive patterns CP1 and first protrusions PP1 may be irregularly dispersed and disposed on one edge of the first contact electrode CNE1 that overlaps with the first electrode ELT1.

In an embodiment, referring to FIG. 14, in the overall area of the emission area EMA, the first conductive patterns CP1 and/or the first protrusions PP1 may be irregularly dispersed (or arranged). For example, in each emission area EMA, the first conductive patterns CP1 and the first protrusions PP1 may be regularly or irregularly dispersed (or arranged) and disposed on one edge of each first contact electrode CNE1 in an extension direction of the first contact electrode CNE1 (e.g., in the second direction DR2).

Figure 15:
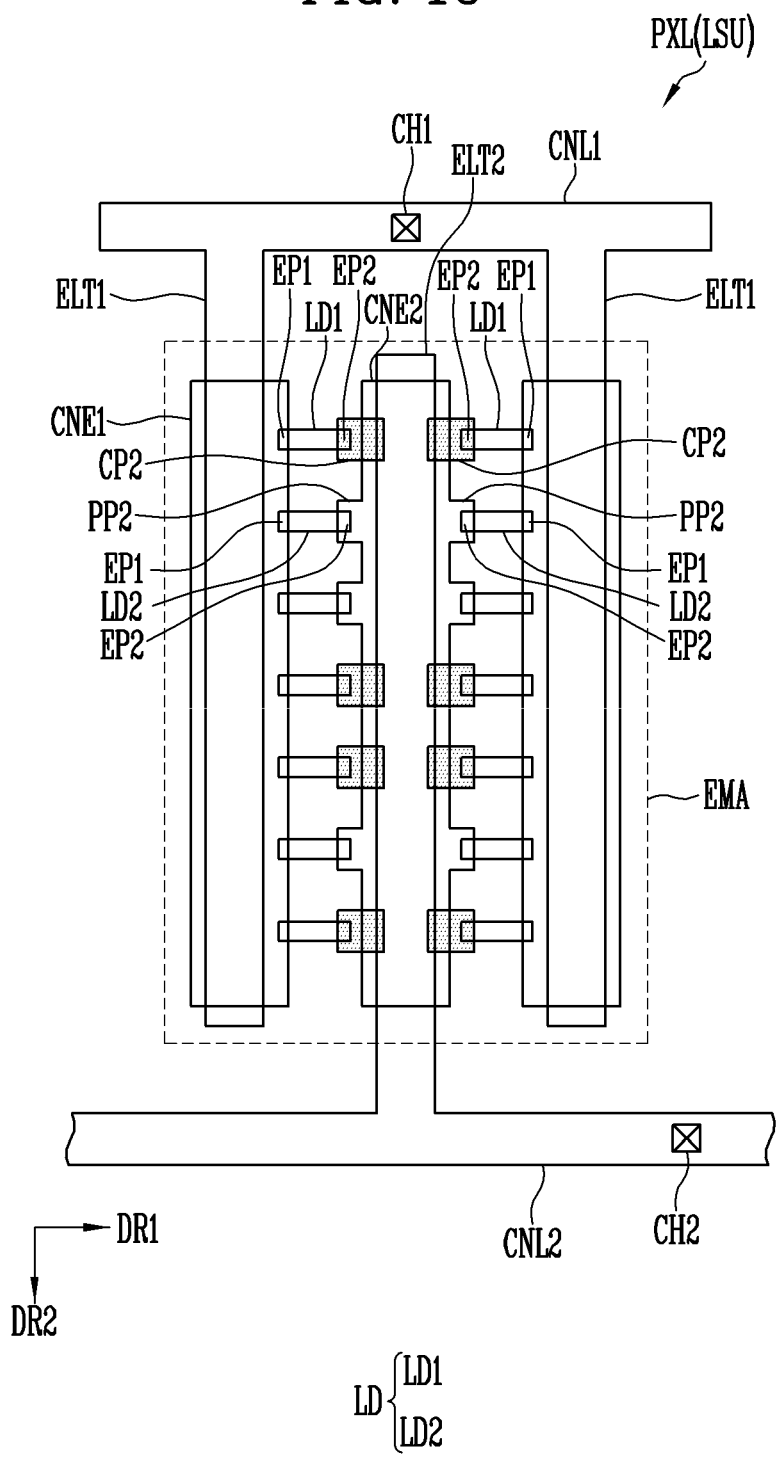

Referring to FIG. 15, the first end EP1 of each of a plurality of first light emitting elements LD1 may overlap with the corresponding first contact electrode CNE1 and thus may be electrically connected to the first contact electrode CNE1. Furthermore, the second end EP2 of each of the first light emitting elements LD1 may be electrically connected, through the corresponding second conductive pattern CP2, to the second contact electrode CNE2 corresponding to the second conductive pattern CP2 and be electrically connected to the second electrode ELT2 through the second contact electrode CNE2.

For example, the pixel PXL may include at least one second conductive pattern CP2 disposed between at least one first light emitting element LD1 disposed in the emission area EMA and the second contact electrode CNE2. In an embodiment, the second end EP2 of the first light emitting element LD1 may be spaced from the second contact electrode CNE2 adjacent to the second end EP2 and may be electrically connected to the second contact electrode CNE2 via the corresponding second conductive pattern CP2.

In an embodiment, each second conductive pattern CP2 may include at least one of various metal materials including silver (Ag), magnesium (Mg), aluminum (Al), platinum (Pt), palladium (Pd), gold (Au), nickel (Ni), neodymium (Nd), iridium (Ir), chrome (Cr), titanium (Ti), molybdenum (Mo), copper (Cu), etc., or an alloy thereof, or at least one of various transparent conductive materials including a silver nanowire (AgNW), indium tin oxide (ITO), indium zinc oxide (IZO), antimony zinc oxide (AZO), indium tin zinc oxide (ITZO), zinc oxide (ZnO), tin oxide ($SnO_2$), a carbon nanotube, graphene, etc. In some embodiments, each second conductive pattern CP2 may include, to have conductivity, at least one of various conductive materials that may be used to form an electrode or a line.

In an embodiment, each second conductive pattern CP2 may include the same conductive material as the constituent material of at least one of the first and second electrodes ELT1 and ELT2 and the first and second contact electrodes CNE1 and CNE2, or may include at least one conductive material that is not included in the foregoing electrodes. For example, the second conductive pattern CP2 may include at least one conductive material different from the constituent material of the second contact electrode CNE2.

In an embodiment, the second conductive pattern CP2 may include a low melting conductive material having a melting point lower than that of the second contact electrode CNE2. For example, the second conductive pattern CP2 may include at least one of low melting conductive materials described above as the constituent material of the first conductive pattern CP1. In this case, the second conductive pattern CP2 may be easily disconnected by applying heat to the second conductive pattern CP2, e.g., through a scheme of applying a laser beam or a voltage (e.g., a set or predetermined voltage) to the second conductive pattern CP2. In an embodiment, the second conductive pattern CP2 may be formed of the same conductive material as that of the first conductive pattern CP1, but the present disclosure is not limited thereto.

The second conductive pattern CP2 may include transparent electrode material, be formed to be thin with a limited thickness, or be formed in a mesh shape with a plurality of openings, so as to secure a transmittance within a range (e.g., a set or predetermined range) in a manner similar to the of the first conductive pattern CP1. Furthermore, the second conductive pattern CP2 may have a single layer structure or a multi-layer structure, and the shape or the cross-sectional structure of the second conductive pattern CP2 is not particularly limited.

In an embodiment, the second contact electrode CNE2 may include at least one second protrusion PP2 that protrudes toward at least one second light emitting element LD2 to overlap with the second end EP2 of the second light emitting element LD2. The second end EP2 of the second light emitting element LD2 may be directly connected to the second contact electrode CNE2 and may be electrically connected to the second electrode ELT2 through the second contact electrode CNE2.

Figure 16:
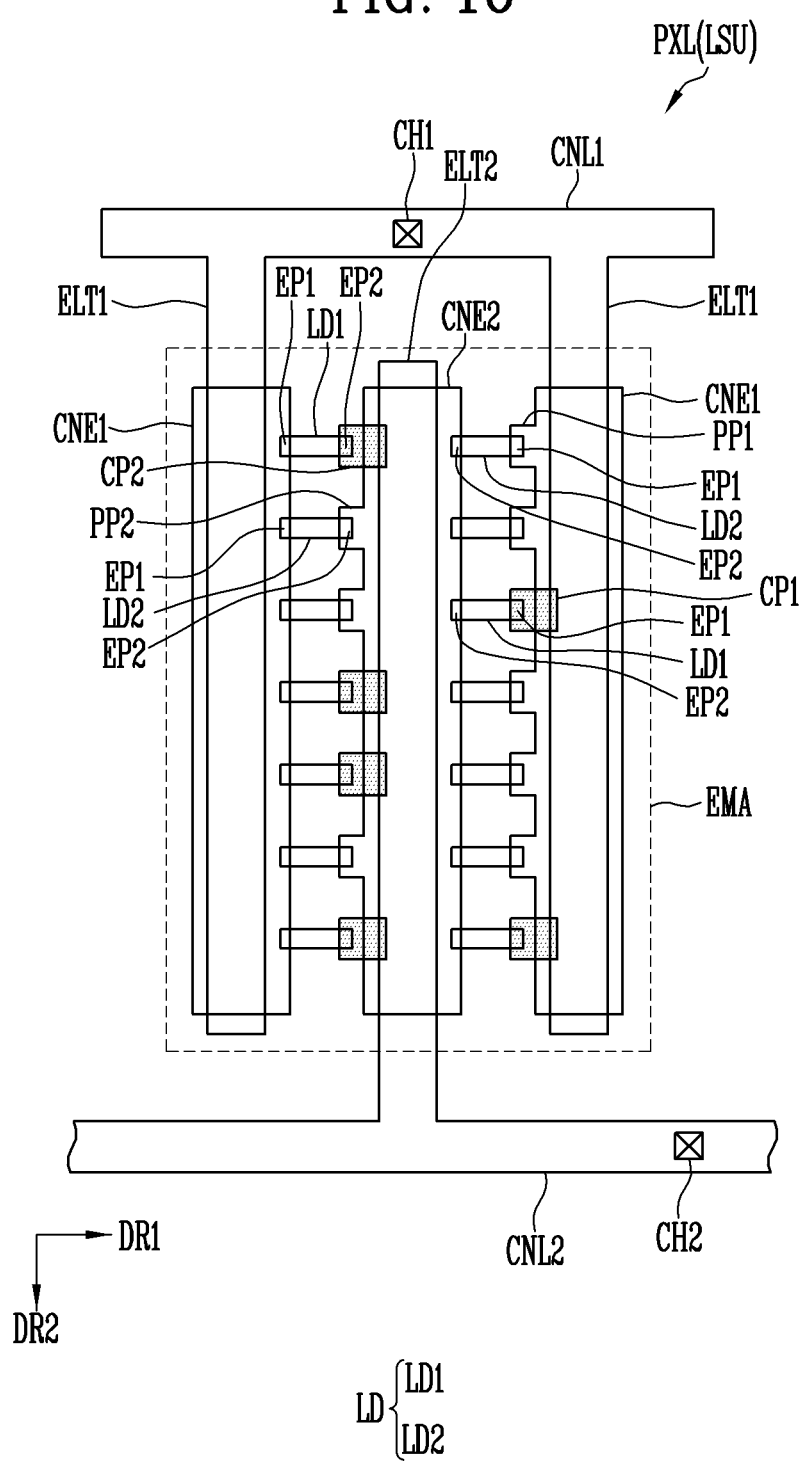

Referring to FIG. 16, in one area (e.g., the left side area) of the emission area EMA, the second end EP2 of at least one first light emitting element LD1 may be electrically connected to the second contact electrode CNE2 and the second electrode ELT2 via each corresponding second conductive pattern CP2. The second end EP2 of at least one second light emitting element LD2 may overlap with the second contact electrode CNE2 by the second protrusion PP2 formed on the second contact electrode CNE2 and thus may be electrically connected to the second contact electrode CNE2 and the second electrode ELT2. Furthermore, in the corresponding area, the first ends EP1 of the first and second light emitting elements LD1 and LD2 may overlap with the first contact electrode CNE1 and be electrically connected to the first contact electrode CNE1 and the first electrode ELT1.

In the other area (e.g., the right side area) of the emission area EMA, the first end EP1 of at least one first light emitting element LD1 may be electrically connected to the first contact electrode CNE1 and the first electrode ELT1 via each corresponding first conductive pattern CP1. The first end EP1 of at least one second light emitting element LD2 may overlap with the first contact electrode CNE1 by the first protrusion PP1 formed on the first contact electrode CNE1 and thus may be electrically connected to the first contact electrode CNE1 and the first electrode ELT1. Furthermore, in the corresponding area, the second ends EP2 of the first and second light emitting elements LD1 and LD2 may overlap with the second contact electrode CNE2 and may be electrically connected to the second contact electrode CNE2 and the second electrode ELT2.

Figure 17:
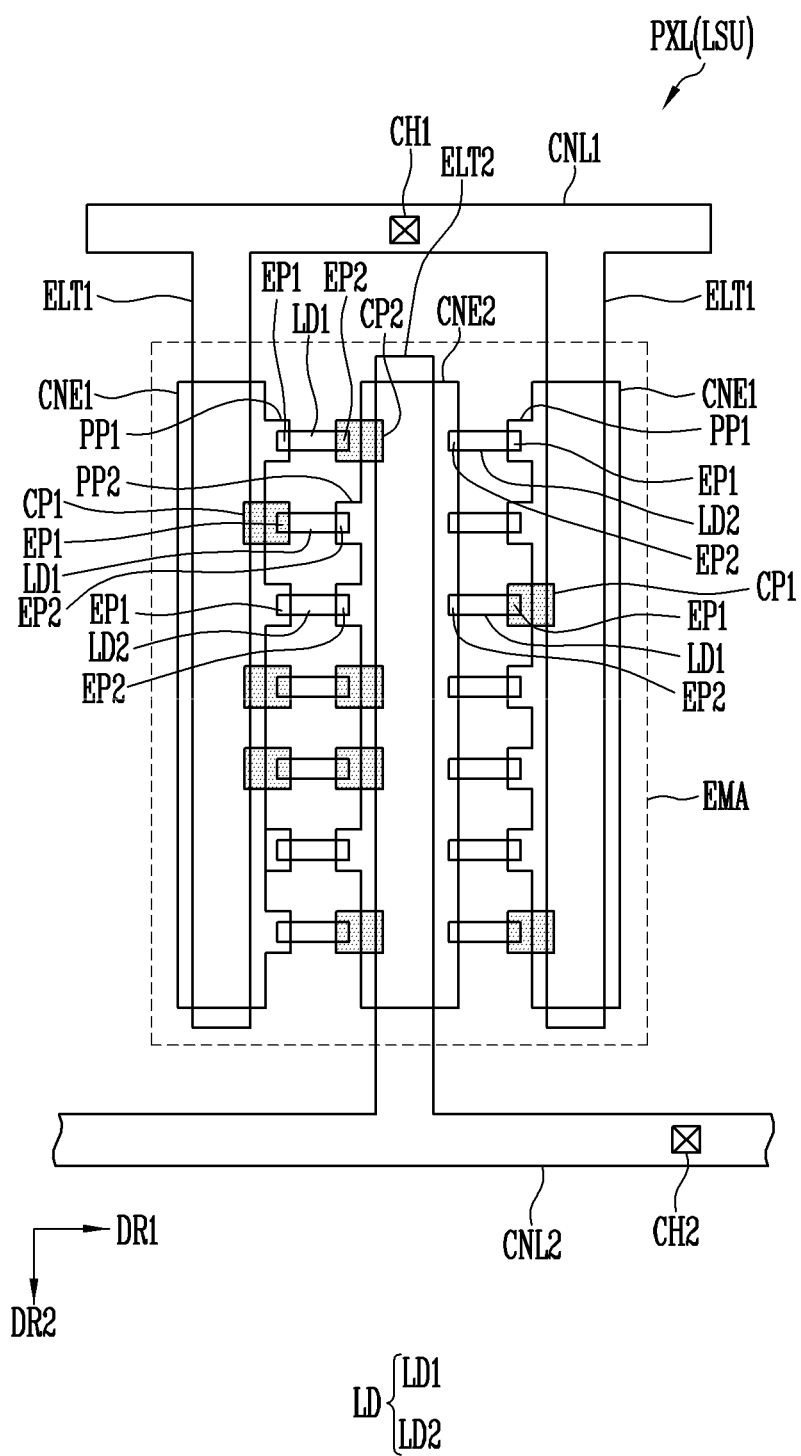

Referring to FIG. 17, at least one first light emitting element LD1 may be electrically connected to the first or second contact electrode CNE1 or CNE2 via the first or second conductive pattern CP1 or CP2 disposed on the first or second end EP1 or EP2, and may be electrically connected to the first or second electrode ELT1 or ELT2 through the first or second contact electrode CNE1 or CNE2. At least another first light emitting element LD1 may be electrically connected to the first and second contact electrodes CNE1 and CNE2 via the first and second conductive patterns CP1 and CP2 disposed on the first and second ends EP1 and EP2, and be electrically connected to the first and second electrodes ELT1 and ELT2 through the first and second contact electrode CNE1 and CNE2. In an embodiment, the first and second conductive patterns CP1 and CP2 may include the same conductive material, or each may include at least one conductive material different from that of the other. In the case where the first and second conductive patterns CP1 and CP2 are formed of the same material, the first and second conductive patterns CP1 and CP2 may be concurrently formed (e.g., simultaneously formed) through the same process, but the present disclosure is not limited thereto.

Furthermore, at least one second light emitting element LD2 may be electrically connected to the first or second contact electrode CNE1 or CNE2 via the first or second protrusion PP1 or PP2 of the first or second contact electrode CNE1 or CNE2 disposed on the first or second end EP1 or EP2, and may be electrically connected to the first or second electrode ELT1 or ELT2 through the first or second contact electrode CNE1 or CNE2. At least another second light emitting element LD2 may be electrically connected to the first and second contact electrodes CNE1 and CNE2 through the first and second protrusions PP1 and PP2 of the first and second contact electrodes CNE1 and CNE2 respectively disposed on the first and second ends EP1 and EP2, and may be electrically connected to the first and second electrodes ELT1 and ELT2 through the first and second contact electrodes CNE1 and CNE2.

Figure 18:
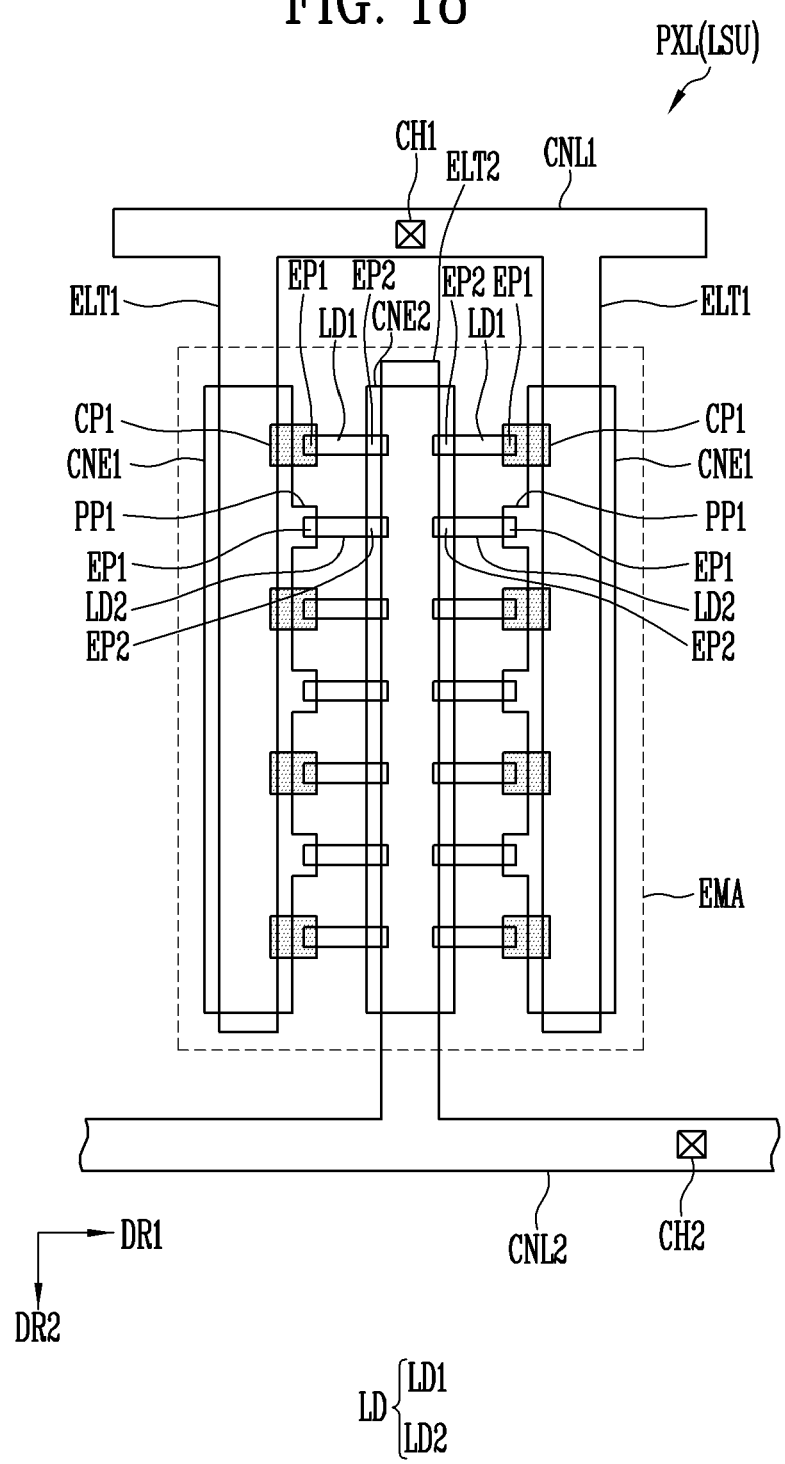

Referring to FIG. 18, the light emitting elements LD may be disposed to overlap with at least one electrode of the first and second electrodes ELT1 and ELT2. For example, the second ends EP2 of the light emitting elements LD may be formed to overlap with the second electrode ELT2 and the second contact electrode CNE2.

Figure 19:
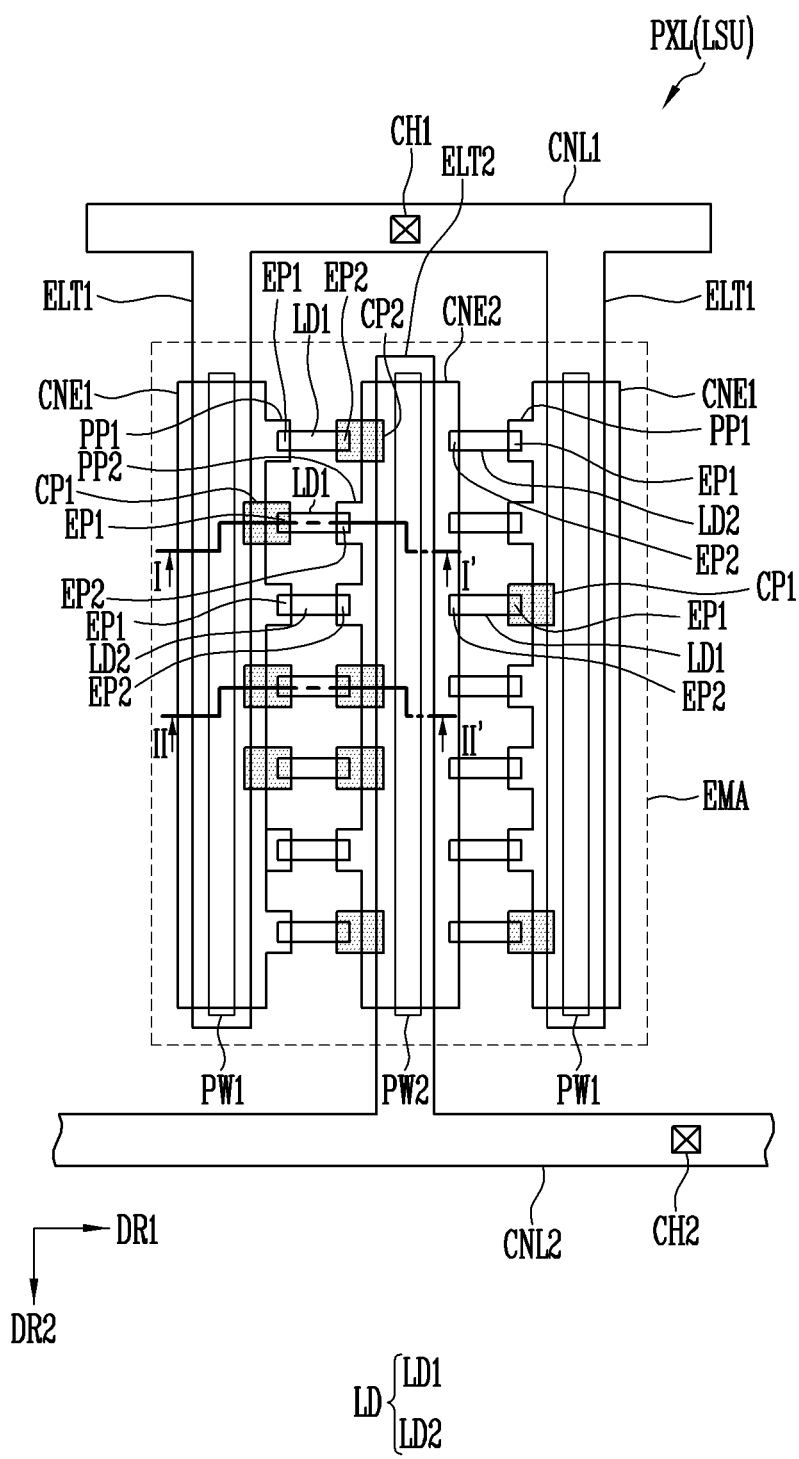

Referring to FIG. 19, the pixel PXL may further include at least one first partition wall PW1 (or referred to as "first wall", "first bank" or "first pattern") that overlaps with each first electrode ELT1, and a second partition wall PW2 (or referred to as "second wall", "second bank" or "second pattern") that overlaps with each second electrode ELT2. In an embodiment, the first partition wall PW1 and the second partition wall PW2 may be respectively disposed under the first electrode ELT1 and the second electrode ELT2. For example, in each emission area EMA, the first and second partition walls PW1 and PW2 may be respectively disposed under the first and second electrodes ELT1 and ELT2. In addition, the first and second contact electrodes CNE1 and CNE2 may be respectively disposed over the first and second electrodes ELT1 and ELT2.

In an embodiment, the first partition wall PW1 may have a width less than that of each first electrode ELT1 and may be disposed under the first electrode ELT1. For example, the first partition wall PW1 may have a shape corresponding to the first electrode ELT1 and may be disposed inside the first electrode ELT1, in a plan view.

If the first partition wall PW1 is disposed under the first electrode ELT1, the first electrode ELT1 may protrude upward in the area in which the first partition wall PW1 is disposed. Therefore, light emitted from the first ends EP1 of the light emitting elements LD that face the first electrode ELT1 may be controlled to more effectively travel in the frontal direction of the display device.

In an embodiment, the second partition wall PW2 may have a width less than that of each second electrode ELT2 and may be disposed under the second electrode ELT2. For example, the second partition wall PW2 may have a shape corresponding to the second electrode ELT2 and may be disposed inside the second electrode ELT2, in a plan view.

If the second partition wall PW2 is disposed under the second electrode ELT2, the second electrode ELT2 may protrude upward in the area in which the second partition wall PW2 is disposed. Therefore, light emitted from the second ends EP2 of the light emitting elements LD that face the second electrode ELT2 may be controlled to more effectively travel in the frontal direction of the display device.

Figure 20:
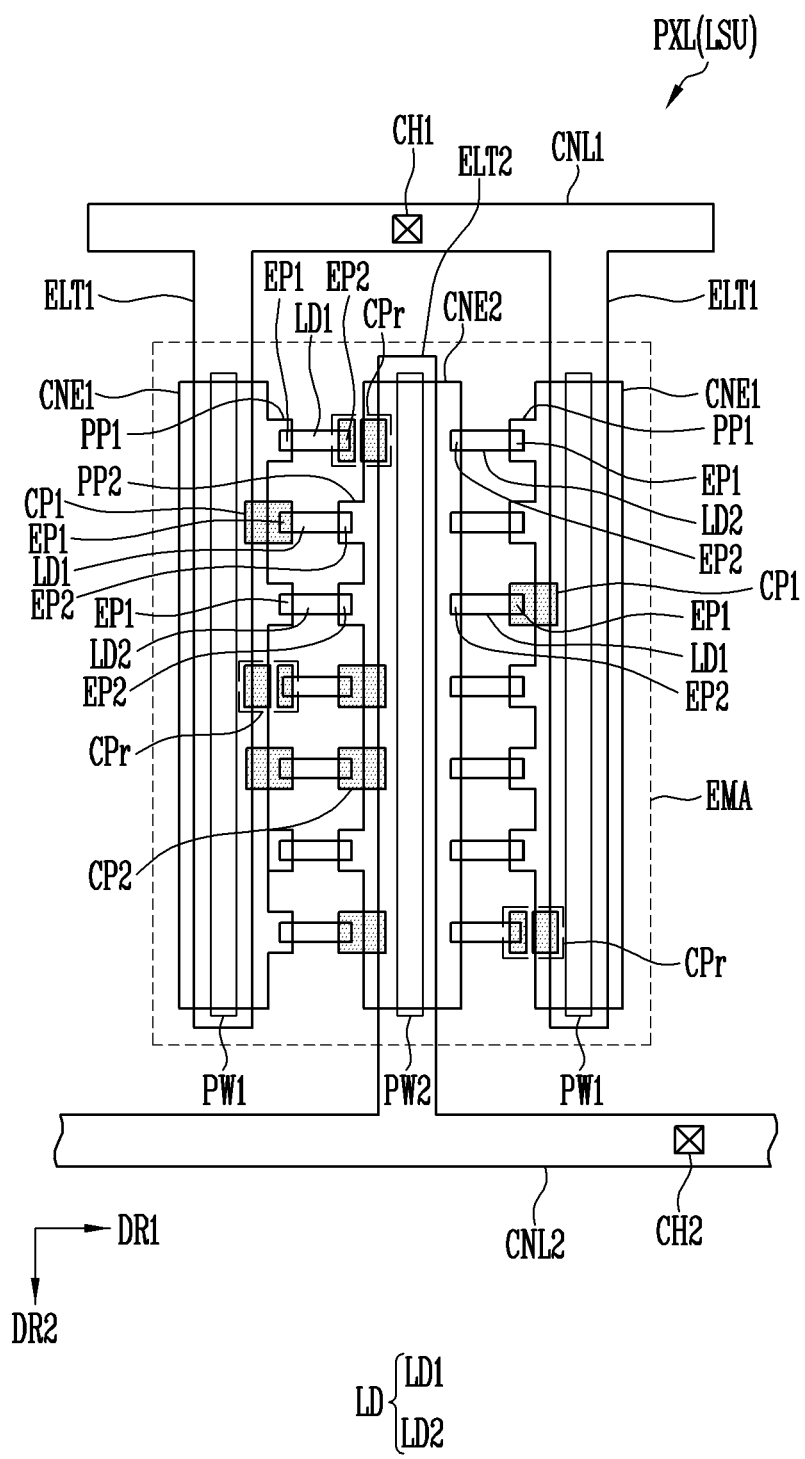

Referring to FIG. 20, at least one pixel PXL disposed in the display area DA may include first conductive patterns CP1 disposed at positions spaced from each other on the respective first ends EP1 of a plurality of first light emitting elements LD1, and/or second conductive patterns CP2 disposed at positions spaced from each other on the respective second ends EP2 of the first light emitting elements LD1. At least one of the first and/or second conductive patterns CP1 and/or CP2 may be disconnected between the first or second end EP1 or EP2 of the corresponding first light emitting element LD1 and the first or second contact electrode CNE1 or CNE2 corresponding to the first or second end EP1 or EP2. Hereinafter, each disconnected conductive pattern will be referred to as "disconnected pattern CPr".

For example, if a short defect occurs on at least one first light emitting element LD1, the first and/or second conductive patterns CP1 and/or CP2 may be disconnected by applying heat to the first and/or second conductive patterns CP1 and/or CP2 connected to the short-circuited first light emitting element LD1. Hence, the defect-repaired pixel PXL may include at least one disconnected pattern CPr that is disconnected between at least one first light emitting element LD1 and the first or second contact electrode CNE1 or CNE2.

As described in the foregoing embodiments, the pixel PXL may have various structures. For example, at least one pixel PXL disposed in the display area DA may have a structure to which one embodiment of the embodiments of FIGS. 7-20 is applied, or a structure to which at least two embodiments of the foregoing embodiments are applied in combination.

For example, the pixel PXL and the display device including the same in accordance with an embodiment of the present disclosure may include at least one first and/or second conductive pattern CP1 and/or CP2 provided between at least one light emitting element LD disposed in the emission area EMA and the first or second contact electrode CNE1 or CNE2 and configured to electrically connect one end of the light emitting element LD to the first or second contact electrode CNE1 or CNE2. For example, each pixel PXL may include a plurality of first and/or second conductive patterns CP1 and/or CP2 disposed on respective one ends of a plurality of light emitting elements LD. In accordance with the pixel PXL and the display device including the same, a pixel defect due to a short-circuit defect or the like of a light emitting element LD may be more efficiently repaired.

FIGS. 21A-21D are plan views respectively illustrating examples of a conductive pattern CP in accordance with an embodiment of the present disclosure. In an embodiment, each of the conductive patterns CP illustrated in FIGS. 21A-21D may be any one of the first and second conductive patterns CP1 and CP2 in accordance with the embodiments of FIGS. 7-20. Furthermore, the first and second conductive patterns CP1 and CP2 may have structures that are substantially identical or similar to each other, but the present disclosure is not limited thereto.

Figure 21A:
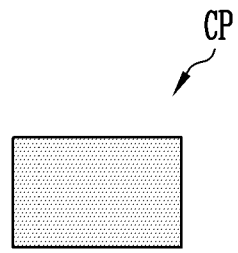
FIGS. 21A-21D are plan views respectively illustrating examples of a conductive pattern in accordance with an embodiment of the present disclosure.

Referring to FIG. 21A, each conductive pattern CP may have a rectangular shape in a plan view, and may have other polygonal shapes. In an embodiment, each conductive pattern CP may have a circular shape or an elliptical shape, or a combination of a circular shape and a polygonal shape. In other words, the shape of the conductive pattern CP may be changed in various ways.

Figure 21B:
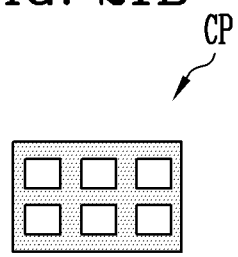

Referring to FIG. 21B, each conductive pattern CP may have a mesh shape. For example, each conductive pattern CP may include a plurality of openings. In an embodiment, each opening may have a rectangular shape, but the present disclosure is not limited thereto. That is, the mesh shape may be changed to various other shapes.

Figure 21C:
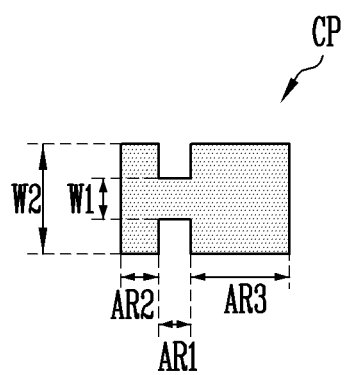

Referring to FIG. 21C, each conductive pattern CP may include a plurality of areas having different widths. For example, each conductive pattern CP may include a first area AR1 having a first width W1, and a second area AR2 and a third area AR3 that are respectively disposed on opposite sides of the first area AR1 and each of which has a second width W2 greater than the first width W1. In an embodiment, the second and third areas AR2 and AR3 may have the same width, but the present disclosure is not limited thereto.

In an embodiment, each conductive pattern CP may overlap with one end of the light emitting element LD and any one contact electrode corresponding to the one end of the light emitting element LD, in the second and third areas AR2 and AR3. The conductive pattern CP may be disconnected from the first area AR1 when a short-circuit defect occurs on the first light emitting element LD1 connected to the conductive pattern CP. In other words, the first area AR1 may be an area disposed between each first light emitting element LD1 and any one contact electrode, and the width thereof may be relatively small. Hence, even if a short-circuit defect or the like occurs on at least one first light emitting element LD1, a pixel defect resulting therefrom may be easily repaired.

Figure 21D:
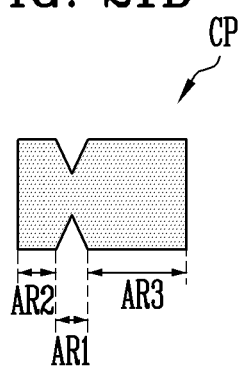

Referring to FIG. 21D, each conductive pattern CP may have a shape that gradually varies in width in at least one area. For example, each conductive pattern CP may have in the first area AR1 a shape in which the width thereof is gradually reduced toward the center.

Figure 22A:
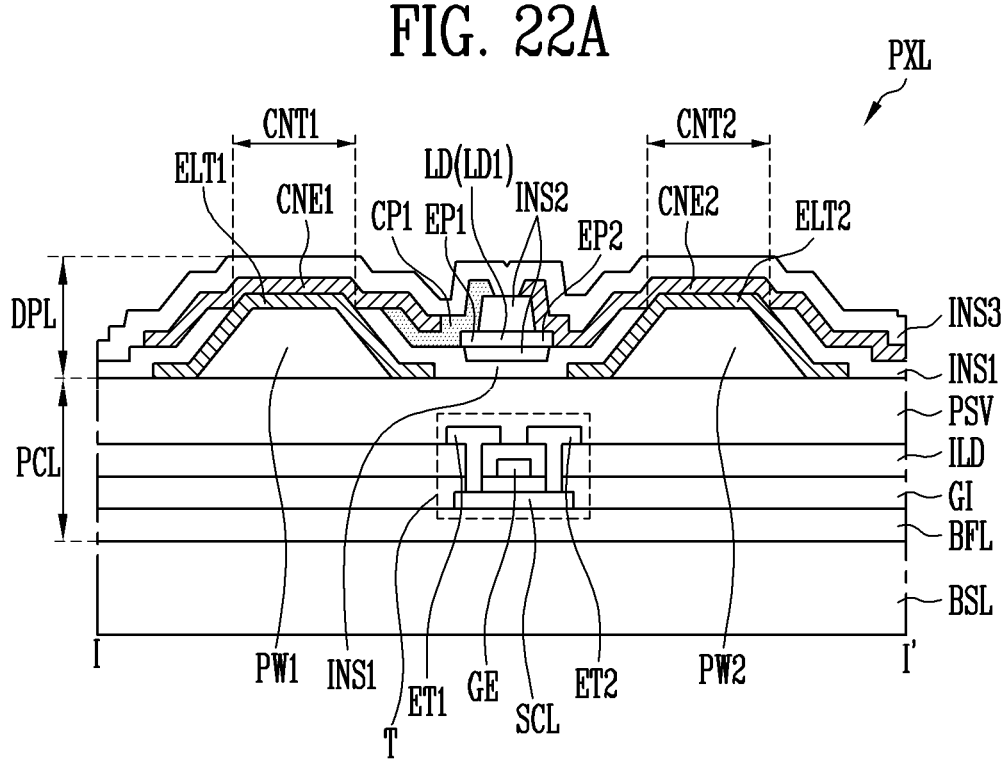
FIGS. 22A and 22B are sectional views illustrating a pixel in accordance with an embodiment of the present disclosure and, for example, illustrate embodiments of a cross-section of the pixel corresponding to the lines I-I' and II-II' of FIG. 19.
Figure 22B:
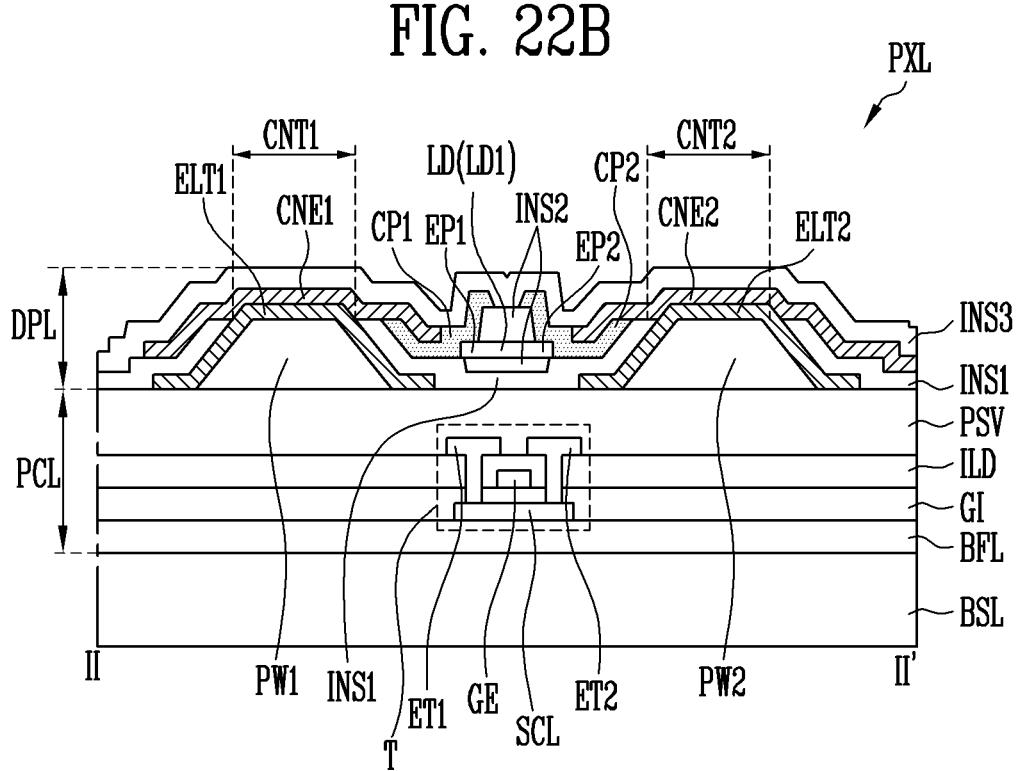

FIGS. 22A and 22B are sectional views illustrating a pixel PXL in accordance with an embodiment of the present disclosure and, for example, illustrate embodiments for a cross-section of the pixel PXL corresponding to the lines I-I' and II-II' of FIG. 19. In the description of the embodiment of FIGS. 22A-22B, like reference numerals will be used to designate components similar or equal to those of the previous embodiments, and detailed explanation thereof will be omitted.

Referring to FIGS. 22A and 22B along with FIGS. 5-20, the pixel PXL in accordance with an embodiment of the present disclosure may include a display element layer DPL disposed on one surface of the base layer BSL and including a plurality of light emitting elements LD. Furthermore, the pixel PXL may selectively further include a pixel circuit layer PCL. For example, the pixel PXL may further include a pixel circuit layer PCL disposed between the base layer BSL and the display element layer DPL and including at least one circuit element electrically connected to the light emitting elements LD.

In an embodiment, the pixel circuit layer PCL may include at least one circuit element that forms a pixel circuit PXC. For example, the pixel circuit layer PCL may include a plurality of transistors T and a storage capacitor Cst that form the pixel circuit PXC, and further include at least one power line and/or a signal line that is connected to the pixel circuit PXC and/or the light source unit LSU. Here, in the case where the pixel circuit PXC is omitted and the light source unit LSU is directly connected to the first and second power lines PL1 and PL2 (or signal lines or set or predetermined signal lines), the pixel circuit layer PCL may be omitted. For the sake of explanation, FIGS. 22A and 22B representatively illustrate only any one transistor T from among the circuit elements and the lines that are disposed in the pixel circuit layer PCL.

Furthermore, pixel circuit layer PCL may include a plurality of insulating layers disposed between respective electrodes and/or lines. In an embodiment, the pixel circuit layer PCL may include a buffer layer BFL, a gate insulating layer GI, an interlayer insulating layer ILD, and a passivation layer PSV that are successively stacked on one surface of the base layer BSL. The pixel circuit layer PCL may selectively further include at least one light shielding pattern disposed under at least some transistors.

The buffer layer BFL may prevent impurities from diffusing into each circuit element. The buffer layer BFL may be formed of a single layer, or may be formed of multiple layers having double or more layers. In the case where the buffer layer BFL has a multi-layer structure, the respective layers may be formed of the same material or different materials. In an embodiment, the buffer layer BFL may be omitted.

In an embodiment, each transistor T may include a semiconductor layer SCL, a gate electrode GE, and first and second transistor electrodes ET1 and ET2. In an embodiment, although FIGS. 22A and 22B illustrate an embodiment in which each transistor T includes the first and second transistor electrodes ET1 and ET2 that are formed separately from the semiconductor layer SCL, the present disclosure is not limited thereto. For example, in an embodiment, the first and/or second transistor electrode ET1 and/or ET2 provided in at least one transistor T disposed in each pixel area may be integrally formed with the corresponding semiconductor layer SCL.

The semiconductor layer SCL may be disposed on the buffer layer BFL. For example, the semiconductor layer SCL may be disposed between the gate insulating layer GI and the base layer BSL on which the buffer layer BFL is formed. The semiconductor layer SCL may include a first area that comes into contact with each first transistor electrode ET1, a second area that comes into contact with each second transistor electrode ET2, and a channel area disposed between the first and second areas. In an embodiment, one of the first and second areas may be a source area, and the other one may be a drain area.

In an embodiment, the semiconductor layer SCL may be a semiconductor pattern formed of polysilicon, amorphous silicon, an oxide semiconductor, etc. The channel area of the semiconductor layer SCL may be an intrinsic semiconductor, which is an undoped semiconductor pattern. Each of the first and second areas of the semiconductor layer SCL may be a semiconductor pattern doped with an impurity (e.g., a set or predetermined impurity).

The gate electrode GE may be disposed on the semiconductor layer SCL with the gate insulating layer GI interposed therebetween. For example, the gate electrode GE may be disposed between the gate insulating layer GI and the interlayer insulating layer ILD and overlap at least one area of the semiconductor layer SCL.

The first and second transistor electrodes ET1 and ET2 may be disposed over the corresponding semiconductor layer SCL and the corresponding gate electrode GE with at least one interlayer insulating layer ILD interposed therebetween. For example, the first and second transistor electrodes ET1 and ET2 may be disposed between the interlayer insulating layer ILD and the passivation layer PSV. The first and second transistor electrodes ET1 and ET2 may be electrically connected to the corresponding semiconductor layer SCL of the corresponding transistor. For example, the first and second transistor electrodes ET1 and ET2 may be connected to the first and second areas of the corresponding semiconductor layer SCL of the corresponding transistor through corresponding contact holes that pass through the gate insulating layer GI and the interlayer insulating layer ILD.

At least one transistor T provided in the pixel circuit PXC may be connected to any one pixel electrode. For example, any one of the first and second transistor electrodes ET1 and ET2 of the first transistor T1 illustrated in FIGS. 6A and 6B may be electrically connected to the first electrode ELT1 and/or the first connection electrode CNL1 of the light source unit LSU disposed over the passivation layer PSV, through a contact hole (e.g., the first contact hole CH1 of FIGS. 7-20) passing through the passivation layer PSV.

In an embodiment, at least one signal line and/or power line that is connected to each pixel PXL may be disposed on a layer identical with that of one electrode of each of the circuit elements that form the pixel circuit PXC. For example, the second power line PL2 for supplying voltage of the second power supply VSS may be disposed at the same layer as that of the gate electrodes GE of the transistors T and may be electrically connected to the second electrode ELT2 and/or the second connection electrode CNL2 of the light source unit LSU disposed over the passivation layer PSV through at least one bridge pattern and/or the contact hole (e.g., the second contact hole CH2 of FIGS. 7-20). However, the structures and/or positions of the second power line PL2, etc. may be changed in various ways.

In an embodiment, the display element layer DPL may include a light source unit LSU of each of the pixels PXL. For example, the display element layer DPL may include at least one pair of first and second electrodes ELT1 and ELT2, and a plurality of light emitting elements LD electrically connected between the first and second electrodes ELT1 and ELT2. In some embodiments, the display element layer DPL may further include, e.g., at least one conductive layer and/or insulating layer.

In an embodiment, the display element layer DPL may include first and second partition walls PW1 and PW2, first and second electrodes ELT1 and ELT2, a first insulating layer INS1, light emitting elements LD, a second insulating layer INS2, first and/or second conductive patterns CP1 and/or CP2, first and second contact electrodes CNE1 and CNE2, and a third insulating layer INS3, that are successively disposed and/or formed over the base layer BSL and/or the pixel circuit layer PCL. The positions of the first and/or second conductive patterns CP1 and/or CP2 may be changed in various ways depending on embodiments. For example, in an embodiment, the first and/or second conductive patterns CP1 and/or CP2 may be respectively disposed under the first or second contact electrodes CNE1 or CNE2. In an embodiment, the first and/or second conductive patterns CP1 and/or CP2 may be respectively disposed over the first or second contact electrodes CNE1 or CNE2.

The first and second partition walls PW1 and PW2 may be disposed at positions spaced from each other in each emission area EMA. The first and second partition walls PW1 and PW2 may protrude from the base layer BSL and/or the pixel circuit layer PCL in a height direction. In an embodiment, the first and second partition walls PW1 and PW2 may have substantially the same height, but the present disclosure is not limited thereto.

In an embodiment, the first partition wall PW1 may be disposed between the base layer BSL and/or the pixel circuit layer PCL and the first electrode ELT1. The first partition wall PW1 may be disposed adjacent to the first ends EP1 of the light emitting elements LD. For example, one side surface of the first partition wall PW1 may be positioned adjacent to the first ends EP1 of the light emitting elements LD and disposed to face the first ends EP1.

In an embodiment, the second partition wall PW2 may be disposed between the base layer BSL and/or the pixel circuit layer PCL and the second electrode ELT2. The second partition wall PW2 may be disposed adjacent to the second ends EP2 of the light emitting elements LD. For example, one side surface of the second partition wall PW2 may be positioned adjacent to the second ends EP2 of the light emitting elements LD and disposed to face the second ends EP2.

In an embodiment, each of the first and second partition walls PW1 and PW2 may have various shapes. By way of example, each of the first and second partition walls PW1 and PW2 may have a trapezoidal cross-section that is reduced in width from a bottom to a top thereof. In this case, each of the first and second partition walls PW1 and PW2 may have an inclined surface on at least one side. In an embodiment, each of the first and second partition walls PW1 and PW2 may have the cross-section of a semi-circle or a semi-ellipse that is reduced in width from the bottom to the top thereof. In this case, each of the first and second partition walls PW1 and PW2 may have a curved surface on at least one side. In other words, the shape of each of the first and second partition walls PW1 and PW2 may be changed in various ways rather than being particularly limited. In an embodiment, at least one of the first and second partition walls PW1 and PW2 may be omitted or changed in position.

Each of the first and second partition walls PW1 and PW2 may include insulating material having at least one inorganic material and/or organic material. For example, the first and second partition walls PW1 and PW2 may include at least one inorganic layer including various known inorganic insulating materials such as silicon nitride (SiNx) or silicon oxide (SiOx). Alternatively, the first and second partition walls PW1 and PW2 may include at least one organic layer and/or photoresist layer containing various known organic insulating materials, or may form a single- or multi-layer insulator containing organic/inorganic materials in combination. In an embodiment of the present disclosure, the constituent materials of the first and second partition walls PW1 and PW2 may be changed in various ways.

In an embodiment, each of the first and second partition walls PW1 and PW2 may function as a reflector. For example, the first and second partition walls PW1 and PW2, along with the first and second electrodes ELT1 and ELT2 provided on the first and second partition walls PW1 and PW2, may function as reflectors that guide light emitted from each light emitting element LD in a desired direction, thus enhancing the light efficiency of the pixel PXL.

The first and second electrodes ELT1 and ELT2 may be respectively disposed over the first and second partition walls PW1 and PW2. The first and second electrodes ELT1 and ELT2 may be disposed at positions spaced from each other in each emission area EMA.

In an embodiment, the first and second electrodes ELT1 and ELT2 that are respectively disposed over the first and second partition walls PW1 and PW2 may have shapes corresponding to the respective shapes of the first and second partition walls PW1 and PW2. For example, the first and second electrodes ELT1 and ELT2 may have inclined surfaces or curved surfaces corresponding to the first and second partition walls PW1 and PW2, respectively, and protrude in the height direction of the base layer BSL.

Each of the first and second electrodes ELT1 and ELT2 may include at least one conductive material. For example, each of the first and second electrodes ELT1 and ELT2 may include at least one material from among at least one metal of various metal materials including silver (Ag), magnesium (Mg), aluminum (Al), platinum (Pt), palladium (Pd), gold (Au), nickel (Ni), neodymium (Nd), iridium (Ir), chrome (Cr), titanium (Ti), molybdenum (Mo), copper (Cu), etc., or an alloy thereof, conductive oxide such as indium tin oxide (ITO), indium zinc oxide (IZO), zinc oxide (ZnO), antimony zinc oxide (AZO), indium tin zinc oxide (ITZO), zinc oxide (ZnO), tin oxide (SnO$_2$), and a conductive polymer such as PEDOT, but the present disclosure is not limited thereto. For example, each of the first and second electrodes ELT1 and ELT2 may include other conductive materials such as a carbon nano tube and a graphene. In other words, each of the first and second electrodes ELT1 and ELT2 may include at least one of various conductive materials to have conductivity, and the constituent material thereof is not particularly limited. Furthermore, each of the first and second electrodes ELT1 and ELT2 may have the same conductive material, or at least one different conductive material.

Each of the first and second electrodes ELT1 and ELT2 may have a single-layer or multi-layer structure. For example, each of the first and second electrodes ELT1 and ELT2 may include at least one reflective electrode layer. Each of the first and second electrodes ELT1 and ELT2 may selectively further include at least one of at least one transparent electrode layer disposed over and/or under the reflective electrode layer, and at least one conductive capping layer covering an upper portion of the reflective electrode layer and/or the transparent electrode layer.

In an embodiment, the reflective electrode layer of each of the first and second electrodes ELT1 and ELT2 may be formed of conductive material having a uniform reflectivity. For example, the reflective electrode layer may include at least one of various metal materials including silver (Ag), magnesium (Mg), aluminum (Al), platinum (Pt), palladium (Pd), gold (Au), nickel (Ni), neodymium (Nd), iridium (Ir), chrome (Cr), titanium (Ti), molybdenum (Mo), copper (Cu), etc., or an alloy thereof, but the present disclosure is not limited thereto. In other words, reflective electrode layer may be formed of various reflective conductive materials. Each of the first and second electrodes ELT1 and ELT2 that includes the reflective electrode layer may enable light emitted from the opposite ends of each of the light emitting elements LD, i.e., the first and second ends EP1 and EP2, to travel in a direction (e.g., in a frontal direction) in which an image is displayed. For example, if the first and second electrodes ELT1 and ELT2 respectively have inclined or curved surfaces corresponding to the shapes of the first and second partition walls PW1 and PW2 and are respectively disposed to face the first and second ends EP1 and EP2 of the light emitting elements LD, light emitted from the first and second ends EP1 and EP2 of each light emitting elements LD may be reflected by the first and second electrodes ELT1 and ELT2 and thus more reliably travel in the frontal direction of the display panel PNL (e.g., in an upward direction of the base layer BSL). Thereby, the efficiency of light emitted from the light emitting elements LD may be enhanced.

Furthermore, the transparent electrode layer of each of the first and second electrodes ELT1 and ELT2 may be formed of various transparent electrode materials. For example, the transparent electrode layer may include ITO, IZO or ITZO, but the present disclosure is not limited thereto. In an embodiment, each of the first and second electrodes ELT1 and ELT2 may have a triple-layer structure having a stacked structure of ITO/Ag/ITO. As such, if the first and second electrodes ELT1 and ELT2 each are formed of a multi-layer structure of double or more layers, voltage drop due to signal delay (e.g., RC delay) may be reduced or minimized. Thus, a desired voltage can be effectively transmitted to the light emitting elements LD.

In addition, if each of the first and second electrodes ELT1 and ELT2 includes the conductive capping layer covering the reflective electrode layer and/or the transparent electrode layer, it is possible to prevent or protect the reflective electrode layer of the first and second electrodes ELT1 and ELT2 from being damaged due to defects caused during the manufacturing process of the pixel PXL. However, the conductive capping layer may be selectively included in the first and second electrodes ELT1 and ELT2, and may be omitted according to an embodiment. Furthermore, the conductive capping layer may be considered as a component of each of the first and second electrodes ELT1 and ELT2, or considered as a separate component disposed on the first and second electrodes ELT1 and ELT2.

The first insulating layer INS1 may be disposed on one area of each of the first and second electrode ELT1 and ELT2. For example, the first insulating layer INS1 may form to cover one area of each of the first and second electrodes ELT1 and ELT2, and may include an opening to expose another area of each of the first and second electrodes ELT1 and ELT2, e.g., each of the first and second contactors CNT1 and CNT2.

In an embodiment, the first insulating layer INS1 may be primarily formed to cover the overall surfaces of the first and second electrodes ELT1 and ELT2. After the light emitting elements LD are supplied and aligned on the first insulating layer INS1, the first insulating layer INS1 may be partially open to expose the first and second electrodes ELT1 and ELT2 in the first and second contactors CNT1 and CNT2, respectively. In an embodiment, the first insulating layer INS1 may be patterned in the form of an individual pattern that is sectionally disposed under the light emitting elements LD after the supply and alignment of the light emitting elements LD have been completed.

In other words, the first insulating layer INS1 may be interposed between the first and second electrodes ELT1 and ELT2 and the light emitting elements LD, and may expose at least one area of each of the first and second electrodes ELT1 and ELT2. After the first and second electrodes ELT1 and ELT2 are formed, the first insulating layer INS1 may be formed to cover the first and second electrodes ELT1 and ELT2, so that it is possible to prevent or protect the first and second electrodes ELT1 and ELT2 from being damaged or to prevent or protect metal from being precipitated in a subsequent process. Furthermore, the first insulating layer INS1 may stably support each light emitting element LD.

A plurality of light emitting elements LD may be supplied to and aligned in each emission area EMA in which the first insulating layer INS1 is formed. For example, a plurality of light emitting elements LD may be supplied to each emission area EMA through an inkjet method or the like, and the light emitting elements LD may be aligned between the first and second electrodes ELT1 and ELT2 by alignment voltages (e.g., set or predetermined alignment voltages) (or alignment signals) applied to the first and second electrodes ELT1 and ELT2.

The second insulating layer INS2 may be disposed over the light emitting elements LD aligned between the first and second electrodes ELT1 and ELT2, and may expose the first and second ends EP1 and EP2 of the light emitting elements LD. For example, the second insulating layer INS2 may be partially disposed only over one area of the light emitting elements LD without covering the first and second ends EP1 and EP2 of the light emitting elements LD. The second insulating layer INS2 may be formed in an independent pattern in each emission area EMA, however, the present disclosure is not limited thereto.

After the alignment of the light emitting elements LD has been completed, the second insulating layer INS2 is formed on the light emitting elements LD so that the light emitting elements LD may be prevented or protected from being removed from the aligned position. If space is present between the first insulating layer INS1 and the light emitting elements LD before the second insulating layer INS2 is formed, the space may be filled with the second insulating layer INS2 during a process of forming the second insulating layer INS2. Consequently, the light emitting elements LD may be more stably supported.

In an embodiment, the first and/or second conductive patterns CP1 and/or CP2 may be formed on at least one of the light emitting elements LD, e.g., at least one end of a plurality of first light emitting elements LD1. The first and/or second conductive patterns CP1 and/or CP2 may electrically connect first and/or second ends EP1 and/or EP2 of each first light emitting element LD1 to the first and/or second contact electrodes CNE1 and/or CNE2.

In an embodiment, the first and second contact electrodes CNE1 and CNE2 may be disposed at the same layer. In this case, although the first and second contact electrodes CNE1 and CNE2 are formed through the same process using the same conductive material, the present disclosure is not limited thereto.

In an embodiment, the first and second contact electrodes CNE1 and CNE2 may be disposed on different layers. In this case, the first and second contact electrodes CNE1 and CNE2 may be formed through different processes using the same conductive material or different conductive materials. In the case where the first and second contact electrodes CNE1 and CNE2 are disposed on different layers, at least one insulating layer may be further formed on the contact electrode disposed on a lower layer.

The first and second contact electrodes CNE1 and CNE2 may respectively electrically connect the first and second ends EP1 and EP2 of the light emitting elements LD to the first and second electrodes ELT1 and ELT2. In an embodiment, the first and second contact electrodes CNE1 and CNE2 may be respectively brought into contact with the first and second electrodes ELT1 and ELT2 through the first and second contactors CNT1 and CNT2 and may be electrically connected to the first and second electrodes ELT1 and ELT2.

For instance, the first contact electrode CNE1 may be brought into contact with the first electrode ELT1 over one area (e.g., the first contactor CNT1) of the first electrode ELT1 that is not covered by the first insulating layer INS1, so that the first contact electrode CNE1 can be electrically connected to the first electrode ELT1. Likewise, the second contact electrode CNE2 may be brought into contact with the second electrode ELT2 over one area (e.g., the second contactor CNT2) of the second electrode ELT2 that is not covered by the first insulating layer INS1, so that the second contact electrode CNE2 can be electrically connected to the second electrode ELT2. However, the present disclosure is not limited thereto, and the connection structure between the first and second contact electrodes CNE1 and CNE2 and the first and second electrodes ELT1 and ELT2 may be changed in various ways.

In an embodiment, any one contact electrode of the first and second contact electrodes CNE1 and CNE2 may be connected to the first or second end EP1 or EP2 of the first light emitting elements LD1 via the corresponding conductive pattern CP. The other contact electrode may be directly connected to the first or second end EP1 or EP2 of the first light emitting element LD1. In an embodiment, both the first and second contact electrodes CNE1 and CNE2 may be respectively connected to the first and second ends EP1 and EP2 of the first light emitting elements LD1 via the first and second conductive patterns CP1 and CP2.

The third insulating layer INS3 may be disposed on the first and second contact electrodes CNE1 and CNE2. The third insulating layer INS3 may be formed and/or disposed on one surface of the base layer BSL on which the first and second partition walls PW1 and PW2, the first and second electrodes ELT1 and ELT2, the light emitting elements LD, and the first and second contact electrodes CNE1 and CNE2 are formed, so that the third insulating layer INS3 may cover the first and second partition walls PW1 and PW2, the first and second electrodes ELT1 and ELT2, the light emitting elements LD, and the first and second contact electrodes CNE1 and CNE2. The third insulating layer INS3 may include at least one inorganic layer and/or organic layer.

In an embodiment, the third insulating layer INS3 may include a thin-film encapsulation layer having a multi-layered structure, but the present disclosure is not limited thereto. In some embodiments, at least one overcoat layer, an encapsulation substrate, etc., may be further disposed over the third insulating layer INS3.

In an embodiment, each of the first to third insulating layers INS1, INS2, and INS3 may have a single-layer or multi-layer structure, and include at least one inorganic insulating material and/or organic insulating material. For example, each of the first to third insulating layers INS1, INS2, and INS3 may include various kinds of well-known organic/inorganic insulating materials including silicon nitride (SiNx), and the constituent material of each of the first to third insulating layers INS1, INS2, and INS3 is not particularly limited. The first to third insulating layers INS1, INS2, and INS3 may include different insulating materials, or at least some of the first to third insulating layers INS1, INS2, and INS3 may include the same insulating material.

Figure 23:
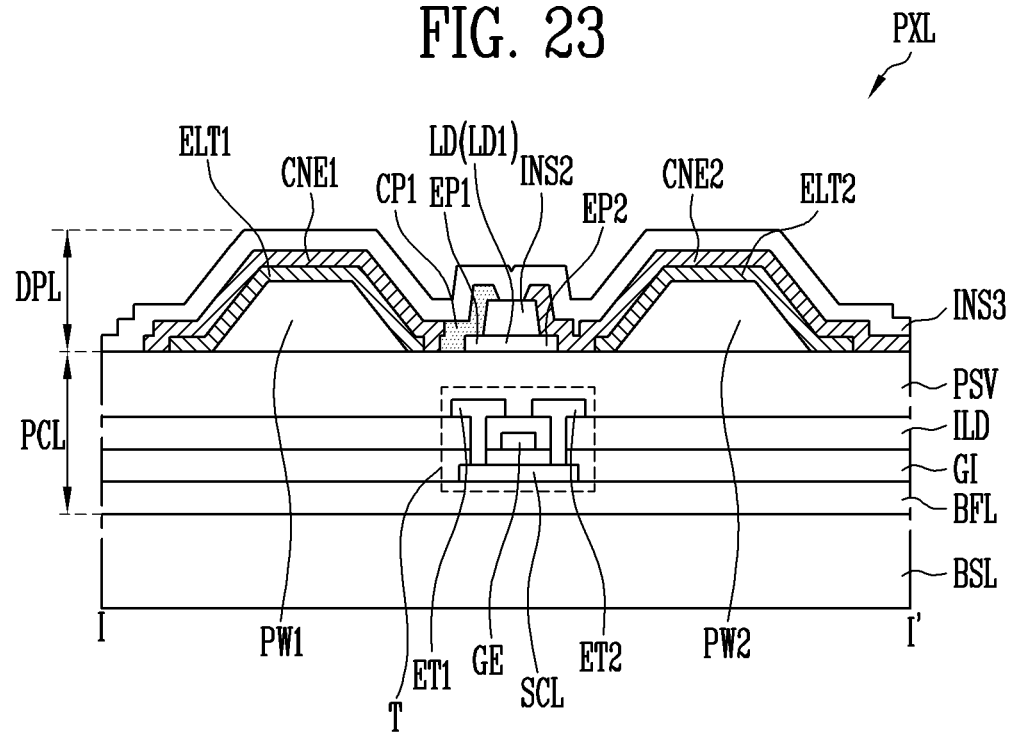
FIGS. 23-25 each are a sectional view illustrating a pixel in accordance with an embodiment of the present disclosure, and for example illustrate different embodiments of a cross-section of the pixel corresponding to the line I-I' of FIG. 19.
Figure 24:
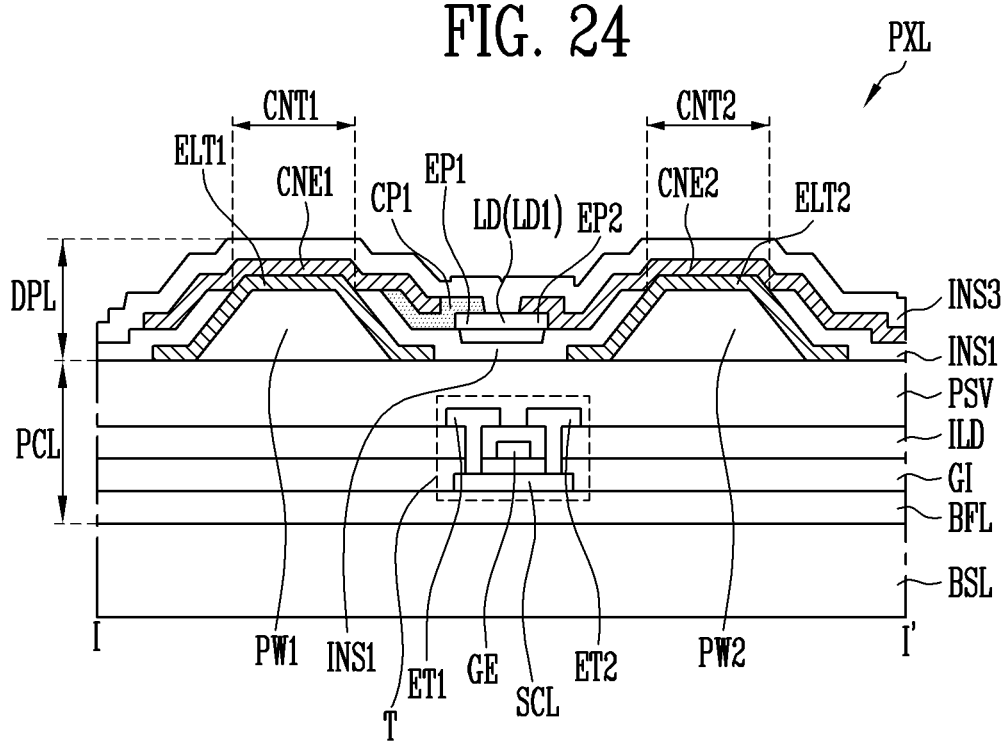
Figure 25:
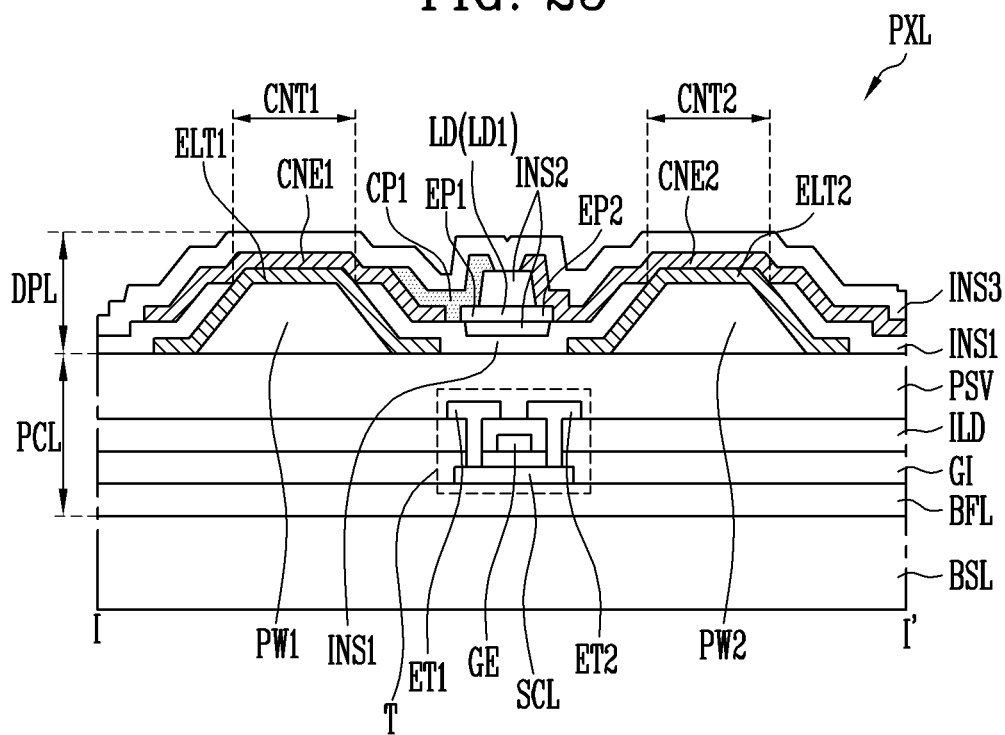

FIGS. 23-25 each are a sectional view illustrating a pixel PXL in accordance with an embodiment of the present disclosure, and for example illustrate different embodiments of a cross-section of the pixel PXL corresponding to the line I-I' of FIG. 19. In the description of the embodiment of FIGS. 23-25, like reference numerals will be used to designate components similar or equal to those of the previous embodiments, and detailed explanation thereof will be omitted.

Referring to FIG. 23, the first insulating layer INS1 disclosed in the embodiments of FIGS. 22A and 22B may be omitted. In this case, each light emitting element LD may be disposed on the passivation layer PSV between the first and second electrodes ELT1 and ELT2.

Referring to FIG. 24, the second insulating layer INS2 disclosed in the embodiments of FIGS. 22A and 22B may be omitted. In an embodiment, in the case where space is present between the first insulating layer INS1 and the light emitting elements LD, the space may be filled with the third insulating layer INS3 during a process of forming the third insulating layer INS3.

Referring to FIG. 25, each first conductive pattern CP1 may be disposed over the first contact electrode CNE1 corresponding thereto. In an embodiment, in the case where each pixel PXL further includes the second conductive pattern CP2 described above, the second conductive pattern CP2 may be disposed over the second contact electrode CNE2 corresponding thereto.

Figure 26:
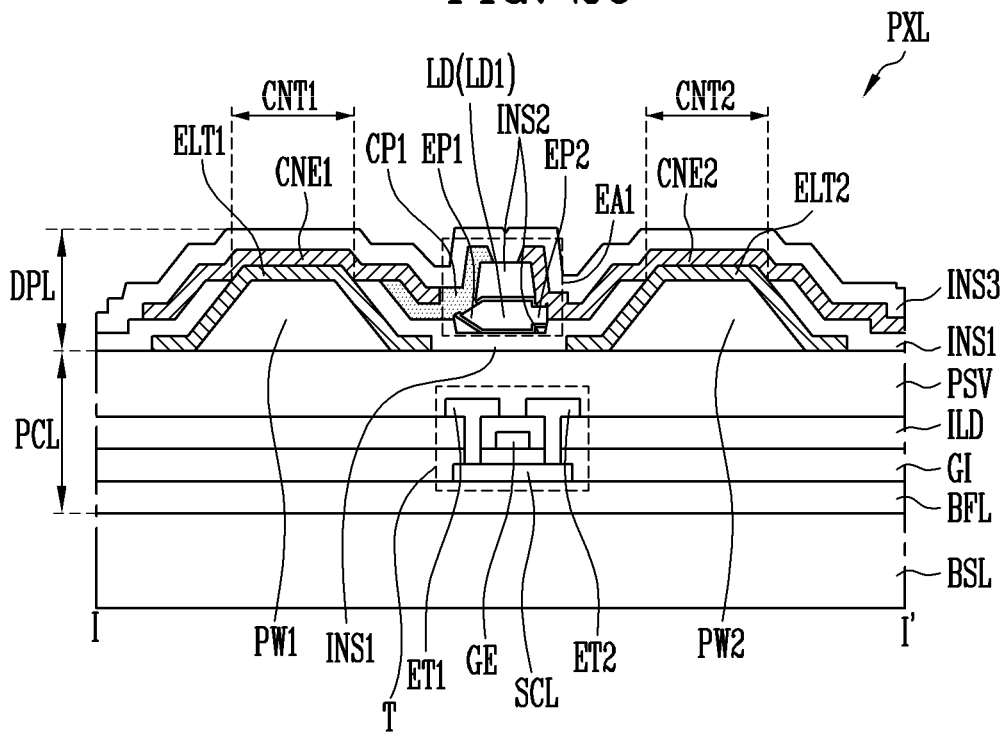
FIG. 26 is a sectional view illustrating a pixel in accordance with an embodiment of the present disclosure and, for example, illustrates an embodiment of a cross-section of a pixel including a light emitting element having a core-shell structure.
Figure 27:
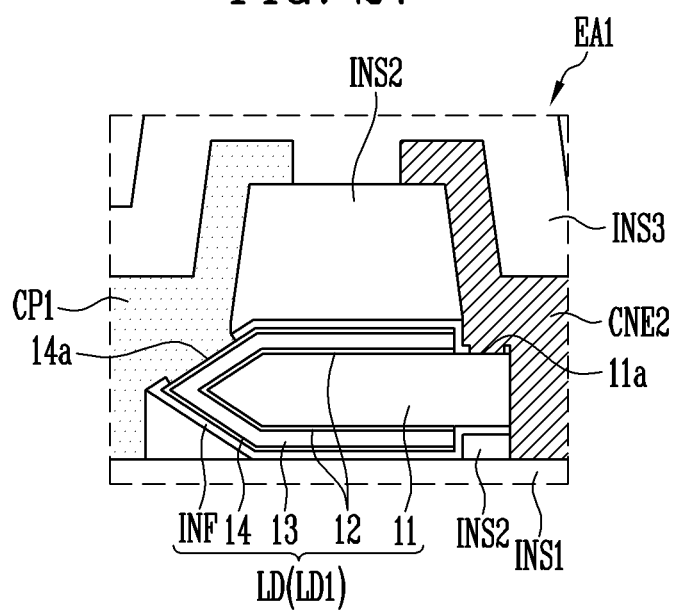
FIG. 27 is an enlarged diagram of an area EA1 of FIG. 26.

FIG. 26 is a sectional view illustrating a pixel PXL in accordance with an embodiment of the present disclosure and, for example, illustrates an embodiment of a cross-section of a pixel PXL including a light emitting element LD having a core-shell structure. FIG. 27 is an enlarged diagram of the area EA1 of FIG. 26. In the description of the embodiment of FIGS. 26 and 27, like reference numerals will be used to designate components similar or equal to those of the previous embodiments, and detailed explanation thereof will be omitted.

Referring to FIGS. 26 and 27, each light emitting element LD may be disposed horizontally in a longitudinal direction between the first and second electrodes ELT1 and ELT2 and may be electrically connected to the first and second electrodes ELT1 and ELT2. In an embodiment, an insulating film INF provided on the surface of each light emitting element LD may be partially removed to expose one area of each of the first conductivity type semiconductor layer 11 and the electrode layer 14. For example, one area 14a of the electrode layer 14 may be exposed by partially removing the insulating film INF on the first end EP1 of the first light emitting element LD1, so that the electrode layer 14 may be electrically connected to the first conductive pattern CP1 through the one area 14a. One area 11a of the first conductivity type semiconductor layer 11 may be exposed by partially removing the insulating film INF on the second end EP2 of the first light emitting element LD1, so that the first conductivity type semiconductor layer 11 may be electrically connected to the second contact electrode CNE2 through the one area 11a.

Figure 28:
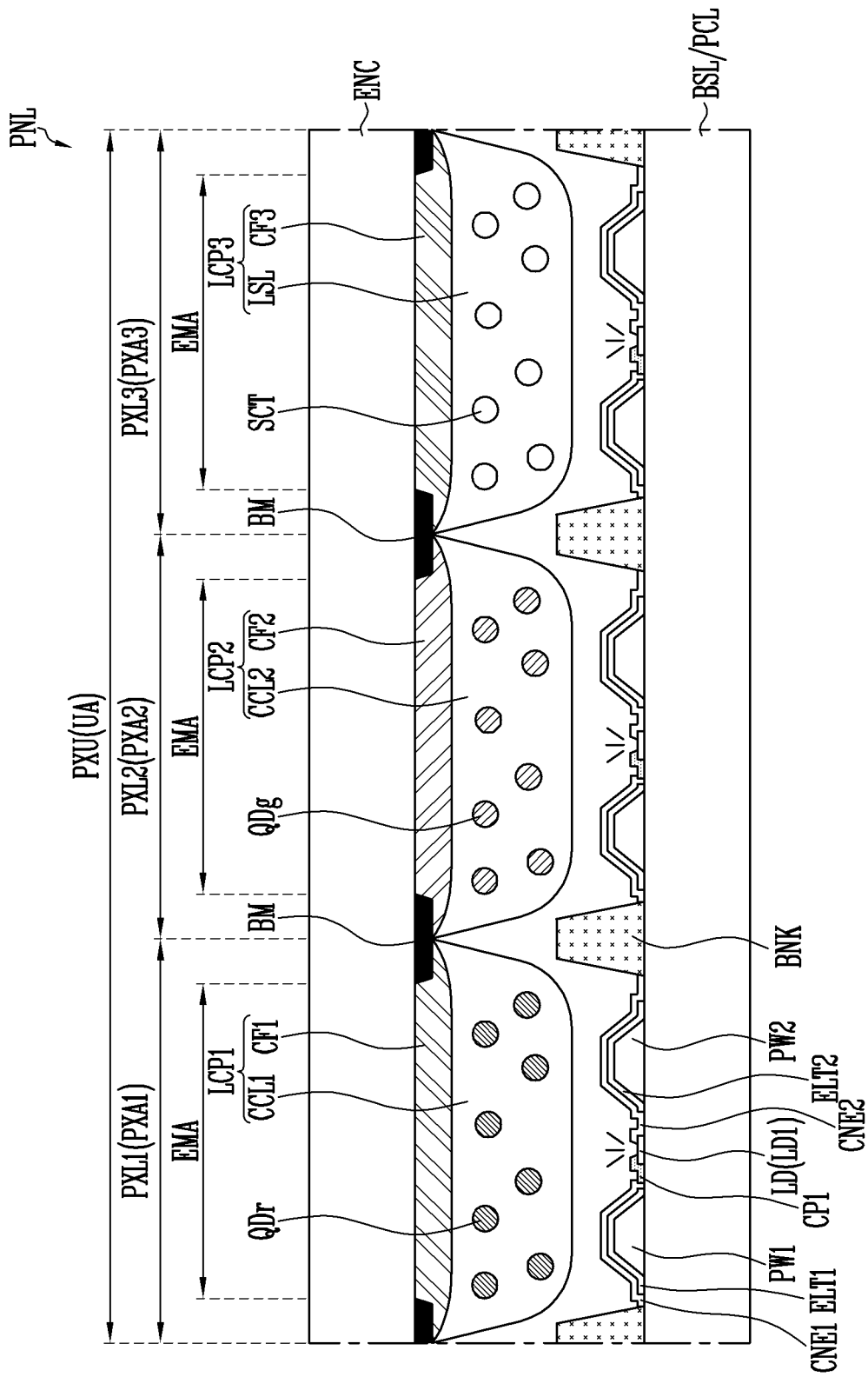
FIG. 28 is a sectional view illustrating a display device in accordance with an embodiment of the present disclosure and, for example, an embodiment for a cross-section of a pixel unit disposed in each unit area of a display panel.

FIG. 28 is a sectional view illustrating a display device in accordance with an embodiment of the present disclosure and, for example, an embodiment for a cross-section of a pixel unit PXU disposed in each unit area UA of a display panel PNL. Because the structure of each pixel PXL for forming the pixel unit PXU has been described in detail in the preceding embodiments, FIG. 28 only schematically illustrates the structure of each pixel PXL centered on each one first light emitting element LD1. In the description of the embodiment of FIG. 28, like reference numerals will be used to designate components similar or equal to those of the previous embodiments, and detailed explanation thereof will be omitted.

Referring to FIG. 28, a bank BNK may be further disposed over the base layer BSL and/or the pixel circuit layer PCL. In an embodiment, the bank BNK may be disposed in a boundary area of first, second, and third color pixel areas PXA1, PXA2, and PXA3 in which first, second, and third color pixels PXL1, PXL2, and PXL3 are respectively provided, such that the emission area EMA of each pixel PXL is enclosed by the bank BNK. The bank BNK may also be disposed on the perimeter of the display area DA to enclose the display area DA in which the pixels PXL are disposed.

The bank BNK may be a structure that defines the emission area EMA of each pixel PXL, and for example, may be a pixel defining layer. The bank BNK may include at least one light shielding and/or reflective material, thus preventing light leakage between adjacent pixels PXL from occurring. In an embodiment, a reflective layer which is not shown may be formed on a surface (e.g., a sidewall) of the bank BNK to increase the light efficiency of the pixel PXL.

In an embodiment, an encapsulation substrate ENC (referred also to as "color filter substrate") may be disposed on one surface of the base layer BSL on which the pixels PXL are disposed. At least one kind of light conversion layer may be disposed on one surface of the encapsulation substrate ENC that faces the light emitting elements LD. For example, a first light conversion layer LCP1 may be disposed over the first color pixel PXL1, a second light conversion layer LCP2 may be disposed over the second color pixel PXL2, and a third light conversion layer LCP3 may be disposed over the third color pixel PXL3. Hereinafter, the term "light conversion layer LCP" or "light conversion layers LCP" will be used to designate any one light conversion layer of the first light conversion layer LCP1, the second light conversion layer LCP2, and the third light conversion layer LCP3, or comprehensively designate two or more kinds of light conversion layers.

At least some of the first, second, and third light conversion layers LCP1, LCP2, and LCP3 may include a color conversion layer and/or a color filter layer that corresponds to a color (e.g., a set or predetermined color). For example, the first light conversion layer LCP1 may include a first color conversion layer CCL1 including first color conversion particles corresponding to a first color, and a first color filter layer CF1 configured to allow the first color of light to selectively pass therethrough. Likewise, the second light conversion layer LCP2 may include a second color conversion layer CCL2 including second color conversion particles corresponding to a second color, and a second color filter layer CF2 configured to allow the second color of light to selectively pass therethrough. The third light conversion layer LCP3 may include at least one of a light scattering layer LSL including light scattering particles SCT, and a third color filter layer CF3 configured to allow the third color of light to selectively pass therethrough. Hereinafter, the term "color conversion layer CCL" or "color conversion layers CCL" will be used to designate any color conversion layer of the first color conversion layer CCL1 and the second color conversion layer CCL2 or comprehensively designate two or more kinds of color conversion layers. Likewise, the term "color filter layer CF" or "color filter layers CF" will be used to designate any color filter layer of the first color filter layer CF1, the second color filter layer CF2, and the third color filter layer CF3, or comprehensively designate two or more kinds of color filter layers.

In an embodiment, the first, second, and third color pixels PXL1, PXL2, and PXL3 may include light emitting elements LD configured to emit the same color of light. For example, the first, second, and third color pixels PXL1, PXL2, and PXL3 may include blue light emitting elements configured to emit a third color light, e.g., blue light having a wavelength band ranging approximately from 400 nm to approximately 500 nm. A color conversion layer CCL including at least one kind of color conversion particles may be disposed on at least some pixels of the first, second, and third color pixels PXL1, PXL2, and PXL3. Consequently, the display device in accordance with an embodiment of the present disclosure may display a full-color image.

The first color conversion layer CCL1 may be disposed on one surface of the encapsulation substrate ENC to face the first color pixel PXL1, and include first color conversion particles configured to convert the color of light (e.g., the third color of light) emitted from the light emitting elements LD of the first color pixel PXL1 to a first color light. For example, in the case where the light emitting elements LD of the first color pixel PXL1 are blue light emitting elements configured to emit blue light and the first color pixel PXL1 is a red pixel, the first color conversion layer CCL1 may include red quantum dots QDr which convert blue light emitted from the blue light emitting elements to red light.

In an embodiment, the first color conversion layer CCL1 may include a plurality of red quantum dots QDr which are distributed in a matrix material (e.g., a set or predetermined matrix material) such as transparent resin. The red quantum dot QDr may absorb blue light and shift the wavelength of light according to an energy transition, thus emitting red light having a wavelength band ranging from 620 nm to 780 nm. In the case where the first color pixel PXL1 is one of pixels having other colors, the first color conversion layer CCL1 may include first quantum dots corresponding to the color of the first color pixel PXL1.

The first color filter layer CF1 may be disposed between the first color conversion layer CCL1 and the encapsulation substrate ENC and include color filter material which allows the first color light converted by the first color conversion layer CCL1 to selectively pass therethrough. For example, in the case where the first color conversion layer CCL1 includes red quantum dots QDr, the first color filter layer CF1 may be a red color filter configured to allow red light to selectively pass therethrough.

In an embodiment, the second color conversion layer CCL2 may be disposed on one surface of the encapsulation substrate ENC to face the second color pixel PXL2 and include second color conversion particles which convert the color of light emitted from the light emitting elements LD of the second color pixel PXL2 to a second color light. For example, in the case where the light emitting elements LD of the second color pixel PXL2 are blue light emitting elements configured to emit blue light and the second color pixel PXL2 are a green pixel, the second color conversion layer CCL2 may include green quantum dots QDg which convert blue light emitted from the light emitting elements LD to green light. For example, the second color conversion layer CCL2 may include a plurality of green quantum dots QDg which are distributed in a matrix material (e.g., a set or predetermined matrix material) such as transparent resin. The green quantum dot QDg may absorb blue light and shift the wavelength of light according to an energy transition, thus emitting green light having a wavelength band ranging from 500 nm to 570 nm. In the case where the second color pixel PXL2 is one of pixels having other colors, the second color conversion layer CCL2 may include second quantum dots corresponding to the color of the second color pixel PXL2.

Each of the first and second quantum dots (e.g., red and green quantum dots QDr and QDg) may be selected from among a group II-VI compound, a group III-V compound, a group IV-VI compound, a group IV element, a group IV compound, and a combination thereof.

A group II-VI compound may be selected from the group consisting of: a binary compound selected from the group consisting of CdSe, CdTe, ZnS, ZnSe, ZnTe, ZnO, HgS, HgSe, HgTe, MgSe, MgS, and a mixture thereof; a ternary compound selected from the group consisting of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof; and a quanternary compound selected from the group consisting of HgZnTeS, CdZnSeS, CdZnSeTe, CdZnSTe, CdHgSeS, CdHgSeTe, CdHgSTe, HgZnSeS, HgZnSeTe, HgZnSTe, and a mixture thereof.

A group III-V compound may be selected from the group consisting of: a binary compound selected from the group consisting of GaN, GaP, GaAs, GaSb, AlN, AlP, AlAs, AlSb, InN, InP, InAs, InSb, and a mixture thereof; a ternary compound selected from the group consisting of GaNP, GaNAs, GaNSb, GaPAs, GaPSb, AlNP, AlNAs, AlNSb, AlPAs, AlPSb, InNP, InNAs, InNSb, InPAs, InPSb, and a mixture thereof; and a quanternary compound selected from the group consisting of GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a mixture thereof.

The group IV-VI compound may be selected from the group consisting of: a binary compound selected from the group consisting of SnS, SnSe, SnTe, PbS, PbSe, PbTe, and a mixture thereof; a ternary compound selected from the group consisting of SnSeS, SnSeTe, SnSTe, PbSeS, PbSeTe, PbSTe, SnPbS, SnPbSe, SnPbTe, and a mixture thereof; and a quanternary compound selected from the group consisting of SnPbSSe, SnPbSeTe, SnPbSTe, and a mixture thereof. The group IV element may be selected from the group consisting of Si, Ge, and a mixture thereof. The group IV compound may be a binary compound selected from the group consisting of SiC, SiGe, and a mixture thereof.

The first and second quantum dots (e.g., red and green quantum dots QDr and QDg) may have a full width of half maximum (FWHM) of an emission wavelength spectrum of about 45 nm or less, and light emitted through the first and second quantum dots (e.g., red and green quantum dots QDr and QDg) may be emitted in all directions. Consequently, the viewing angle of the display device may be enhanced.

Each of the first and second quantum dots (e.g., red and green quantum dots QDr and QDg) may be in the form of a nanoparticle, a nanotube, a nanowire, nanofiber, a planar nanoparticle having a spherical shape, a pyramid shape, a multi-arm shape, or a cubic shape, but it is not limited thereto. In other words, the shapes of the first and second quantum dots (e.g., red and green quantum dots QDr and QDg) may be changed in various ways.

In an embodiment of the present disclosure, when blue light having a comparatively short wavelength in a visible ray area is incident on each of the red and green quantum dots QDr and QDg, the absorption coefficient of the red and green quantum dots QDr and QDg may be increased. Thereby, eventually, the efficiency of light emitted from the first color pixels PXL1 and the second color pixels PXL2 may be enhanced, and satisfactory color reproducibility may be secured. Furthermore, because the light emitting elements LD of the same color are used to form the light source units LSU of the first, second, and third color pixels PXL1, PXL2, and PXL3, the efficiency at which the display device is manufactured may be enhanced.

The second color filter layer CF2 may be disposed between the second color conversion layer CCL2 and the encapsulation substrate ENC and include color filter material which allows the second color of light converted by the second color conversion layer CCL2 to selectively pass therethrough. For example, in the case where the second color conversion layer CCL2 includes green quantum dots QDg, the second color filter layer CF2 may include a green color filter configured to allow green light to selectively pass therethrough.

In an embodiment, the light scattering layer LSL may be disposed on one surface of the encapsulation substrate ENC to face the third color pixel PXL3. For example, the light scattering layer LSL may be disposed between the third color pixel PXL3 and the third color filter layer CF3.

In an embodiment, when the light emitting elements LD of the third color pixel PXL3 are blue light emitting elements configured to emit blue light and the third color pixel PXL3 is a blue pixel, the light scattering layer LSL may be selectively provided to efficiently use light emitted from the light emitting elements LD of the third color pixel PXL3. The light scattering layer LSL may include at least one kind of light scattering particles SCT. For example, the light scattering layer LSL may include light scattering particles SCT such as titanium dioxide ($TiO_2$) or silica. For example, the light scattering layer LSL may include a plurality of light scattering particles SCT which are distributed in a matrix material (e.g., a set or predetermined matrix material) such as transparent resin. In the present disclosure, the material of the light scattering particles SCT is not particularly limited, and the light scattering layer LSL may be formed of various well-known materials. Here, the light scattering particles SCT may be disposed in areas other than the third color pixel area PXA3 of the third color pixel PXL3. For example, the light scattering particles SCT may also be selectively included in the first and/or second color conversion layer CCL1 and/or CCL2.

In an embodiment, the third color filter layer CF3 may be disposed on one surface of the encapsulation substrate ENC to face the third color pixel PXL3 and include color filter material which allows the color of light emitted from the light emitting elements LD of the third color pixel PXL3 to selectively pass therethrough. For example, in the case where the light emitting elements LD are blue light emitting elements configured to emit blue light, the third color filter layer CF3 may be a blue color filter configured to allow blue light to selectively pass therethrough.

In an embodiment, a black matrix BM may be disposed between the color filter layers CF. For example, the black matrix BM may be disposed on the encapsulation substrate ENC to face the bank BNK on the base layer BSL.

In the foregoing embodiments, each pixel PXL and a display device including the same may be easily manufactured using light emitting elements LD of the same color. Because the color conversion layer CCL is disposed on at least some of the pixels PXL, a full-color pixel unit PXU and a display device including the same may be manufactured.

FIGS. 29 and 30 are flowcharts each illustrating a method of fabricating a display device including a pixel PXL in accordance with an embodiment of the present disclosure. Hereinafter, the method of fabricating the display device including the pixel PXL in accordance with an embodiment of the present disclosure will be described with reference to FIGS. 29-30 in connection with the embodiments described above.

First, the first partition wall PW1 and the second partition wall PW2 are formed on the base layer BSL (ST 100). For example, the first partition wall PW1 and the second partition wall PW2 may be formed at positions spaced from each other in the emission area EMA of each pixel PXL defined on the base layer BSL.

The first partition wall PW1 and the second partition wall PW2 may be selectively formed. In some embodiments, the step of forming the first partition wall PW1 and/or the second partition wall PW2 (ST100) will be omitted. In some embodiments, the pixel circuit layer PCL may be formed on the base layer BSL before the first partition wall PW1 and the second partition wall PW2 are formed. In this case, the first partition wall PW1 and the second partition wall PW2 may be formed on one surface of the base layer BSL on which the pixel circuit layer PCL is formed.

Next, the first electrode ELT1 and the second electrode ELT2 are formed (ST 200) on the base layer BSL on which the first partition wall PW1 and the second partition wall PW2 are selectively formed. For example, the first electrode ELT1 and the second electrode ELT2 may be formed at positions spaced from each other on the first partition wall PW1 and the second partition wall PW2, respectively. In an embodiment, at the step of forming the first electrode ELT1 and the second electrode ELT2, the first connection electrode CNL1 and the second connection electrode CNL2 may be respectively formed to be integrally connected to the first electrode ELT1 and the second electrode ELT2.

Next, the first insulating layer INS1 is formed (ST 300) on the base layer BSL on which the first electrode ELT1 and the second electrode ELT2 are formed. For example, the first insulating layer INS1 may be formed on the base layer BSL to cover at least the first electrode ELT1 and the second electrode ELT2. The first insulating layer INS1 may be partially removed to expose one area of the first electrode ELT1 and one area of the second electrode ELT2 later. The first insulating layer INS1 may be selectively formed depending on embodiments. In some embodiments, the step of forming the first insulating layer INS1 may be omitted.

Next, a plurality of light emitting elements LD are supplied (ST 400) onto the base layer BSL on which the first insulating layer INS1 is formed. The light emitting elements LD are aligned (ST 400) between the first electrode ELT1 and the second electrode ELT2. For example, a plurality of light emitting elements LD may be supplied to the emission area EMA of each pixel PXL by an inkjet printing scheme or the like, and alignment voltages (e.g., set or predetermined alignment voltages) are applied to the first and second electrodes ELT1 and ELT2, whereby the light emitting elements LD may be aligned.

Next, the second insulating layer INS2 is formed (ST 500) on the base layer BSL on which the light emitting elements LD are aligned. For example, after the second insulating layer INS2 is formed on the base layer BSL to cover the first and second electrodes ELT1 and ELT2 and the light emitting elements LD, the first and second insulating layers INS1 and INS2 may be etched to expose respective corresponding areas (e.g., the first and second contactors CNT1 and CNT2) of the first and second electrodes ELT1 and ELT2 and the first and second ends EP1 and EP2 of the light emitting elements LD. In an embodiment, the first and second insulating layers INS1 and INS2 may be concurrently (or simultaneously) or sequentially etched. The second insulating layer INS2 may also be selectively formed in the same manner as that of the first insulating layer INS1. In some embodiments, the step of forming the second insulating layer INS2 may be omitted.

Next, at least one conductive pattern CP may be formed (ST 600) on the base layer BSL on which the first and second electrodes ELT1 and ELT2, the light emitting elements LD, etc. are disposed. For example, the first and/or second conductive patterns CP1 and/or CP2 may be formed on at least one end of the first and second ends EP1 and EP2 of at least one first light emitting element LD1 (e.g., a plurality of first light emitting elements LD1) of the light emitting elements LD disposed in the emission area EMA of each pixel PXL. In an embodiment, each first conductive pattern CP1 may be formed on the first end EP1 of any one first light emitting element LD1 and electrically connected with the first end EP1. Likewise, each second conductive pattern CP2 may be formed on the second end EP2 of any one first light emitting element LD1 and electrically connected with the second end EP2.

Next, the first and second contact electrodes CNE1 and CNE2 to be respectively electrically connected to the first and second electrodes ELT1 and ELT2 are formed (ST 700) on the base layer BSL on which the first and second electrodes ELT1 and ELT2, the light emitting elements LD, and the conductive patterns CP, etc. are disposed. The first and second contact electrodes CNE1 and CNE2 may respectively electrically connect the first and second ends EP1 and EP2 of the light emitting elements LD to the first and second electrodes ELT1 and ELT2. In an embodiment, the first and second contact electrodes CNE1 and CNE2 may be concurrently formed (or simultaneously or sequentially formed).

In an embodiment, the first and/or second contact electrodes CNE1 and/or CNE2 may be electrically connected to the first and/or second ends EP1 and/or EP2 of at least one first light emitting element LD1 through at least one first and/or second conductive patterns CP1 and/or CP2, respectively. For example, the first contact electrode CNE1 may be electrically connected to the first end EP1 of at least one first light emitting element LD1 through at least one first conductive pattern CP1 and thus electrically connect the first end EP1 to the first electrode ELT1. The second contact electrode CNE2 may be electrically connected between the second end EP2 of the at least one first light emitting element LD1 and the second electrode ELT2. For example, the second contact electrode CNE2 may be electrically connected between the second end EP2 of the at least one first light emitting element LD1 and the second electrode ELT2 through at least one second conductive pattern CP2 or without the at least one second conductive pattern CP2.

In an embodiment, the step of forming the conductive pattern CP and the step of forming the first and second contact electrodes CNE1 and CNE2 may form the step of electrically connecting the first and second ends EP1 and EP2 of a plurality of light emitting elements LD including the at least one first light emitting element LD1 to the first and second electrodes ELT1 and ELT2, respectively. As illustrated in FIGS. 29 and 30, step ST 600 or ST 700 of forming the conductive pattern and step ST 700 or ST 600 of forming the first and second contact electrodes may be sequentially performed, and the sequence thereof may be changed. For example, in an embodiment, after the conductive pattern CP has been formed (ST 600), the first and second contact electrodes CNE1 and CNE2 may be formed (ST 700). In an embodiment, after the first and second contact electrodes CNE1 and CNE2 have been formed (ST 700), the conductive pattern CP may be formed (ST 600).

Next, the third insulating layer INS3 is formed (ST 800) on the base layer BSL on which the first and second electrodes ELT1 and ELT2, the light emitting elements LD, the conductive patterns CP, and the first and second contact electrodes CNE1 and CNE2, etc. are formed. Thereby, the display element layer DPL on which the light emitting elements LD are disposed may be reliably protected.

If a pixel defect resulting from a short-circuit defect occurs in at least one pixel PXL, the step of correcting the pixel defect may be further performed. For example, in the case where a short-circuit defect occurs in at least one first light emitting element LD1, the first conductive pattern CP1 and/or the second conductive pattern CP2 may be disconnected by applying a laser beam or a voltage to the first conductive pattern CP1 and/or the second conductive pattern CP2 connected to the first end EP1 and/or the second end EP2 of the first light emitting element LD1. Hence, a leakage current path by the first light emitting element LD1 may be selectively interrupted, so that the pixel defect can be efficiently corrected.

While the scope of the present disclosure are described by detailed embodiments, it should be noted that the above-described embodiments are merely descriptive and should not be considered limiting. It should be understood by those skilled in the art that various changes, substitutions, and alternations may be made herein without departing from the scope of the disclosure as defined by the claims.

The scope of the present disclosure is not limited by detailed descriptions of the present disclosure, and should be defined by the accompanying claims and their equivalents. Furthermore, all changes or modifications of the present disclosure derived from the meanings and scope of the claims, and equivalents thereof should be construed as being included in the scope of the present disclosure.

The invention claimed is:
1. A pixel comprising:
a first electrode;
a second electrode spaced from the first electrode;
a plurality of light emitting elements arranged between the first electrode and the second electrode and comprising at least one first light emitting element;
a first contact electrode on the first electrode and electrically connected to the first electrode and first ends of at least some of the plurality of light emitting elements;

a second contact electrode on the second electrode and electrically connected to the second electrode and second ends of at least some of the plurality of light emitting elements, the second contact electrode touching the second ends of the at least some of the plurality of light emitting elements; and at least one first conductive pattern between the at least one first light emitting element and the first contact electrode, and configured to electrically connect a first end of a corresponding first light emitting element to the first contact electrode such that the corresponding first light emitting element emit light, wherein the at least one first conductive pattern comprises a low melting conductive material having a melting point lower than those of the first contact electrode and the second contact electrode, wherein at least a portion of the first contact electrode is spaced from the at least one first light emitting element in a first direction that is perpendicular to a thickness direction of the at least one first light emitting element with the at least one first conductive pattern located therebetween in the first direction, and wherein light is emitted from the at least one first light emitting element in the thickness direction of the at least one first light emitting element, and wherein in case the at least one first conductive pattern is disconnected, the first contact electrode and the corresponding first light emitting element are electrically separated from each other and do not emit light.

2. The pixel according to claim 1, wherein the first end of the corresponding first light emitting element is spaced from the first contact electrode, and electrically connected to the first contact electrode via the first conductive pattern.

3. The pixel according to claim 1, wherein a second end of the corresponding first light emitting element overlaps with the second contact electrode and is directly connected to the second contact electrode.

4. The pixel according to claim 1, further comprising at least one second conductive pattern located between the at least one first light emitting element and the second contact electrode.

5. The pixel according to claim 4, wherein a second end of the at least one first light emitting element is spaced from the second contact electrode, and electrically connected to the second contact electrode via the at least one second conductive pattern.

6. The pixel according to claim 1, wherein the first conductive pattern comprises a conductive material different from a constituent material of the first contact electrode.

7. The pixel according to claim 1, wherein the first contact electrode comprises at least one first protrusion protruding toward at least one second light emitting element of the plurality of light emitting elements and overlapping with a first end of the second light emitting element.

8. The pixel according to claim 7, wherein a second end of the second light emitting element overlaps with the second contact electrode and is directly connected to the second contact electrode.

9. The pixel according to claim 8, wherein the second contact electrode comprises at least one second protrusion protruding toward the second light emitting element and overlapping with the second end of the second light emitting element.

10. The pixel according to claim 1, wherein the plurality of light emitting elements comprise a plurality of second light emitting elements successively arranged between the first electrode and the second electrode in a direction in which the first electrode extends, and wherein the first contact electrode comprises at least one first protrusion having a width greater than a distance between the plurality of second light emitting elements and overlapping with first ends of the plurality of second light emitting elements.

11. The pixel according to claim 1, comprising:

a plurality of first light emitting elements and a plurality of second light emitting elements arranged between the first electrode and the second electrode;

a plurality of first conductive patterns located between each of the plurality of first light emitting elements and the first contact electrode to electrically connect respective first ends of the plurality of first light emitting elements to the first contact electrode; and a plurality of first protrusions protruding from the first contact electrode toward the plurality of respective second light emitting elements and overlapping respective first ends of the plurality of second light emitting elements, and wherein the plurality of first conductive patterns and the plurality of first protrusions are regularly or irregularly arranged on one side of the first contact electrode.

12. The pixel according to claim 1, comprising a plurality of first conductive patterns spaced from each other and located on respective first ends of the plurality of light emitting elements.

13. The pixel according to claim 1, wherein the first conductive pattern has any one of polygonal shapes including a rectangular shape.

14. The pixel according to claim 1, wherein the first conductive pattern comprises:

a first area having a first width; and a second area and a third area located on opposite sides of the first area, and each having a width greater than the first width.

15. The pixel according to claim 1, comprising a plurality of first conductive patterns spaced from each other and located on respective first ends of a plurality of first light emitting elements of the plurality of light emitting elements, wherein at least one of the plurality of first conductive patterns is disconnected between a first end of a corresponding first light emitting element and the first contact electrode.

16. The pixel according to claim 1, wherein the first electrode and the second electrode are spaced from each other by a distance equal to or greater than an average length of the light emitting elements.

17. The pixel according to claim 1, wherein the first contact electrode is not overlapped with the at least one first light emitting element in a plan view.

18. The pixel according to claim 1, wherein the at least one first conductive pattern is configured to disconnect an electrical connection between the first end of the corresponding first light emitting element and the first contact electrode when the corresponding first light emitting element is short-circuited.

19. A display device comprising:
a display area; and
a pixel in the display area,
wherein the pixel comprises:
- a first electrode;
- a second electrode spaced from the first electrode;
- a plurality of light emitting elements arranged between the first electrode and the second electrode and comprising at least one first light emitting element;
- a first contact electrode on the first electrode and electrically connected to the first electrode and first ends of at least some of the plurality of light emitting elements;
- a second contact electrode on the second electrode and electrically connected to the second electrode and second ends of at least some of the plurality of light emitting elements, the second contact electrode touching the second ends of the at least some of the plurality of light emitting elements; and
- at least one first conductive pattern between the at least one first light emitting element and the first contact electrode to electrically connect a first end of a corresponding first light emitting element to the first contact electrode such that the corresponding first light emitting element emit light,
wherein the at least one first conductive pattern comprises a low melting conductive material having a melting point lower than those of the first contact electrode and the second contact electrode,
wherein the first contact electrode is spaced from the at least one first light emitting element in a first direction that is perpendicular to a thickness direction of the at least one first light emitting element with the at least one first conductive pattern located therebetween in the first direction, and wherein light is emitted from the at least one first light emitting element in the thickness direction of the at least one first light emitting element, and
wherein in case the at least one first conductive pattern is disconnected, the first contact electrode and the corresponding first light emitting element are electrically separated from each other and do not emit light.

20. The display device according to claim 19, wherein the first end of the corresponding first light emitting element is spaced from the first contact electrode, and electrically connected to the first contact electrode via the first conductive pattern.

21. A method of manufacturing a display device, comprising:
forming, on a base layer, a first electrode and a second electrode to be spaced from each other;
supplying light emitting elements onto the base layer, and aligning the light emitting elements between the first electrode and the second electrode; and
electrically connecting first and second ends of the light emitting elements to the first electrode and the second electrode, respectively,
wherein, between a first end of at least one light emitting element and the first electrode, a first conductive pattern electrically connected to the first end and a first contact electrode electrically connected to the first end through the first conductive pattern are formed such that that a corresponding light emitting element emit light,
wherein a second contact electrode electrically connecting the second electrode and the second ends of the light emitting elements is formed, the second contact electrode touching the second ends of the light emitting elements,
wherein the first conductive pattern comprises a low melting conductive material having a melting point lower than those of the first contact electrode and the second contact electrode,
wherein the first contact electrode is spaced from the at least one light emitting element in a first direction that is perpendicular to a thickness direction of the at least one light emitting element with the first conductive pattern located therebetween in the first direction, and wherein light is emitted from the at least one light emitting element in the thickness direction of the at least one light emitting element, and
wherein in case the first conductive pattern is disconnected, the first contact electrode and the corresponding light emitting element are electrically separated from each other and do not emit light.

22. The method according to claim 21, wherein the electrically connecting the first and second ends of the light emitting elements to the first electrode and the second electrode comprises further forming the second contact electrode electrically connected between a second end of the at least one light emitting element and the second electrode.

* * * * *